United States Patent [19]

Aitken et al.

[11] Patent Number: 5,389,793

[45] Date of Patent: * Feb. 14, 1995

[54] APPARATUS AND METHODS FOR ION IMPLANTATION

[75] Inventors: Derek Aitken, Dorking; Frederick J. L. Robinson, Crawley; Michael T. Wauk, II, Haywards Heath, all of England

[73] Assignee: Applied Materials, Inc., Santa Clara, Calif.

[*] Notice: The portion of the term of this patent subsequent to Mar. 25, 2003 has been disclaimed.

[21] Appl. No.: 223,384

[22] Filed: Apr. 5, 1994

Related U.S. Application Data

[63] Continuation of Ser. No. 60,685, May 12, 1993, abandoned, which is a continuation of Ser. No. 698,371, May 9, 1991, which is a continuation of Ser. No. 504,048, Apr. 3, 1990, abandoned, which is a continuation of Ser. No. 383,289, Jul. 18, 1989, abandoned, which is a continuation of Ser. No. 180,727, Apr. 6, 1988, abandoned, which is a continuation of Ser. No. 85,285, Aug. 12, 1987, abandoned, which is a continuation of Ser. No. 844,002, Mar. 25, 1986, abandoned, which is a continuation-in-part of Ser. No. 641,027, Aug. 15, 1984, Pat. No. 4,578,589, which is a continuation-in-part of Ser. No. 523,463, Aug. 15, 1983, abandoned.

[51] Int. Cl.⁶ ............................................. H01J 37/317
[52] U.S. Cl. ............................ 250/492.21; 250/442.11; 250/443.1
[58] Field of Search ................ 250/440.1, 441.1, 442.1, 250/443.1, 398, 400, 491.1, 492.2, 492.21, 492.3; 118/729, 730, 500, 319

[56] References Cited

U.S. PATENT DOCUMENTS

| | | | |
|---|---|---|---|
| 3,778,626 | 12/1973 | Robertson | 250/492.2 |
| 3,993,018 | 11/1976 | Kranik et al. | 118/52 |
| 4,035,655 | 2/1985 | Guernet et al. | 250/492.2 |
| 4,149,084 | 4/1979 | Arndt et al. | 250/492 A |
| 4,155,011 | 12/1977 | Mürk | 250/492.2 |
| 4,234,797 | 11/1980 | Ryding | 250/492.2 |
| 4,282,924 | 8/1981 | Faretra | 165/80 E |

(List continued on next page.)

FOREIGN PATENT DOCUMENTS

| | | | |
|---|---|---|---|
| 001985 | 5/1979 | European Pat. Off. | H01J 37/18 |
| 066175 | 12/1982 | European Pat. Off. | H01J 37/317 |
| 3021221 | 12/1980 | Germany | H01J 37/08 |
| 2053559 | 2/1981 | United Kingdom | H01J 3/04 |

OTHER PUBLICATIONS

Bird et al., PR-200 Ion Implantation System, J. Vac. Sci Tech. 15(3), May/Je 1978, pp. 1080-1085.

(List continued on next page.)

*Primary Examiner*—Jack I. Berman
*Attorney, Agent, or Firm*—Birgit E. Morris

[57] ABSTRACT

A system for implanting ions of a prearranged chemical species into a plurality of semiconductor wafers. A beam analyzing arrangement receives an ion beam and selective separates various ion species in the beam on the basis of mass to produce an analyzed beam exiting the analyzing arrangement. A wafer scanning arrangement scans a plurality of wafers through the accelerated ion beam. The analyzing arrangement has an ion dispersion plane associated therewith and the source arrangement has an associated ion emitting envelope including an area pf substantial extension in a plane parallel to the ion dispersion plane and produces an ion beam characterized by a beam envelope which retains an area of substantial extension in a plane paralled to ion dispersion plane throughout the region between the source and the analyzing arrangement and by ions entering the analyzing arrangement travelling substantially either toward or from a common apparent line object perpendicular to the ion dispersion plane. The wafer scanning arrangement comprises a scan wheel assembly for carrying a plurality of semiconductor wafers and having a central axis, and a drive arrangement for rotating the scan wheel assembly about the central axis to scan the wafers across the beam in one coordinate direction. A scan arrangement produces relative scanning movement between the scan wheel and the ion beam in another coordinate direction.

20 Claims, 26 Drawing Sheets

U.S. PATENT DOCUMENTS

| | | | |
|---|---|---|---|
| 4,383,179 | 5/1983 | Shibata et al. | 250/441.1 |
| 4,453,080 | 6/1984 | Berkowitz | 250/443.1 |
| 4,498,833 | 2/1985 | Hertel | 118/729 |
| 4,578,589 | 3/1986 | Aitken | 250/492.2 |
| 4,580,058 | 4/1986 | Mears et al. | 250/396 R |
| 4,733,091 | 3/1988 | Robinson et al. | 250/492.2 |

OTHER PUBLICATIONS

Hanley, Electromagnetic Scanning Systems, Nuc. Inst. and Meth. 189, (1981), pp. 227–237.

Robinson, Ion Implanters Overcoming Current Barriers, Semiconductor Int., Je 1979, pp. 45–53.

McCallum et al., PR-30 Ion Implantation System, J. Vac. Sci Tech. 15(3) May/Je 1978 pp. 1067–1069.

Aitken, The Design Philosophy for a 200 kV Industrial High Current Ion Implanter, Nuc. Inst. and Meth. 139 (1976) pp. 125–134.

Wittkower et al. Advances in Ion Implantation Production Equipment, Solid State Tech. Dec. 1975, pp. 41–45.

Borggrab, Ion Implantation in Wafer Fabrication, Semiconductor International, Nov. 1981, pp. 39–64.

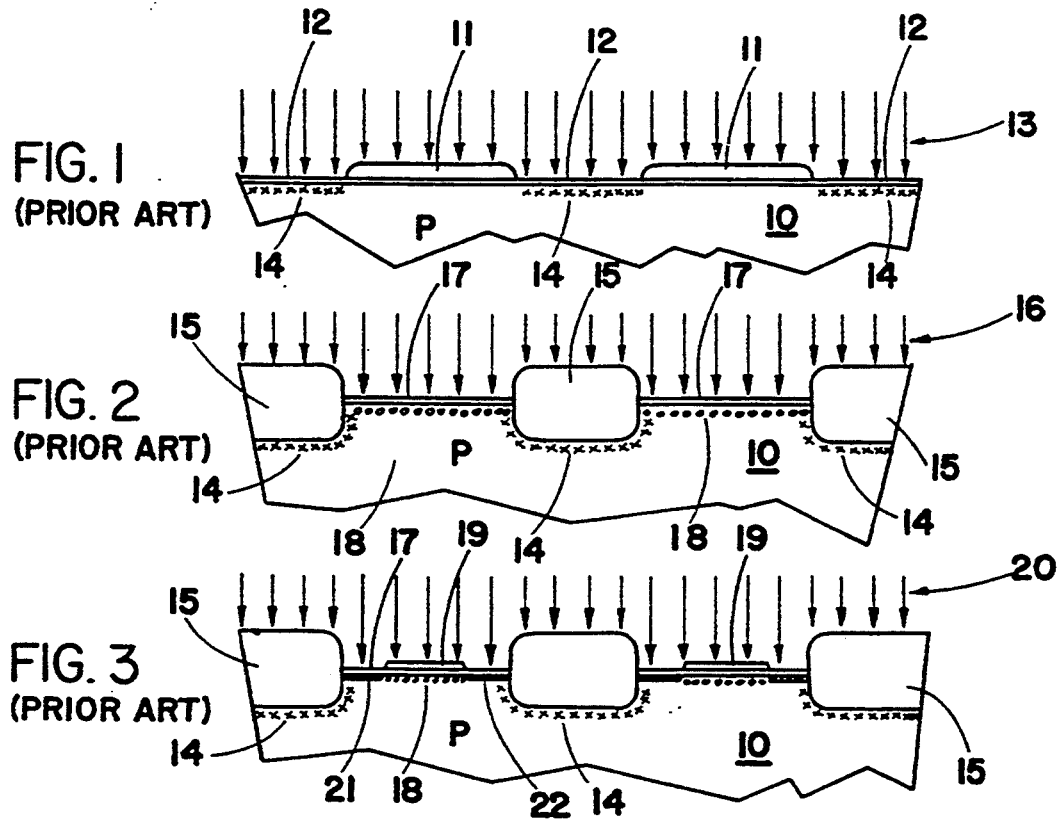
FIG. 1 (PRIOR ART)
FIG. 2 (PRIOR ART)
FIG. 3 (PRIOR ART)
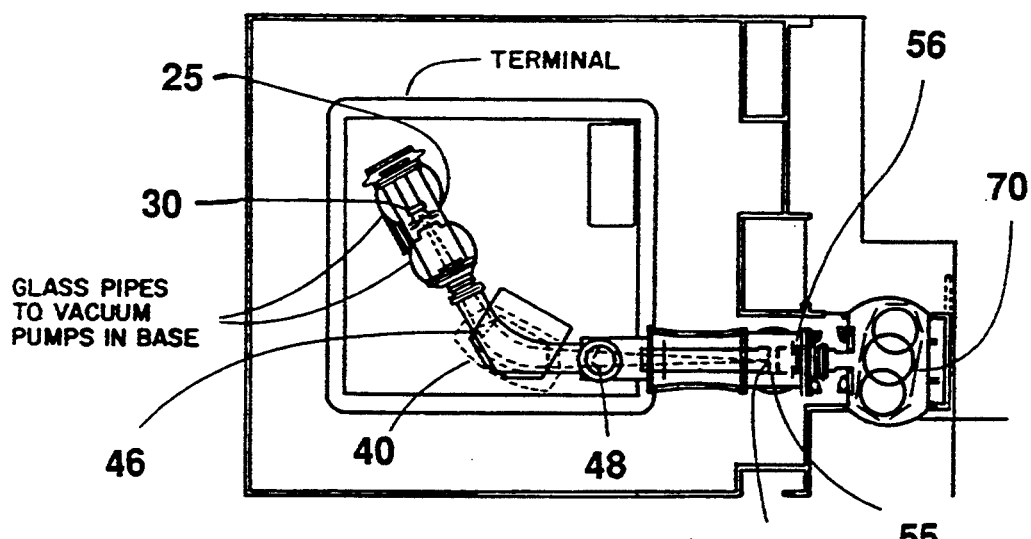
FIG. 4 (PRIOR ART)

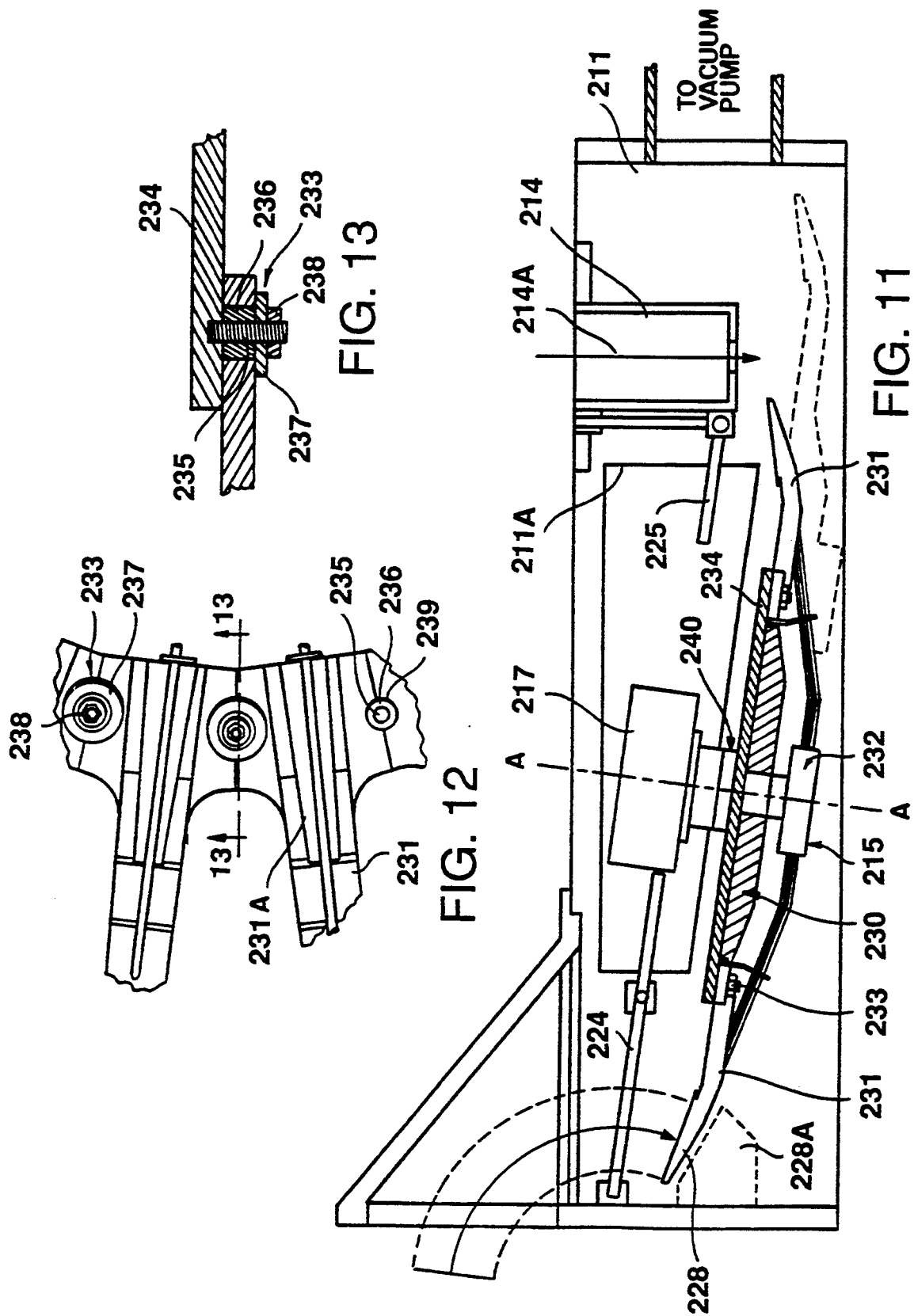

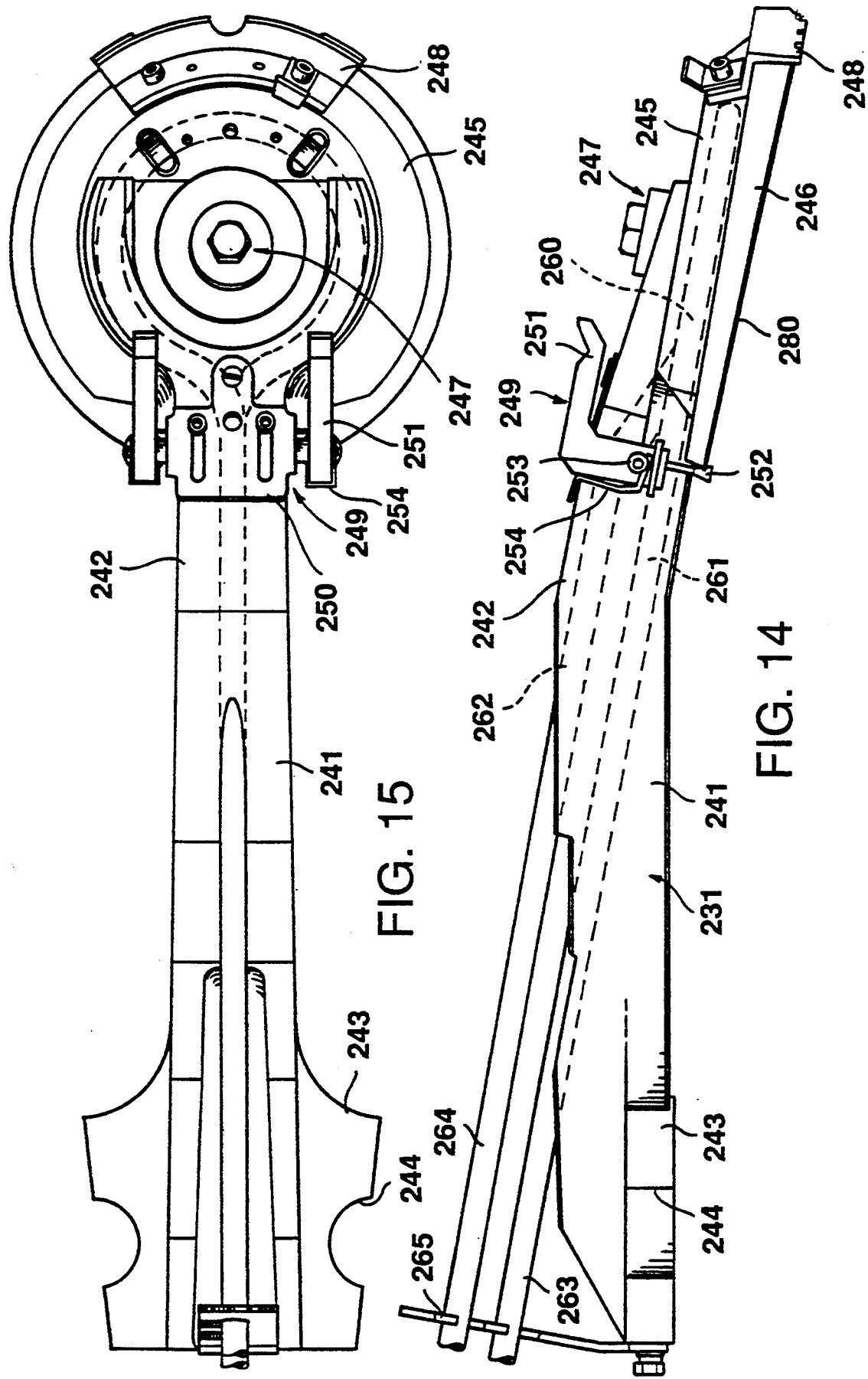

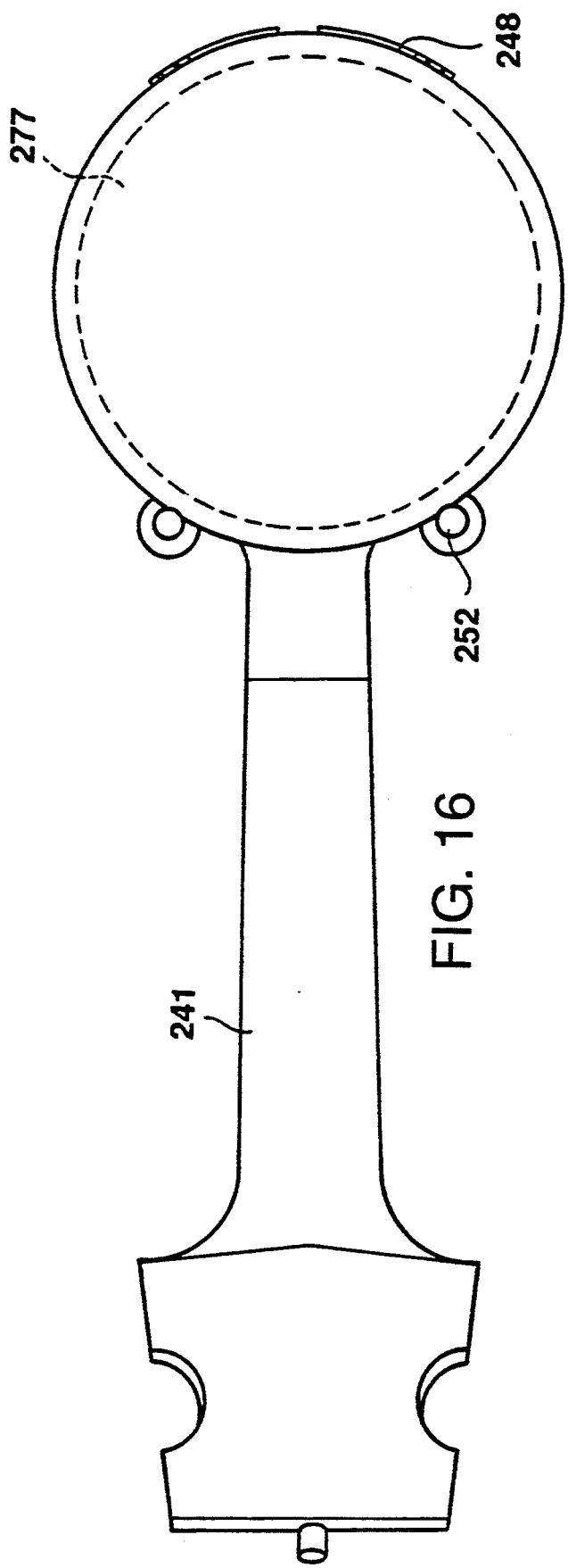
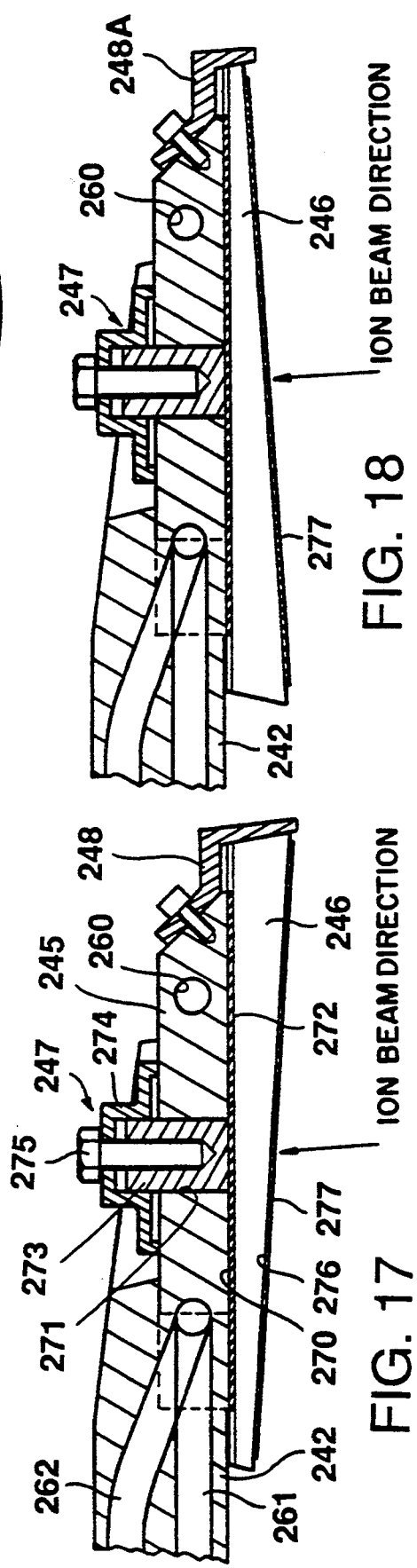
FIG. 16
FIG. 18
FIG. 17

APPARATUS AND METHODS FOR ION IMPLANTATION

This is a continuation of U.S. application Ser. No. 08/060,685, filed May 12, 1993, now abandoned, which is a continuation of U.S. application Ser. No. 07/698,371, filed May 9, 1991, which is a continuation of U.S. application Ser. No. 07/504,048, filed Apr. 3, 1990, now abandoned which is a continuation of U.S. application Ser. No. 07/383,289, filed Jul. 18, 1989, now abandoned which is a continuation of U.S. application Ser. No. 07/180,727, filed Apr. 6, 1988, now abandoned, which is a continuation of U.S. application Ser. No. 07/085,285, filed Aug. 12, 1987, now abandoned which is a continuation of U.S. application Ser. No. 06/844,002, filed Mar. 25, 1986, now abandoned, which is a continuation in part of U.S. application Ser. No. 541,027, filed Aug. 15,1984, now U.S. Pat. No. 4,578,589, issued Mar. 25, 1986, which is a continuation-in-part of U.S. application Ser. No. 523,463, filed Aug. 15, 1983, now abandoned.

FIELD OF THE INVENTION

This invention relates generally to systems and methods for implanting ions of a preselected chemical element into a target element and, more specifically, to systems and methods for implanting conductivity modifying chemical impurities into semiconductor wafers as part of the process for manufacturing semiconductor devices such as large scale integrated circuit chips.

This invention relates specifically to systems and methods for generating a high current ion beam and positioning and scanning a plurality of semiconductor wafers relative to the high current ion beam.

Use of Ion Implantation in Semiconductor Processing

Very great improvements in the scale of integration of semiconductor devices on integrated circuit (IC) chips and the speed of operation of such devices have been achieved over the past several years. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching and improved systems for implanting ions of conductivity modifying impurities into the semiconductor wafer.

Generally, the density of integrated circuits and their speed of operation are dependent largely upon the accuracy and resolution of the lithography and etching apparatus used to form patterns of circuit elements in masking layers on the semiconductor wafer. However, density and speed are also dependent upon tight control of the profile of doped regions in the wafer, i.e., regions to which substantial concentrations of conductivity modifying impurities have been added. Tight control of wafer doping can best be achieved using ion implantation techniques and equipment.

Large scale integration (LSI) and very large scale integration (VLSI) of conductor-insulator-silicon (CIS) devices are improved by making more efficient use of the wafer area, shortening interconnects between devices, producing smaller geometries and reducing noise. All of these improvements are made possible in large part through the use of ion implantation doping methods.

Manufacture of bipolar circuits has also been improved with ion implantation. In this processing technology, improvements have resulted from performing predepositions with ion implantation and simultaneously taking advantage of the low contamination and compatibility with photoresist masking which are characteristics of ion implantation equipment.

It is well-known in the industry that doping small geometric regions of a semiconductor wafer cannot be done adequately with gaseous or spin-on deposition of the dopant material on the surface of the wafer, followed by a high temperature furnace diffusion operation which drives the dopant material into the semiconductor wafer in an isotropic manner, i.e., the dopant molecules travel laterally as well as vertically into the wafer. The kinds of dopant profiles, concentrations and lateral geometries required on an LSIC or VLSIC wafer make ion implantation the doping process of choice. The uniformity of doping achievable only with ion implantation is critical in the fabrication of smaller geometry devices. In addition, doping uniformity across the wafer and repeatability from wafer to wafer, which is achievable with ion implantation, dramatically improves fabrication yields of high density devices.

Example of Use of Ion Implantation

FIGS. 1–3 illustrate the use of a sequence of ion implantation steps in fabricating CIS integrated circuits devices on a semiconductor wafer. FIG. 1 illustrates a first ion implantation step which may be performed on the P-type wafer 10 to produce a light implant in the field regions 7 of the wafer. The field regions 7 are defined at this point as the regions of the wafer which are not covered by the regions of photoresist 11. The regions of photoresist 11 are formed using a standard lithography process in which a thin layer of resist is spun over the entire surface of the wafer and then selectively exposed through a mask pattern or by a directly scanned electron beam. This is followed by a developing step which removes areas of the photoresist which have been exposed to the light or to the electrons. This is known as a positive lithography process using a positive resist material. After the layer of resist has been exposed and developed a thin layer of thermal oxide 12 is typically grown over the exposed surfaces of the semiconductor wafer so that the implant in the field regions 7 will be made through the thin oxide layer.

A light implantation of ions of a P-type material such as boron is performed using an ion implantation apparatus. This field implant is done to provide greater electrical isolation between the active device regions which lie under the regions 11 of photoresist material.

After the implantation step shown in FIG. 1, wafer 10 is typically placed in a furnace and thick field oxide regions 8 are grown in a wet oxidation process. During this oxidation process, the implanted ions 7 are driven into the semiconductor substrate to underlie the field oxide regions 8.

After this step, the masking regions 11 are removed and a thin gate oxide 17 is formed in the active device regions 18. At this point, a second ion implantation step, using an N-type dopant material such as phosphorus, may be performed to tailor the threshold voltage of the silicon gate field effect transistor devices to be formed in the active regions. Accordingly, N-type dopant ions 16 will be implanted through the gate oxide layer 17 in a light implant step to create the implanted region 18.

After this light threshold setting implant has been performed, the silicon gate regions 19 of the field effect transistor devices are formed on the wafer using a lithography and etching step to produce the device topology shown in FIG. 3. Thereafter, a heavy implantation of N-type ions may be performed to simultaneously dope the silicon gate element 19 and the source and drain regions 21 and 22 to complete the basic structure of the silicon gate field effect transistor device.

Many additional fabrication steps are required to complete the integrated circuit, including forming an oxide or nitride insulating layer over the entire wafer, forming contact openings with a lithography and etching process to provide contact openings to the source, drain and silicon gate, followed by forming pathways of conductive materials to provide a conductor network for connecting the various devices on the wafer into an overall integrated circuit.

From the above brief explanation, it should be apparent that there are a number of individual process steps which are performed on a semiconductor wafer to translate the virgin wafer into a completed semiconductor IC device. Each of the individual process steps is a potential yield loss operation in that, if the step is not properly performed, all or a large portion of the IC devices on an individual wafer (or batch of wafers in a batch processing operation) may be defective. In addition, with process steps such as ion implantation, uniformity of dosage of the ion implant across the surface of the wafer importantly determines the yield of good chips on each individual wafer.

Desirable Features of Ion Implantation Apparatus

One of the strong desiderata in the field of manufacturing LSI devices using ion implantation techniques is to improve the wafer throughput capability of the ion 6 implanter without dramatically increasing the cost of performing the implants, especially for the heavy implants which are becoming more popular in the LSI manufacturing processes. The principal parameter which determines wafer throughput in an ion implanter is ion beam current. The present generation of ion implanters involve a number of different systems having widely varying ion beam current generating capacity with a high current machine in today's parlance being considered one which generates about 10 milliamperes (mA) of arsenic ion beam current.

Prior Art Implantation Systems

Current generation high current machines are very large and expensive. For example, a typical 160 kV, 10 mA ion implantation system involves a machine which is eleven feet wide and eighteen feet long. The basic core technology portion of an ion implantation system is the ion beam line itself, a typical example of which is depicted in FIG. 5. The dimensions of the beam line dictate to a large extent the size of the overall ion implantation system.

FIGS. 4 and 5 of the drawings illustrate the major components of a prior art ion implanter and the typical ion optics of all prior art ion implantation systems. FIG. 4 shows a schematic layout of the Series III AIT implanter taken from an article by the present inventor entitled "The Design Philosophy for a 200 kV Industrial High Current Ion Implanter," *Nuclear Instruments and Methods*, Vol. 139, pp. 125-134 (1976). The machine described in this article was modified in certain details before the commercial versions were produced, but the general arrangement of components remained the same. FIG. 5 is a schematic isometric view of the beam line components. The ion beam 31 is extracted from the ion source 30 by an extraction electrode assembly 25. The beam leaving the ion source is a ribbon beam which is rectangular in cross-section, with a typical aspect ratio of 8:1 to 30:1.

The divergent beam from the ion source 30 enters the analyzing magnet, which has a rotatable entrance pole 46. This enables the beam to be focused into the resolving slit 26 without the use of any electrostatic focusing lenses. Immediately after the beam has passed through the flight tube between the poles of the analyzing magnet 40, it comes to the vane unit 48 which controls the beam current reaching the wafer processor system 70. The vane unit is driven by a high speed stepper motor and can change the current by approximately 0.1% per step, the step time being one millisecond. The vane unit together with the analyzing magnet and the ion source are in the accelerator terminal which can float at up to 160 kV to give the post-acceleration of the beam.

The post-acceleration of the ion beam is achieved across a single gap 55. Immediately after the post-acceleration gap 55 is a magnetically suppressed shutter 56 for beam current measurement prior to entry of the beam into the wafer processor system 70.

The vacuum system consists of four stages of differential pumping. The function of the diffusion pumps is primarily to maintain a low air partial pressure in the system when used for semiconductor applications.

Prior Art Ion Beam Optics in General

Referring specifically to FIG. 5, it is seen that the typical beam line in a prior art ion implanter system includes an ion source arrangement 30, an analyzing magnet arrangement 40, a resolving slit arrangement 50, a post-acceleration system 60 and a wafer processing system 70. Ions which are generated in the ion source 30 are extracted by an electrode structure (not shown) to produce a ribbon beam directed toward the pole gap of the analyzing magnet 40. As shown, the ion beam diverges in a plane parallel to the dispersive plane of the analyzing magnet 40, which is the median plane between the upper and lower pole faces 41 and 42, respectively.

In the pole gap between the upper pole 41 and the lower pole 42, the ions in the ion beam 31 are sorted according to their charge-to-mass ratio. As each individual ion enters the pole gap, its line of flight is bent into a path of radius R which is proportional to the square root of the mass of the ion. The extraction system operates to assure that all ions of the same mass have substantially the same velocity when entering the flight tube between the magnet poles so that a consistent dispersion of ions will occur in the analyzing magnet. The analyzing magnet system 40 also reconverges the diverging beam due to the varying radial path lengths of the ions traversing the flight tube.

Ions having the selected charge-to-mass ratio are focused by the analyzing magnet through the aperture 26 in the resolving slit arrangement 50 to enter into the post-acceleration arrangement 60 where they are further accelerated to a preselected energy before striking the wafer 71 which is mounted on a heat sink arrangement 72 in the wafer handling apparatus 70.

Ions of a substantially different charge-to-mass ratio will pass through the accelerating magnet and be focused either to the left or to the right of the resolving slit 26 and thus be selected out of the final ion beam striking the target wafer 71.

Evolving Developments in Prior Art Ion Implanters

In the earliest ion implantation machines, the ion source aperture was typically a small hole approximating a point source. To achieve higher ion beam currents, the size of the circular aperture was increased, but it was soon discovered that there was a limit to the increase in size of a circular aperture which would give an ion beam of acceptable quality. Beam instability due to an unstable plasma meniscus (the meniscus is discussed in detail below), resulted when both vertical and horizontal dimensions of the source aperture were simultaneously increased. However, it was found that, by lengthening the circular hole into a rectangular slit, higher beam currents without beam instability could be obtained. The rectangular slit was oriented perpendicular to the dispersive plane of the magnet, tracking the parallel developments in obtaining higher currents in isotope separators which utilized ion source exit slits with the same orientation to the pole pieces of the analyzing magnet. From the standpoint of ion optics, the elongated slit ion exit aperture may be considered as a continuous series of point sources which would resolve to an elongated rectangular area at the resolving slit 26.

To achieve higher and higher ion beam currents, the length of the ion exit aperture was gradually increased, but retaining the straight vertical orientation thereof as shown in FIG. 5. To accommodate the increased length of the ion exit aperture 32, the pole gap d of the analyzing magnet 40 also had to be increased to accommodate the greater beam thickness. This resulted in dramatic increases in the size, expense and power requirements of the analyzing magnet arrangement. This is illustrated in the schematic view in FIG. 6, looking horizontally at the ion beam optics parallel to the ion dispersion plane. (For convenience of illustration, the ion path has been unfolded to show the source and resolving slit in a common plane. This is a standard way of showing ion beam optics parallel to the ion dispersion plane.) The smaller length source aperture 32' could utilize an analyzing magnet having a pole gap d' substantially smaller than the pole gap d required for the longer ion exit aperture 32.

To reduce the degree of increase in pole gap required to handle an elongated ion exit aperture, some prior art machines were designed with a curved ion exit slit which produced an ion beam converging in a plane perpendicular to the dispersive plane of the magnet.

High power ion beams produce special additional challenges relative to scanning, mounting, orienting and cooling of the wafers during the ion implantation process. Specifically, such high power beams place severe requirements on wafer handling and scanning in full batch ion implantation system, which must meet the following specifications to satisfy advanced requirements of the semiconductor industry:

1) Scanning a full twenty-five unit batch of six inch diameter semiconductor wafers simultaneously; 2) Maintaining uniformity of dose at less than about 0.75% variation across the wafers and from batch to batch; 3) Keeping maximum wafer temperature less than eighty degrees Centigrade to avoid distortion of the photoresist pattern; 4) Avoiding implant angle variation from one edge of the wafer to the other or from center to edge; 5) Avoiding wafer contamination and cross-contamination from other species which produces yield loss; 6) Avoiding mechanical or thermal stress damage to the wafer; 7) Facilitating total automation of wafer loading and unloading operation of the wafer scanning system.

The current state of the art techniques for wafer handling and scanning in ion implantation systems involve limited technological capability. Such systems have difficulty meeting the performance requirements of present day high current ion implantation systems. They are inadequate for meeting the design and performance challenges of next generation ion implantation systems having ion beam power levels of the type produced by the Aitken very high current beam technology.

The prior art contains a wide variety of teachings of systems and methods for scanning wafers through an ion beam and for mounting the wafers on heat sink elements associated with the scanning mechanism.

For high beam currents and high power beams, it is well known that it is essential for the wafers to be scanned mechanically through the beam at relatively high velocity in one direction, i.e. the fast scan direction. For the other direction of scan, it is known both to use a slow mechanical scan of the wafers or to use an electrostatic or electromagnetic scan of the beam itself.

Various systems and methods have been utilized to mount and hold the wafers on the scanning wheel or drum and to provide the necessary cooling of the wafers by effective heat sink mounting with good thermal contact between wafer and heat sink. Most of the prior art systems utilize a clamping arrangement which the wafer against the heat sink by clamping at the edge of the wafer. It has been known to employ centrifugal force to urge the wafer against the heat sink to maintain good thermal contact of the entire wafer surface against the heat sink.

In some systems care has been taken to eliminate bearings and lubricants from the vacuum chamber to avoid wafer contamination, but in the process expensive and complex mechanisms for moving large portions of the system, such as the whole process chamber have been utilized.

Interchangeable wheels and interchangeable heat sink elements have been suggested or used to provide for alteration of the implant angle from an off angle of about seven degrees to a zero degree implant angle. Generally these approaches have involved complex mounting schemes which have made the use of alternative implant angles in a single machine expensive to implement and difficult to use.

None of the systems for wafer mounting, cooling, and scanning which have been taught or suggested in the prior art could succeed in meeting all of the design challenges listed above for high beam energy implanters.

SUMMARY OF THE INVENTION

Objects of the Invention

It is the principal object of this invention to provide improved ion implantation systems and methods.

It is another object of this invention to provide an ion implantation system and method capable of producing higher ion beam currents and having an improved system and method for scanning semiconductor wafers through the high current beam.

Features and Advantages of This Invention

One aspect of this invention features a system for implanting ions of a prearranged chemical species into a plurality of semiconductor wafers. The ions are in the form of an ion beam having a preselected beam current level at least about several milliamperes and in some cases exceeding thirty milliamperes, with beam energies up to at least about 150 KEV.

A source arrangement produces an ion beam, including ions of the preselected chemical species at or above the preselected beam current. A beam analyzing arrangement receives the ion beam and selectively separates various ion species in the beam on the basis of mass to produce an analyzed beam exiting the analyzing arrangement. A beam resolving arrangement is disposed in the path of the analyzed beam for permitting ions of the preselected chemical species to pass therethrough. A beam accelerating arrangement accelerates the ions in the resolved beam in a prearranged direction defining one coordinate axis of a rectangular coordinate system. A wafer scanning arrangement scans a plurality of wafer through the accelerated ion beam.

The analyzing arrangement has an ion dispersion plane associated therewith and the source arrangement has an associated ion emitting envelope including an area of substantial extension in a plane parallel to the ion dispersion plane and produces an ion beam characterized by a beam envelope which retains an area of substantial extension in a plane parallel to the ion dispersion plane throughout the region between the source and the analyzing arrangement and by ions entering the analyzing arrangement travelling substantially either toward or from a common apparent line object perpendicular to the ion dispersion plane.

The wafer scanning arrangement comprises a scan wheel assembly for carrying a plurality of semiconductor wafers and having a central axis, and a drive arrangement for rotating the scan wheel assembly about the central axis to scan the wafers across the beam in one coordinate direction. A scan arrangement produces relative scanning movement between the scan wheel and the ion beam in another coordinate direction.

The scan wheel assembly comprises a central hub, a plurality of separate spoke arms mounted to the hub and extending radially outward therefrom; and a plurality of heat sink elements, each formed on the outer end of one of the spoke arms and including an arrangement for mounting a semiconductor wafer thereon. The spoke arms each have a width substantially less than the maximum width of the heat sink elements. The scan arrangement overscans the heat sink elements in and out of the ion beam so that the ion beam strikes only a portion of the spoke arms in one overscan position and the total heat load produced on the scan wheel assembly by the ion beam is substantially reduced.

This feature of the invention enables the wafer scanning system to handle a full batch of twenty five wafers on the individual heat sink elements and to handle beam power loads of four kilowatts or more. The structure of the scan wheel assembly is such that the ion beam strikes the assembly and wafers mounted thereon only a fraction of the time. This greatly reduces the integrated heat load on the scan wheel assembly and enables a relatively simple but effective cooling water system to provide sufficient wafer cooling to maintain wafer temperature below the damage threshold level.

Preferably, each of the heat sink elements defines a cooling fluid channel extending therethrough. The scan wheel assembly includes piping arrangement coupling cooling fluid to and from each of the cooling fluid channels in the heat sink assemblies to carry heat generated by the ion beam away therefrom. Each of the heat sink inserts comprises a conductive metal body defining a first mounting surface adjacent the heat sink assembly and a second second mounting surface facing the ion beam. A first layer of conductive elastomeric material is mounted to the first mounting surface, and a second layer of conductive elastomeric material is mounted on the second mounting surface to serve as the wafer mounting surface. The heat sink insert provides good thermal conductivity to the cooled heat sink assembly across the entire surface of a wafer mounted thereon.

Another aspect of this invention features the same ion source, beam analyzing arrangement and beam resolving arrangement for generating high current ion beams and a scan wheel assembly and mounting drive arrangement which facilitates using centrifugal force to hold the wafers on the heat sink during scanning without the use of any clamping mechanism when the scan wheel assembly is revolving at high angular velocity. The arrangement provides for such centrifugal force holding even when the implant angle of the beam on the wafer is zero degree.

The drive arrangement used in this aspect of the invention comprises a mounting drive arrangement for mounting the scan wheel assembly with the central axis generally parallel to the direction of the ion beam but canted at a slight angle toward the origin of the ion beam in a plane defined by the central axis and the one coordinate axis and for rotating the scan wheel assembly at high rotational velocity about the central axis to scan the wafers across the beam in one coordinate direction. Each of the heat sink elements defines a mounting surface region and is spaced a prearranged distance from the central axis. Each of the wafer mounting arrangements comprises a heat sink insert mounted to the heat sink element and defining a wafer mounting surface having a diameter at least as large as a prearranged size of semiconductor wafer to be carried thereon and being oriented at a prearranged angle relative to the one coordinate axis such that a line normal to the wafer mounting surface in the plane defined by the central axis and the one coordinate axis is either parallel to the one coordinate axis or is canted at a small angle to the one coordinate axis. In either event the normal line to the wafer intersects the central axis to define a large acute angle. With this orientation between the wafer and the axis of rotation of the scan wheel assembly rotation of the scan wheel assembly at a high rotational velocity produces a substantial component of centrifugal force normal to the wafer mounting surface so that a wafer thereon is held tightly against the mounting surface.

Preferably each of the heat sink elements defines a wafer stop surface adjacent the heat sink insert at the outermost radial point thereon to restrain the wafer on the wafer mounting surface when the scan wheel assembly is in rotation. A wafer clamping arrangement is mounted on the heat sink element for temporarily urging a wafer on the against the wafer stop surface when the scan wheel assembly is not rotating at high rotational velocity. This wafer clamping arrangement preferably includes a pair of clamp fingers mounted to the heat sink element on a side opposite the wafer mounting surface with a spring biasing arrangement urging the clamp fingers against an edge of the wafer and an inertial arrangement opposing the spring biasing when the scan wheel assembly is rotating at high velocity to retract the clamp fingers away from the edge of the wafer. In this manner the wafer is retained on the wafer mounting surface solely by the component of centrifugal force normal to the wafer during the implanting process.

The centrifugal force wafer holding feature of this invention provides the advantage of good thermal heat conduction between wafer and heat sink but without any clamp arrangement surrounding the edge portion of the wafer to be a source of sputtered contamination from the material of the clamp or previously implanted species that have entered the material of clamp. It also eliminates a source of contamination produced by flaking of photoresist where the clamp contacts the edge portion of the wafer surface.

Another aspect of this invention features the same high current source and beam analyzing and resolving arrangements together with a system for scanning semiconductor wafers through the ion beam in a vacuum chamber in which no translational sealing arrangements between air and vacuum are required. An ion beam system generates an ion beam and directs it into the vacuum chamber in a prearranged direction defining one axis of a rectangular coordinate system. A scan wheel assembly carrying a plurality of semiconductor wafers and having a central axis is provided. A mounting drive arrangement mounts the scan wheel assembly in the vacuum chamber with the central axis oriented substantially parallel to the one axis, rotates the scan wheel assembly about the central axis, and translates the scan wheel assembly relative to the ion beam substantially in the direction of a second axis of the coordinate system to produce a two dimensional scan of the semiconductor wafer through the ion beam.

The mounting drive arrangement comprises a scan arm disposed within the chamber and a rotational mounting arrangement for mounting the scan wheel assembly at one end of the scan arm for rotation about the central axis. A first drive arrangement rotates the scan wheel assembly. A second mounting arrangement for mounts the scan arm at the other end thereof for rotation about an axis generally parallel to the one axis defined by the ion beam direction. This second mounting arrangement includes a shaft attached at one end to the scan arm and extending through a wall of the vacuum chamber. A bearing arrangement external to the chamber journals the shaft arrangement for rotation. A second drive arrangement rotates the shaft in the bearing. A vacuum sealing arrangement cooperatively mounted between the vacuum chamber wall and the shaft arrangement provides a rotary vacuum to air shaft sealing arrangement.

The preferred embodiment of this invention utilizes a unique approach to driving the scan arm to simplify the drive and control arrangement to achieve a velocity of slow scan through the ion beam which varies inversely with the active radius of the scan wheel, i.e. the distance from the center of the scan wheel to the center of the ion beam. Basically, this approach takes advantage of a congruent triangle position and drive arrangement which simplifies the drive to a linear drive and simplifies the control of the drive to a linear tracking of distance and control over velocity with a simple circuit arrangement.

The axis of the ion beam I the central axis of the scan wheel assembly A and the axis of the second mounting arrangement B define a triangle having two fixed sides BA and BI and a third side AI which varies in length as the scan arm scans back and forth across the beam. The second drive arrangement drives the scan arm so that the rate of change of the distance AI varies inversely with the magnitude of the distance AI, including a pivot arm mounted at one end to the shaft and a linear drive arrangement mounted for rotation about an axis E and attached to the other end of the pivot arm at a point D so that the linear drive arrangement translates the other end of the pivot arm toward the axis E. The positions of the axis E and the point of attachment D are preselected such that the points B, D, and E define a triangle BDE which is congruent to the triangle BAI. The second drive arrangement further includes a tracking arrangement for signalling the distance DE as the linear drive arrangement moves the pivot arm, and a drive control arrangement for controlling the rate of drive of the linear drive arrangement as a function of the inverse of the signalled distance DE so that the rate of change of the distance DE varies inversely with the magnitude of the distance DE and, because of triangular congruency, the corresponding rate of change of the distance AI varies inversely with the magnitude of the distance AI.

The first drive arrangement can utilize an electric motor housed within the scan arm itself. Alternatively, the electric motor can be mounted outside the vacuum chamber and the rotational drive mechanism can be provided by making the shaft which rotates the scan arm a hollow shaft in which a drive shaft is journaled and rotated by an external motor. This drive shaft in turn drives a belt or chain drive arrangement to transmit power from the lower shaft to a shaft journaled to the scan arm at the upper end to drive the scan wheel assembly.

This arrangement utilizes only rotary vacuum sealing arrangements, preferably of the ferro-fluidic rotating seal type which ensure reliable sealing around a rotating shaft. All lubricated surfaces are outside the vacuum chamber and no expensive and complex sliding seal arrangements are required.

When all of the various features of this invention are combined into a wafer scanning system, all of the desirable specifications for such a system as set forth above can be readily met. The system is capable of handling the beam power produced by the high beam current technology. The scan wheel assembly can be formed with highly modular components for ease of repair and replacement. The scan wheel assembly can readily be interfaced with a wafer loading system which hands off wafers to the individual heat sink inserts and clamp arrangements using a mechanism that withdraws the temporary clamp fingers until the wafer is in contact with the heat sink insert.

Other objects, features and advantages of this invention will be apparent from a consideration of the detailed description of the invention given below in conjunction with accompanying the drawings.

DESCRIPTION OF THE DRAWINGS

FIGS. 1-3 are schematic section views of a portion of a semiconductor wafer illustrating the use of ion implantation in a semiconductor process.

FIG. 4 is a schematic top plan view of a prior art ion implantation system.

FIG. 11 is a partly sectioned top view of a wafer scanning system according to this invention.

FIGS. 12 and 13 are fragmented plan and section views showing mounting arrangements for heat sink assemblies in a wafer scanning system according to this invention.

FIGS. 14-16 are top, back and front view of a heat sink assembly for a scan wheel assembly according to this invention.

FIGS. 17 and 18 are partial section views of heat sink assemblies according to this invention.

DESCRIPTION OF THE PREFERRED EMBODIMENTS

New Ion Optics—Basic Principles

The basic differences between the ion optics of this invention and the prior art are discussed in the parent patent and that discussion is incorporated herein by reference.

General Arrangement of Beam Line Components

Figure 7:
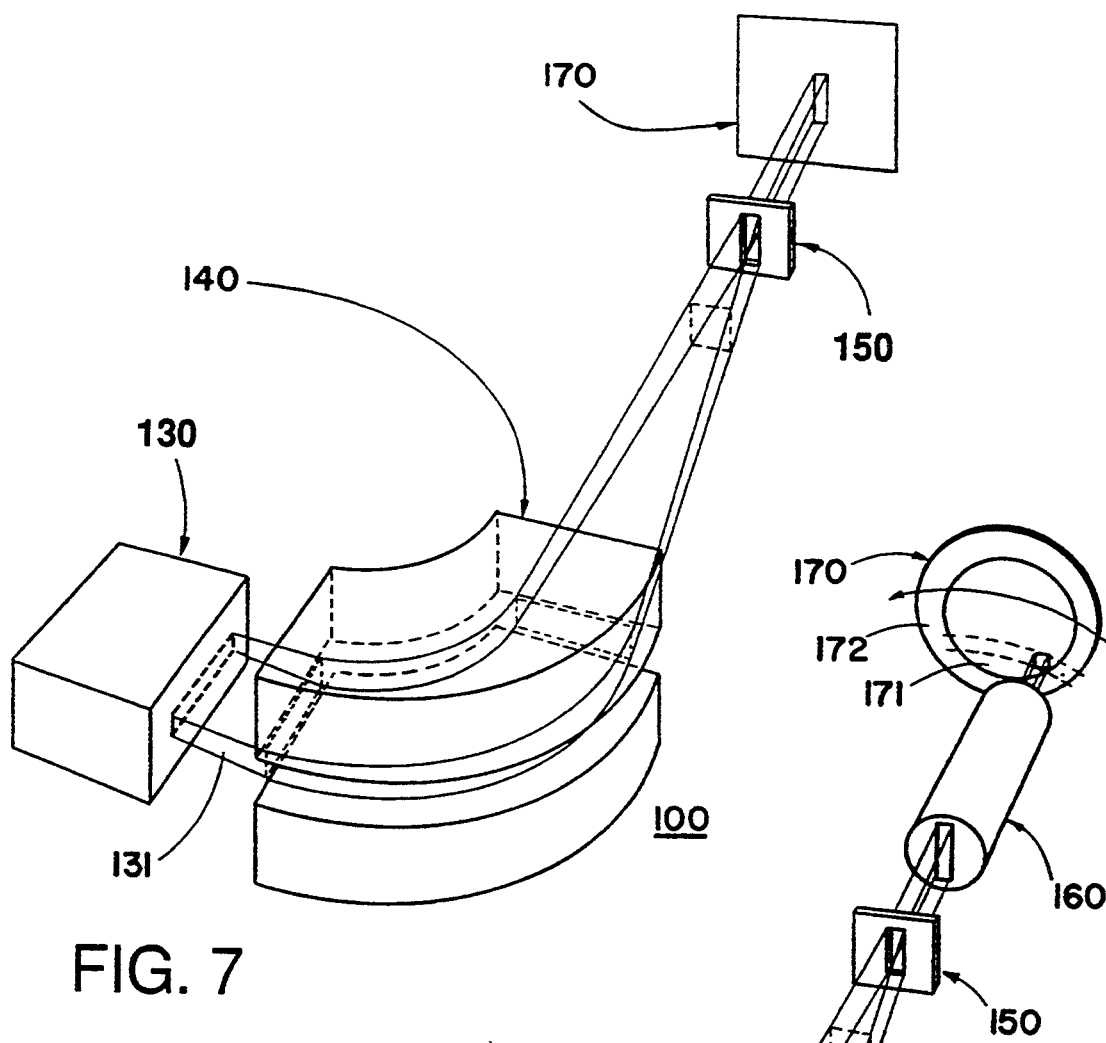
FIG. 7 is a generalized schematic isometric view of the ion beam optics utilized in systems and methods for ion implantation in accordance with this invention.

FIG. 7 illustrates the general arrangement of ion beam line components in accordance with this invention. A source arrangement 130 produces an ion beam 131 which enters the beam analyzing system 45. The source arrangement 130 has an associated ion emitting envelope including an area of substantial extension in a plane parallel to the ion dispersion plane of the beam analyzing system 45. In addition, the source arrangement 130 produces ions entering the analyzing system 45 which are travelling substantially either toward or from a common apparent line object lying in a plane perpendicular to the ion dispersion plane. This ion dispersion plane is the median plane lying between the pole faces of the beam analyzing system 45 in the case of the use of an electromagnet beam analyzing system as schematically illustrated in FIG. 7. Other analyzing systems, such as combined electric and magnetic field systems may be utilized, but at present magnetic field systems are preferred. The ion source may be a Freeman-type plasma source or a multipole plasma source as described in Ehlers et al., "Increasing the Efficiency of a Multicusp Ion Source" Rev Sci Instrum 59(3) Sep. 1982, pp 729–733. Other known ion sources, such as those with solid ion emitting surfaces and field emission sources may be used in some instances, but plasma sources are presently preferred for semiconductor applications.

Figure 8:
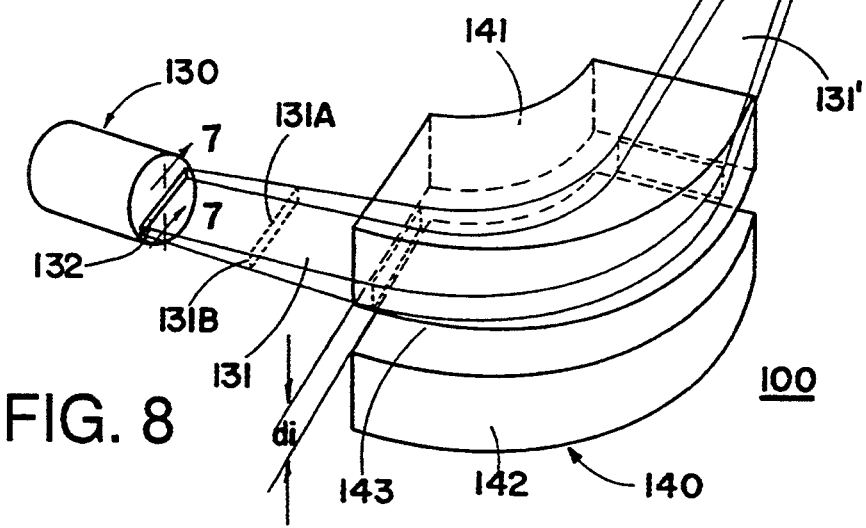
FIG. 8 is a schematic isometric view illustrating generally the ion beam optics of a preferred embodiment of this invention as applied to semiconductor processing.

FIG. 8 illustrates schematically the improved ion beam optics which are at the core of one of the principal features of this invention. The ion implantation system 100 shown in FIG. 8 is utilized for the purpose of implanting ions into a target element such as the semiconductor wafer 171 mounted on a heat sink 172 of a wafer handling apparatus 170. Ion implantation system 100 includes a source arrangement 130 which produces an ion beam 131. A beam analyzing means such as the electromagnet arrangement 45 receives ion beam 131 and separates various ion species in the beam on the basis of mass (i.e. charge-to-mass ratio) to produce an analyzed beam 131' exiting the analyzing arrangement 45.

Figure 5:
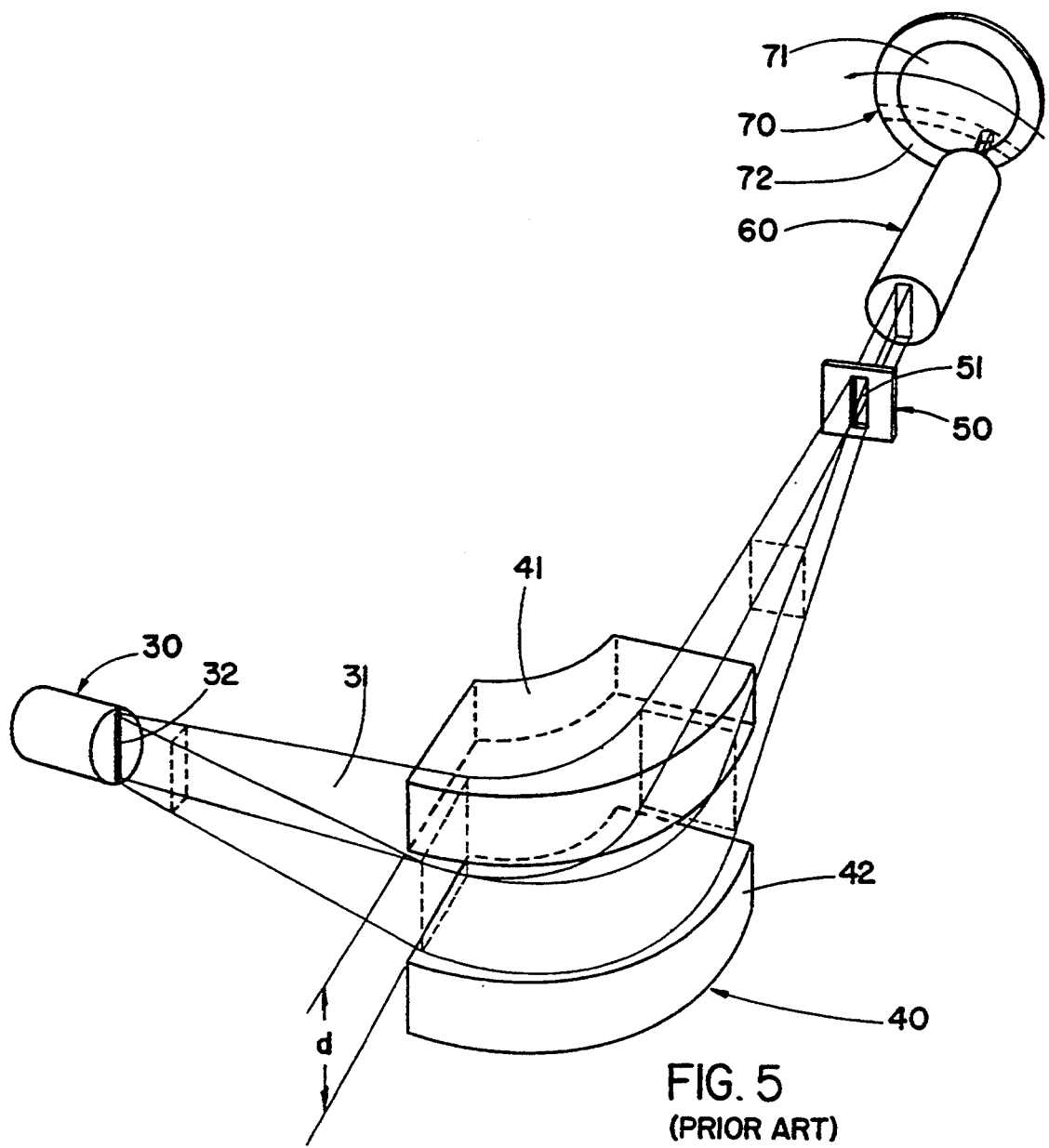
FIG. 5 is a schematic isometric view of ion beam optics used in prior art ion implantation systems.
Figure 6:
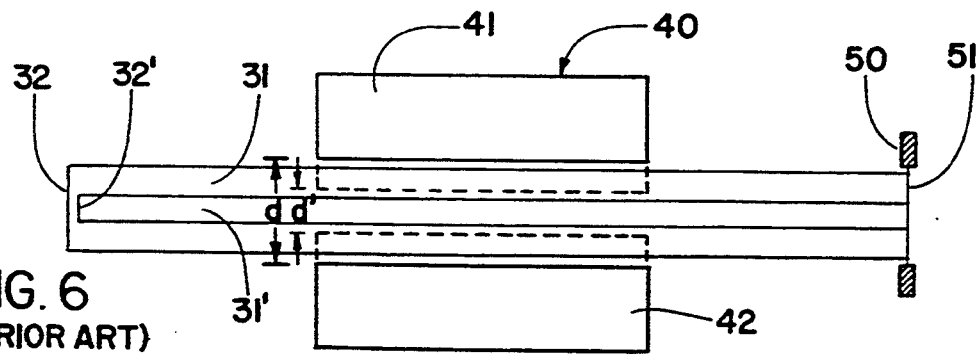
FIG. 6 is a schematic view of ion beam optics which illustrate the ion optics principles utilized in prior art apparatus.

The beam analyzing arrangement 45 has an ion dispersion plane which is the median plane passing through the gap 73 between the pole faces 71 and 72. A beam resolving arrangement 80 is disposed in the path of the analyzed beam 131' to permit only a preselected ion species to pass to the target element 171. Contrasted to the orientation of the source arrangement 30 in the prior art ion optics geometry of FIG. 5, the source arrangement in the embodiment of this invention shown in FIG. 8 is oriented relative to the analyzing arrangement 45 such that the longer side 131A of the ion beam cross-section is generally parallel to the ion dispersion plane of the beam analyzing arrangement 45. In the embodiment shown in FIG. 8 the source arrangement 130 includes a source means which has an ion exit aperture 132. In addition to the ion exit aperture 132 various electrode structures (not shown here but described below) would be utilized as part of the source arrangement.

As can be seen in FIG. 8, the ion beam 131 diverges as it travels from the ion source slit 132 toward the gap 73 of the analyzing magnet arrangement 45. As will later be discussed in some detail, because of various optional magnetic focusing arrangements, convergent focusing will be provided to preclude ions in the beam striking the ion flight tube which is positioned between upper and lower magnet poles.

The novel orientation of the longer dimension of the rectangular ion beam 131 parallel to the ion dispersion plane of the analyzing arrangement 45 and closer spacing of the source and magnet, enables a narrow pole gap $d_i$ to be utilized.

FIG. 8 illustrates the basic ion beam optics of this invention when a straight source slit 132 is utilized. In this case the ion beam 131 exiting from the source slit 132 travels straight into the analyzing magnet arrangement 45. FIGS. 17 and 18 illustrate that an ion exit slit which has a curvature, permits a substantial increase in beam current without requiring a corresponding increase in the width of the pole pieces of the analyzing magnet arrangement 45. The converging beam also decreases the convergence angle of the beam travelling through the resolving slit. The ion beams exiting from a curved source slit 132' converge to an apparent line object in a plane perpendicular to the ion dispersion plane.

The Wafer Processor Components

Figure 9:
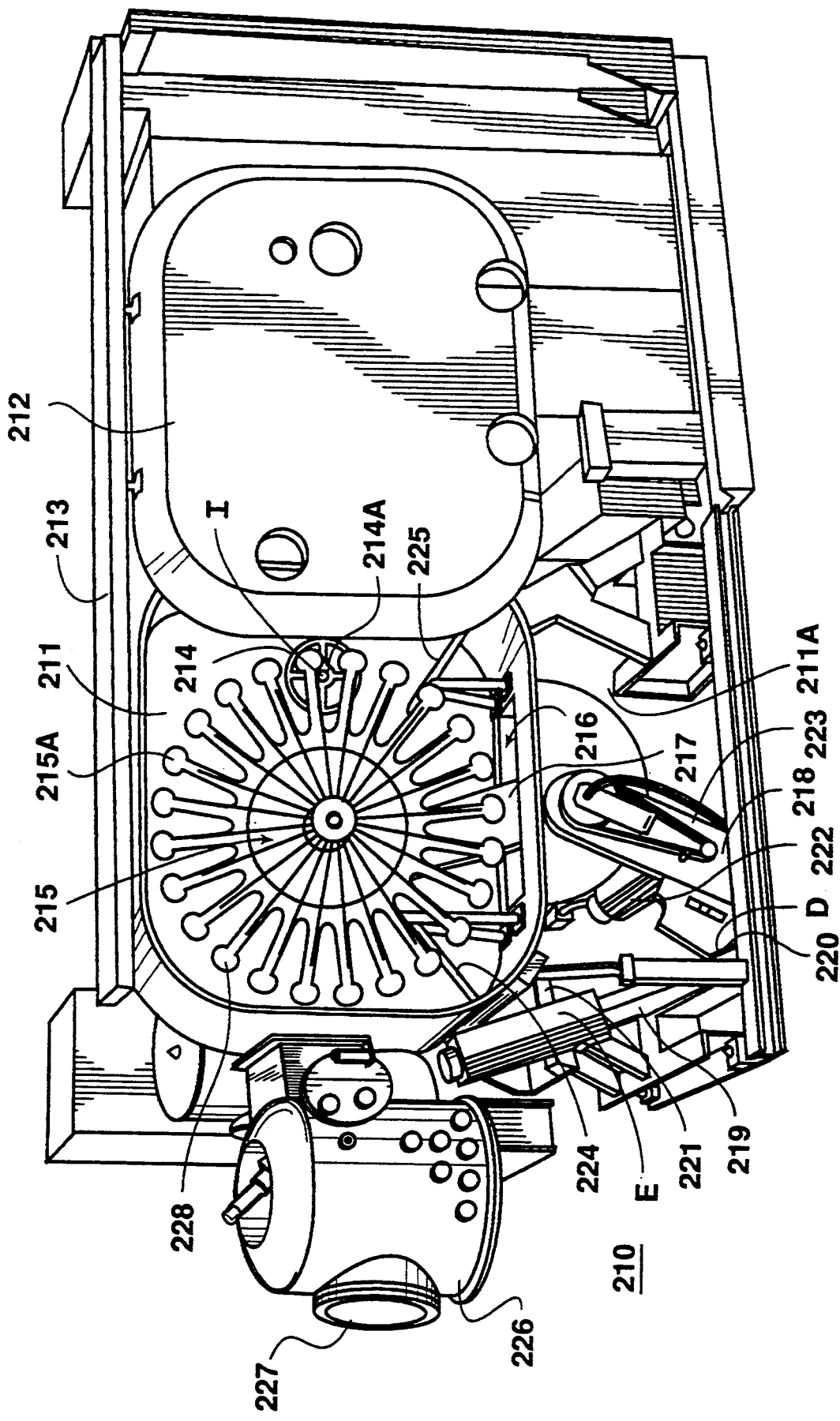
FIG. 9 is a perspective view of an ion implantation system incorporating a wafer scanning system according to this invention.

FIG. 9 depicts an ion implantation system 210 which includes a wafer process chamber 211 having a sliding front door 212 carried on an overhead track 213 and having sealed view ports therein. When slid into position over the chamber 211, the door 212 completes a vacuum chamber. Appropriate vacuum seals and gripping arrangements (not shown) hold the door 212 tightly against the side walls of the process chamber. Vacuum pumping apparatus (not shown) communicates with the interior of vacuum chamber 211 to pump down the chamber and provide the evacuated atmosphere required for effective ion implantation. An ion beam generating and analyzing system communicates an ion beam to the vacuum chamber through a post-acceleration system 214 which extends through the back of the vacuum chamber 211. The ion beam generating and analyzing system is preferably the one shown in the above referenced Aitken application.

A scan wheel assembly 215 is mounted within the vacuum chamber 211. The scan wheel assembly 215 includes twenty-five wafer mounting paddles 215A arranged in a circular array around a central hub. The details of the scan wheel assembly will be described below. Scan wheel assembly 215 is mounted for high velocity rotation about its central axis and for rotational precession about an axis at the bottom of the scan arm assembly 217 which extends into a well 211A at the bottom of the vacuum chamber.

A mounting and drive arrangement 216 mounts the scan wheel assembly 215 in the vacuum chamber 211 and includes the various mounting arrangements and drive arrangements for accomplishing the dual rotational and precessional scan of the scan wheel assembly. The main elements of the mounting and drive arrangement 216 are scan arm 217 which is directly coupled to drive arm 218, which is driven by a motor and lead screw drive arrangement 219. A ball type coupling 220 couples the drive arm 218 to the translating carriage (not shown) of lead screw drive arrangement 219. Drive arrangement 219 is mounted for rotation to a bracket 221. A motor 222 mounted to the drive arm 218 drives a belt drive transmission arrangement 223 which includes a belt drive arrangement (not shown) mounted within hollow scan arm housing 217 to provide the drive for rapid rotation of the scan wheel assembly 215.

Stop brace assemblies 224 and 225 mounted within the vacuum chamber 211 limit the precessional scan position of the scan wheel assembly 215 when the drive arm arrangement 218 is decoupled from the lead screw drive arrangement 219.

A wafer handling and loading arrangement is provided within a separate chamber 226 which includes a load lock door 227 for convenient interfacing to a wall of a semiconductor process clean room. The wafer loading system includes an arrangement for transferring wafers to and from a heat sink paddle located at the position designated 228 to a standard wafer cassette. A preferred form of wafer handling and loading arrangement is disclosed in copending and commonly assigned Stonestreet et al. U.S. patent spplication Ser. No. 774,209 filed Aug. 9, 1985 and entitled Systems and Methods for Wafer Handling in Semiconductor Process equipment.

FIGS. 10–13 show certain structural details of the scan wheel assembly 215 and other details will be shown and discussed in connection with other drawing figures. Scan wheel assembly 215 comprises a central hub assembly 230 which carries thereon a plurality of separate heat sink assemblies 231 and a cooling fluid supply arrangement 232. Mounting arrangements 233 mount the individual heat sink assemblies 231 to the back plate 234 of the hub assembly 230. Hub assembly 230 is mounted for rotation about its central axis A by a combined shaft, bearing and rotary vacuum seal arrangement 240 which provides for rotation of the scan wheel assembly relative to the scan arm assembly 217. The details of this arrangement are shown in other drawing figures and discussed below.

FIGS. 12 and 13 illustrate a preferred arrangement for mounting the individual heat sink assemblies 231 to the back plate 234 of the hub assembly 230. Each of the individual sink assemblies 231 includes a mounting flange 231A which has on each side a semicircular cutout 239 serving as a fixturing element relative to mounting collars 236 which are mounted on the back plate 234. In this manner, each of the individual heat sink assemblies 231 is precisely located on the back plate 234 and held in position for fastening. Threaded studs 235 extend through locating collars 236. A flat washer 237 is mounted over the threaded stud 235 and a nut 238 is threaded over the stud 235 and tightened down onto the washer 237. It will be appreciated that this mounting arrangement provides for very accurate fixturing of the individual heat sink assemblies 231 on the back plate 234 and secure mounting thereof in an easily removable and replaceable fashion for maintenance and service.

Referring now to FIGS. 14–18, the detailed construction and arrangement of the individual heat sink assemblies 231 will be described. Each of the heat sink assemblies 231 includes a first spoke arm section 241 and a second spoke arm section 242 extending at a slight angle to the spoke arm 241. At the back end of the spoke arm arrangement is a mounting flange 243 having semicircular mounting apertures 244 which mount to the scan wheel back plate as described above. At the outer end of the spoke arm assembly is a heat sink paddle 245 which is generally circular and carries thereon a heat sink insert 246 fastened thereto with a fastening arrangement 247, the details of which are shown in FIG. 17 and described below. A wafer edge restraint 248 is mounted to the heat sink paddle 245 at the outer end and cooperates with the heat sink insert 246 and a wafer clamp arrangement 249 to hold a semiconductor wafer 280 on the front surface of the heat sink insert 246 when the scan wheel assembly is at rest or accelerating to high rotational motion.

Wafer clamp assembly 249 comprises an adjustable bracket 250 which mounts to the spoke arm section 242 and carries a pair of inertial actuator arms 251 and a wafer clamp element 252 mounted for rotation about axles 253. A spring element 254 on axle 253 urges the clamp element 252 against the edge of the wafer 280. Under high centrifugal force, produced during fast rotational scan, the inertial actuator element 251 will rotate outward and move the clamp element 252 away from the edge of the wafer 280. Because the centrifugal force on the actuator element 251 is substantially greater than the centrifugal force on the clamp element 252, the inertial actuator 251 will rotate about the axle 253 and carry the clamp element 252 away from the edge of the wafer. In this manner the clamp element 252 will not interfere with ion implantation of the wafer. The wafer will be held on the heat sink insert 246 by centrifugal force as will be described below. The clamp element 252 will be located, during actual ion implantation, in a position such that it is unlikely that any sputtered contaminants or cross-contaminants emitted therefrom would have a line of sight to the front surface of the wafer 280.

Figure 19:
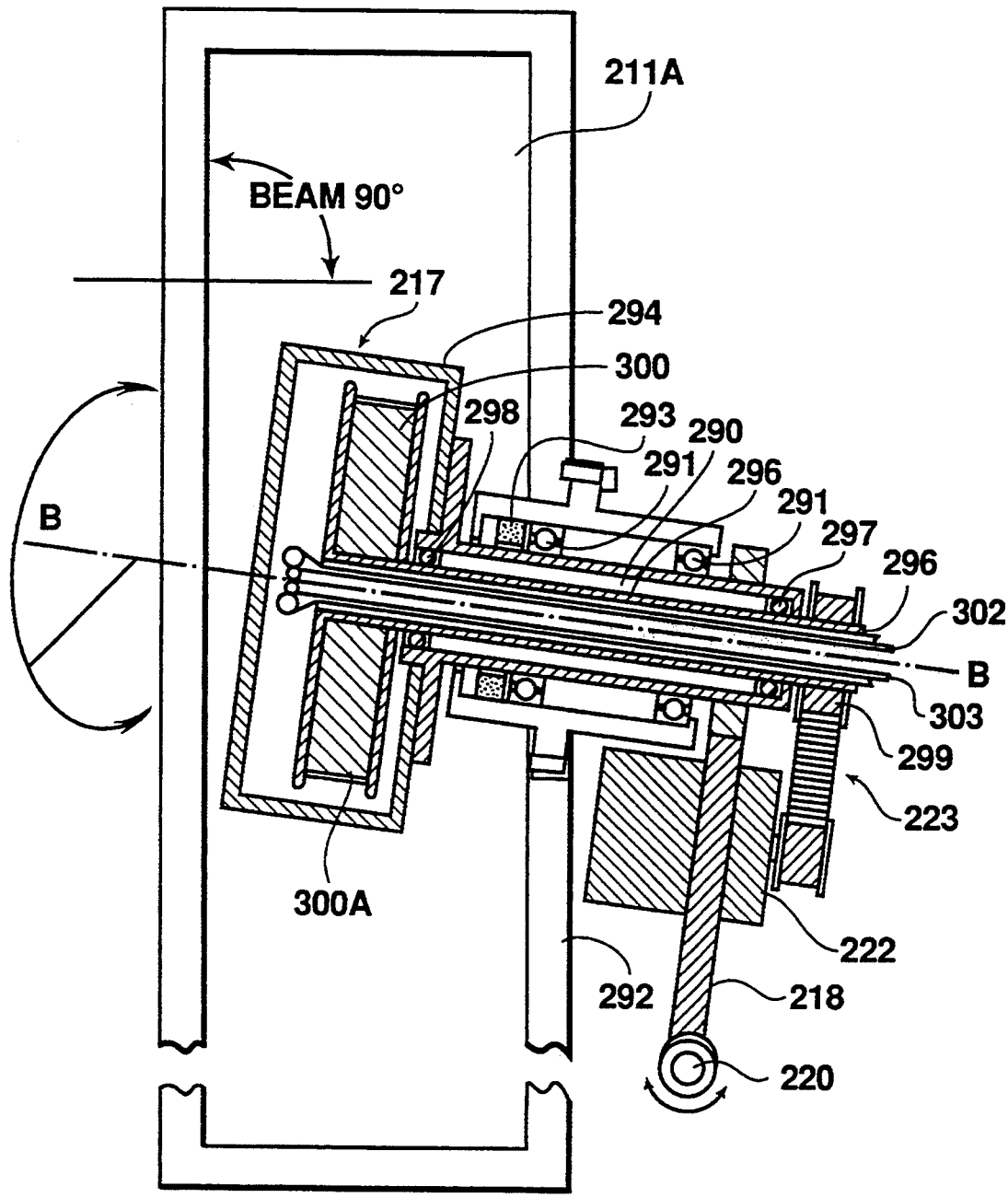
FIGS. 19 and 20 are section views illustrating mounting and drive arrangements for a scan wheel assembly according to this invention.

Wafer edge clamp assembly 249 cooperates with a mechanical actuator arrangement 228A shown in FIG. 19 mounted at the wafer transfer position 228 to retract and release the wafer clamp arrangement during wafer loading and unloading. The mechanical actuator arrangement can be of any suitable design which includes means for pushing on and releasing the inertial actuator arms 251 to retract and then release the clamp elements 252 from the edge of the wafer 280.

A heat sink cooling channel 260 is formed within the heat sink paddle 245 and communicates with an inlet channel 261 and an outlet channel 262 in the spoke arm sections 241 and 242. Inlet tube 263 communicates cooling fluid to the inlet channel 261 and outlet tube 264 couples the return fluid out of outlet channel 262. Inlet tube 263 and outlet tube 264 communicate fluid to and from a cooling fluid header assembly located at the hub of the scan wheel assembly, as will be described below. A bracket assembly 265 supports the inlet and outlet tubes 263 and 264 at the back end of the heat sink assembly 231. The bracket 265 counteracts any centrifugal force on the inlet and outlet tubes to preclude any substantial stress thereof at points where they are joined and sealed into the spoke arm 241 during high rotational velocity of the scan wheel assembly.

FIG. 17 illustrates the structure and arrangement of the heat sink insert 246 and, in particular, the details of the mounting arrangement 247. Heat sink insert 246 comprises a cylindrical disk-shaped element formed from a conductive metal. A mounting surface 270 on the heat sink paddle 245 has a generally circular sheet of thermally conductive elastomer material 272 mounted thereto to provide good thermal conduction between the heat sink insert 246 and the heat sink paddle 245. A stud 273 is mounted on the back of the heat sink insert 246 and is received in an aperture 271 in the heat sink paddle 245. A standoff washer 274 and threaded bolt 275 cooperate with an internally threaded hole in the stud 273 to mount heat sink insert 246 to the front face 270 of the heat sink paddle 245. Tightening the stud 275 pulls the back face of the heat sink insert 246 into compression contact with the conductive elastomer 272 to insure that good heat transfer is achieved across those surfaces. A conductive elastomer sheet 277 is mounted to the front surface 276 of the heat sink insert 246. This thin sheet of conductive elastomer provides good thermal coupling between the heat sink insert 246 and a semiconductor wafer carried on the mounting surface defined by the front surface of the elastomer sheet 277.

The combination of a substantial flow of cooling fluid, which can for this purpose be cooled water, through the cooling channel 260 in the heat sink paddle 245 and good thermal coupling between the heat sink insert 246 and the heat sink paddle 245 provides highly effective cooling of a semiconductor wafer mounted on the surface of the elastomer pad 277. As will be described in more detail below, the wafer mounting surface of the heat sink insert 246 is preferably inclined at a $3\frac{1}{2}$ degree angle to the mounting surface 270 of the heat sink paddle 245. The combination of this angle and the angle of the heat sink paddle 245 to the spoke arm 241, together with the canting of the axis A—A of the scan wheel assembly 215, provides a substantial component of centrifugal force which presses a wafer on the elastomer mounting surface 277 during high rotational velocity of the scan arm assembly. This assures that, across the whole back surface of the wafer, good thermal contact is provided between the wafer and elastomer surface so that heat generated in the wafer by the ion beam will be effectively and efficiently conducted away in series through the heat sink insert 246, the elastomer layer 272, and the heat sink paddle 245 into the cooling fluid flowing through cooling channel 260. Preferably, the flow of cooling fluid is turbulent for high transfer efficiency.

The efficiency of cooling of wafers mounted on the conductive elastomer 277 during implantation and other features of this invention permit the system of this invention to effectively maintain wafers at a temperature below 80 degrees Centigrade under conditions when the ion beam power striking the wafer is eight kW. This cooling efficiency precludes any thermal damage to the semiconductor wafer or any thermal distortion of photoresist pattern formed on the surface of the semiconductor wafer to define the regions of the wafer surface which are implanted with the chemical species of the ion beam.

Effective cooling of the semiconductor wafer under eight kW beam power is only achievable because of the design of the heat sink assembly 271 with spoke arm sections 241 and 242 which are substantially more narrow than the diameter of the heat sink paddle and insert. As shown in FIG. 19 the individual heat sink assemblies 231 are scanned in the slow scan direction through the ion beam 214A with overscan on both ends of the scanning cycle. When the scan arm assembly 215 is fully scanned to the right, the wafers mounted on the heat sink inserts are completely out of the influence of the ion beam. Similarly, when the scan wheel assembly 215 is in its left-most position, the wafer is entirely out of the ion beam on the other side. In the righthand overscan position shown in FIG. 19, the ion beam is, of course, striking the heat sink assemblies 231 on the spoke arm regions adjacent the wafers. However, as is apparent from FIGS. 9 and 10, the total surface area of the scan wheel assembly presented to the ion beam in this overscan position is only a small fraction of the total circular area of the scan wheel assembly. Most of the time the ion beam is simply passing between the individual spoke arms of the heat sink assemblies. During the time that the beam is simply passing through this open region, it is not heating the scan wheel assembly.

Accordingly, the spoke arm and heat sink paddle arrangement of this invention substantially reduces the overall heat load on the scan wheel assembly during the dual scan ion implantation process. It will further be appreciated that as the individual heat sink paddles and heat sink inserts thereon carry wafers through the ion beam, there are open regions between the individual heat sink paddles where wafer surface is not presented to the ion beam. This further reduces the overall heat load on the scan wheel assembly during the ion implantation process. This reduction in overall heat load enables substantially higher ion beam powers to be used with the scan wheel assembly of this invention than could possibly be achieved in prior art scan wheel designs in which the ion beam impinges on solid portions of the scan wheel throughout most of the scanning movement.

Comparing FIG. 18 to FIG. 17, it will be seen that the heat sink insert 246 is designed so that it can be positioned either with the angled wafer mounting surface 277 canted toward the spoke arm section 242 as shown in FIG. 17 or canted away from the spoke arm section 242 as shown in FIG. 18. In the FIG. 18 mounting arrangement of the insert 246, a slightly modified wafer edge restraint 248A is provided to accommodate the different position of the outside edge of the wafer. The altered position of the heat sink insert 246 in FIG. 18 provides for a change in the implant angle of the ion beam relative to a wafer mounted on the surface of the elastomer layer 277. As will be discussed below, the orientation of the heat sink insert 246 in FIG. 17 provides for a 7-degree implant angle and the orientation of the heat sink insert in FIG. 18 provides for a 0-degree implant angle. By comparing FIG. 18 to FIG. 17 it will be seen that the ion beam direction relative to the mounting surface 270 of the heat sink paddle 245 remains unchanged. However, the reorientation of the heat sink element 246 having its mounting surface canted at 3½ degrees changes the implant angle by a total of 7 degrees between FIG. 17 and FIG. 18.

It should also be apparent from the structure of the heat sink insert 246 shown in FIG. 17 and the structure of the wafer edge clamp arrangement 249 shown in FIGS. 14 and 15, that the heat sink assemblies 231 of this invention can readily accommodate wafers of different diameter. As shown particularly in FIG. 15, the bracket 250 of the clamp arrangement 249 can be adjusted in position to accommodate different diameters of heat sink inserts 246. Different diameters of heat sink insert 246 can be accommodated on the heat sink paddle 245 with a simple change of the configuration of the edge restraint 248. It should also be apparent that the heat sink assembly 231 can be itself modified to accommodate different wafer sizes by altering the overall diameter of the heat sink paddle 245. The system of this invention can thus readily accommodate wafer diameters between three and eight inches. It may, however, not be possible to accommodate twenty-five eight-inch wafers without going to a larger process chamber. Referring now to FIGS. 11 and 12, the details of the respective mounting and drive arrangements of the scan arm 217 and scan wheel assembly 215 will be described. The scan drive arm 218 is carried on a hollow shaft 290 which is journaled in a load carrying bearing and rotary vacuum seal arrangement mounted to the front wall 292 of the vacuum chamber well 211A. Bearings 291 provide free shaft rotation, and rotating ferro-fluidic seal 293 surrounds the shaft 290 and provides an air-to-vacuum seal around the shaft to isolate the vacuum chamber well 211A from the ambient atmosphere outside the well. A hollow scan arm housing 294 is carried on the shaft 290 so as to rotate with the shaft. Accordingly, the screw drive arrangement 219 shown in FIG. 9 drives the drive arm 218 in rotation. The scan arm housing 294 of the scan arm assembly 217 rotates about the axis B, causing the upper end of the scan assembly carrying the scan wheel assembly 215 to move in a circular arc about the axis.

Figure 10:
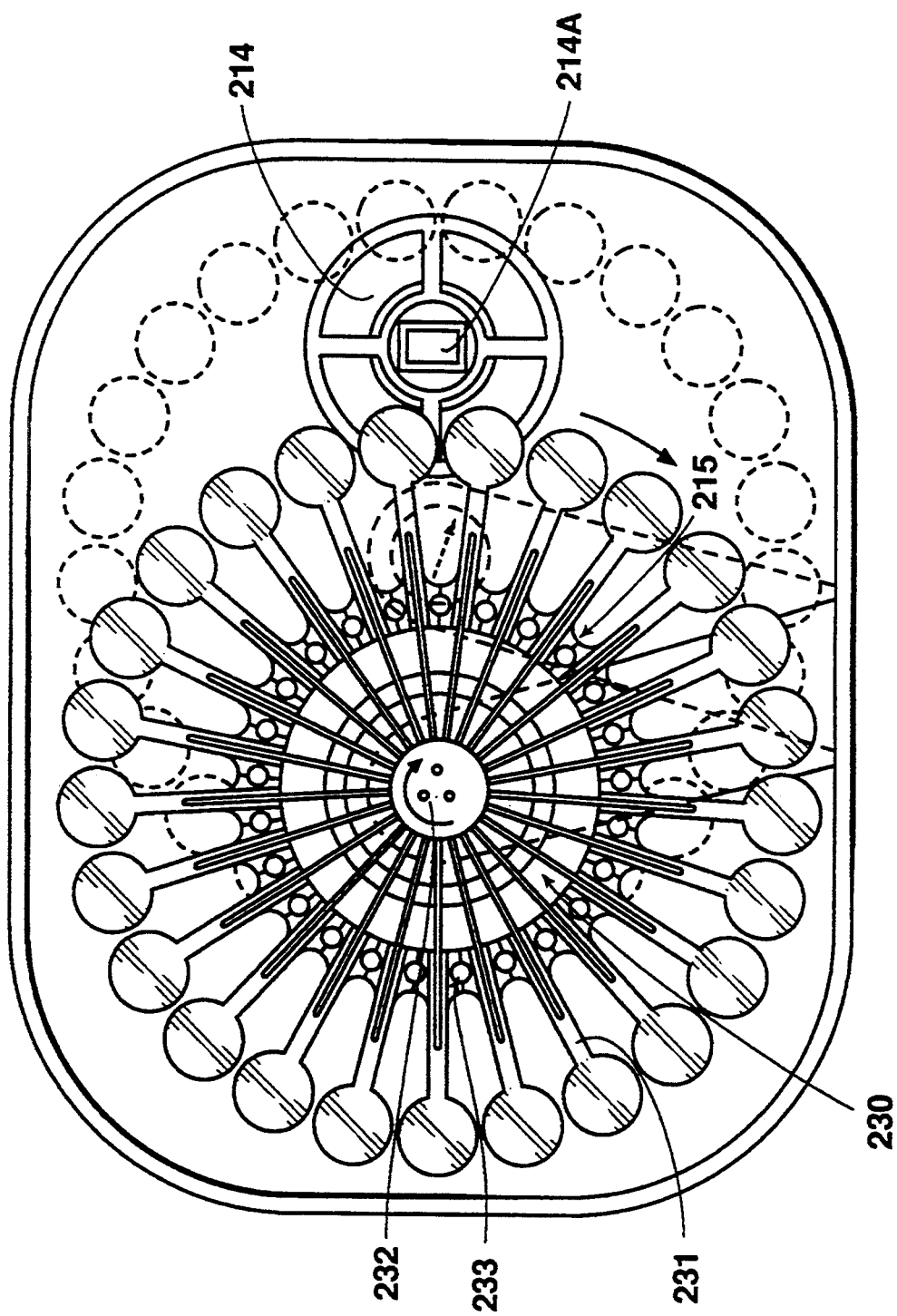
FIG. 10 is a front elevational view of a scan wheel assembly according to this invention.
Figure 20:
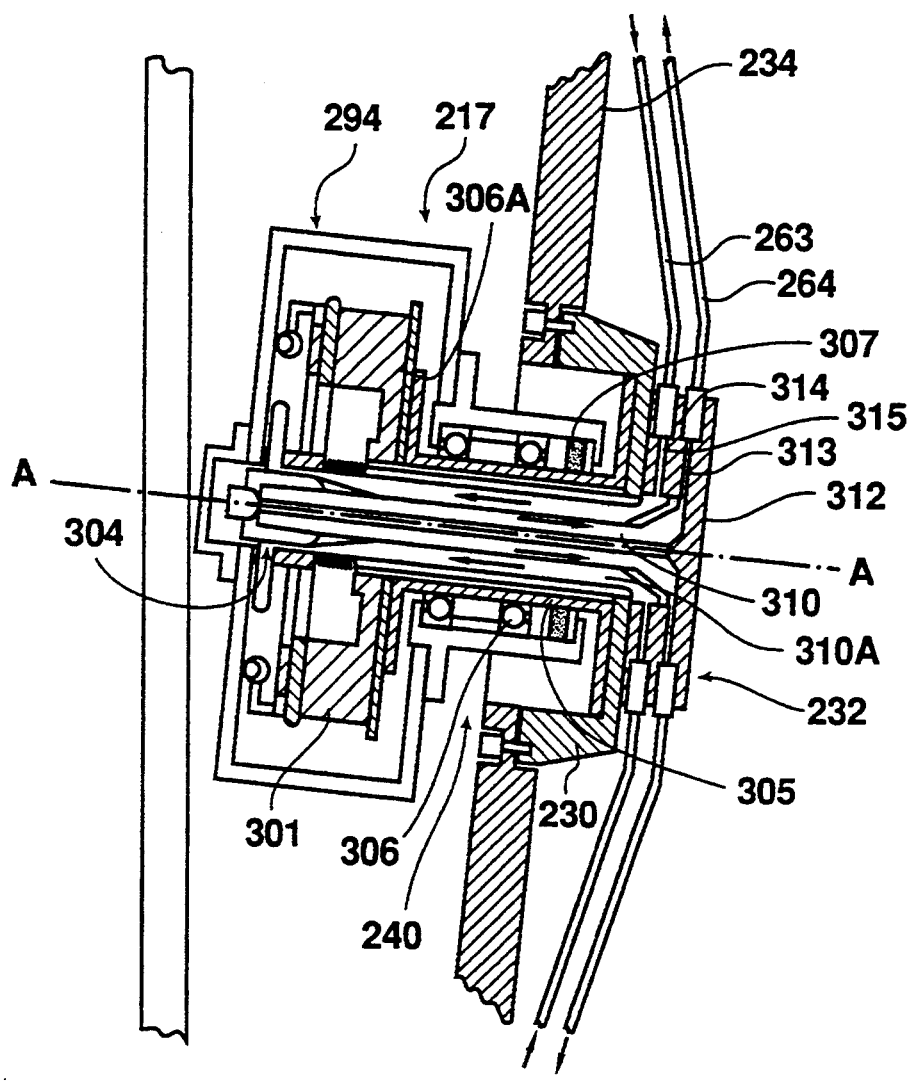

FIG. 19 also shows a portion of the preferred drive arrangement for the rotation of the scan wheel assembly 215 depicted in FIG. 20 and also depicted in FIGS. 9–11. A hollow drive shaft 296 is journaled in a bearing assembly 297 mounted within over end the hollow shaft 290 and a second bearing assembly 298 mounted within the other end of hollow shaft 290. This permits the hollow shaft 296 to rotate within and concentric to the hollow shaft 290. A belt drive wheel 299 is mounted to the hollow shaft 96 at one end adjacent the scan drive arm 218. A second belt drive wheel 300 is mounted on the other end of hollow shaft 296 within the scan arm housing 294. The belt drive wheel 299 forms one part of the overall scan wheel drive arrangement designated 223 in FIG. 9 and is driven as shown by a belt coupled to a drive wheel driven by the motor 222.

The arrangement of belt drive wheel 299, shaft 296, and belt drive wheel 300 transmits power for rotation of the scan wheel assembly 215 shown in FIG. 20 into the interior of the hollow scan arm housing 294. A drive belt 300A transmits the power from belt drive wheel 300 at the lower end of the scan arm assembly 217 to a belt drive wheel 301 at the upper end of the scan arm assembly 217 as depicted in FIG. 20. A pair of cooling fluid hoses 302 and 303 are fed through the hollow shaft 296 into the interior of the hollow drive arm housing 294 and couple inlet and return cooling fluid to a rotating header arrangement 304 mounted at the top of the drive arm assembly 217 shown in FIG. 20.

Referring now to FIG. 20, the remainder of the scan drive arrangement for the scan wheel assembly 215 will be described. Scan wheel assembly 215 in general and back support plate 234 in particular are carried on a hollow drive shaft 305 which is journaled for rotation about axis A in a bearing arrangement 306 mounted to the upper front wall of the scan arm housing 294. A ferro-fluidic vacuum to air seal arrangement 307 provides a rotary vacuum to air seal between the vacuum chamber 211 and the interior of the hollow shaft 305, and correspondingly to the interior of the hollow scan arm housing 294. Belt drive wheel 301 is mounted on hollow drive shaft 305 to provide the rotary drive power which causes the scan wheel assembly 215 to rotate at high rpm during the ion implantation process. A gear drive 306A drives an absolute digitizer to track wheel rotation.

The cooling water delivery arrangement 232 includes a hollow tube 310 which is mounted within the hollow drive shaft 305 in a concentric manner utilizing any convenient spacer positioning arrangement which permits passage of fluid through both the inner region of the tube in one direction and around the annular outside region between the hollow tube 310 and the drive shaft 305. The hollow tube 310 and the drive shaft 305 cooperate with a rotating seal arrangement in the header assembly 304 to provide water pressure to air sealing for the cooling fluid traversing the interior and annular coolant channels.

A fluid distribution block 312 is mounted on the front of the scan wheel hub 230 and includes a plurality of radially arrayed outlet fluid channels 314 which are in communication with the fluid delivery tubes 264 of the individual heat sink assemblies 231. A similar radial array of fluid coupling channels 315 communicate return fluid from the tubing 263 to the return fluid channel 310A. A coupling sealing arrangement such as that designated 314 couples the tubing 263 and 264 in a sealed manner into the distribution block 312.

Referring to FIG. 9 in conjunction with FIGS. 19 and 20, it will be apparent that the drive motor 222 provides high rpm driving power to belt drive wheel 299 which causes rotation of shaft 296 and corresponding rotation of belt drive wheel 300. This high rpm drive is coupled by way of a power transmission belt to belt drive wheel 301 in FIG. 20 which causes high rpm rotation of shaft 305 and all of scan wheel assembly 215.

It should be apparent from the above description that the combined high rotational velocity drive for the scan wheel assembly 215 and the slower processional scan drive for the scan arm assembly 217 are provided with the use of only rotary vacuum to air shaft seals which are very simple, effective arrangements to isolate ambient atmosphere from vacuum within the vacuum chamber 221. Typically the scan wheel assembly 215 will be rotated during an ion implantation operation at about 1,200-1,400 rpm. The scan arm assembly is typically precessed back and forth in a cycle which send the individual heat sink paddles and wafers thereon back and forth through the ion beam at a rate of about two to twelve cycles per minute. The use of a rotary drive arrangement for the scan arm assembly 217 effectively eliminates the need for any type of translational vacuum to air sealing arrangements to provide the slow scan movement of the scan wheel assembly 215. The rotating ferro-fluidic vacuum to air seals are much less expensive and more effective and reliable than translational sealing arrangements used in some prior art systems. This enhances the overall simplicity and reliability of the dual scan drive system.

It should be understood that alternative arrangements could be provided for the high rpm drive of the scan wheel assembly 215. For example, an electric motor could be mounted directly within the hollow scan arm housing 294 with a substantially direct drive transmission to the shaft 305 carrying the scan arm assembly. However, since it is preferable and expedient to couple cooling fluid through hoses into the interior of the scan arm housing 294, the concentric drive arrangement utilizing hollow drive shaft 296 shown in FIG. 19 is an advantageous way of coupling scan wheel drive power to the interior of the hollow scan arm housing. In particular, this reduces the overall weight of the scan arm assembly 217 and reduces the overall moment of inertia about the axis A which must be overcome in reversing the drive direction of the scan wheel assembly and scan arm combination. External mounting of the drive motor is also preferred for purposes of ease of maintenance and repair as necessary.

Figure 21:
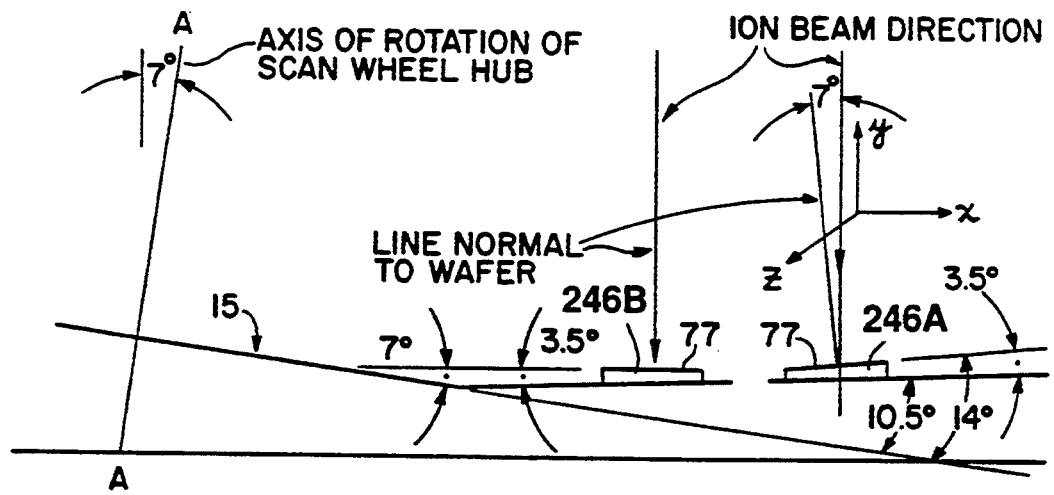
FIGS. 21-24 are diagrams useful in explaining the princi- ples of operation of a wafer scanning system according to this invention.

Referring now to FIG. 21, important geometrical relationships of the scan wheel assembly and its mounting for rotation relative to the vacuum chamber and the direction of the ion beam will be described. This description is best taken using FIG. 21 in conjunction with FIGS. 11, 14, 17 and 19. As shown in FIGS. 11 and 21, the axis of rotation A of the scan wheel assembly 215 is canted relative to a line normal to the back wall of the vacuum chamber. More particularly, the axis A—A is canted at about 7 degrees relative to a line parallel to the ion beam direction. For purposes of this discussion, the ion beam direction will be assumed to define one coordinate of a rectangular coordinate system XYZ shown in FIG. 21 with the Y-axis of that coordinate system being defined by the ion beam direction. The X-axis of the rectangular coordinate system is perpendicular to the ion beam direction and the YX plane intersects both the ion beam direction line and the scan wheel axis of rotation A—A. It will be remembered that the axis of rotation A—A is describing a small arc of a circle as the scan arm assembly 217 rotates relative to the axis B—B. However, this change in the Z-coordinate position of the A—A axis of rotation can be ignored for practical purposes. What is important is that the 7-degree canting of the axis of rotation A—A puts that axis at a small acute angle to the Y-coordinate direction of the ion beam so that the A—A axis would intersect the ion beam direction at a large acute angle. It is this canting of the axis A—A which permits substantial centrifugal force to be provided normal to a wafer surface on the heat sink inserts even when a 0-degree implant angle is being utilized.

As shown in FIG. 21, the 7-degree canting of the axis A—A produces a corresponding 7-degree canting of the spoke arm section 241 relative to the X-axis or, in other words, relative to a line perpendicular to the ion beam. The heat sink paddle 245 is canted relative to the spoke arm 241 such that the mounting surface for the heat sink insert is canted relative to the spoke arm at about 10.5 degrees. Referring now to the heat sink insert 246A designated in FIG. 21, which corresponds to the position of the heat sink insert shown in FIG. 17, the wafer mounting surface 277 is canted at an additive 3.5-degree angle to the paddle such that the wafer mounting surface 277 is canted at a total 14-degree angle relative to the spoke arm 241. Since the spoke arm is canted at 7 degrees relative to the X-axis of the coordinate system, the 14-degree angle between the wafer mounting surface 277 and the spoke arm produces a 7-degree canting between the wafer mounting surface 277 and the XZ plane. This results in a 7-degree angle between the ion beam direction defining the Y-coordinate axis and a line normal to the wafer mounting surface 277 for a 7-degree implant angle of ions to a wafer on the wafer mounting surface 277.

In FIG. 21, 246B designates the opposite orientation of the heat sink insert 246 as shown in FIG. 19. Since the mounting surface of the heat sink paddle relative to the X-axis is 3½ degrees, the 3½ degree canting of the wafer mounting surface 277 in a subtractive sense places the wafer mounting surface 277 parallel to the XZ plane so that the ion beam direction is substantially normal to the wafer mounting surface 277 as shown in FIG. 21 and in FIG. 19. However, in each case of the heat sink orientation 246A and the orientation 246B shown in FIG. 13, the line normal to the wafer mounting surface 277 will intersect the axis of rotation A—A of the scan wheel assembly in a large acute angle. Thus a centrifugal force component normal to the wafer mounting surface is produced during rotation about axis A regardless of whether the beam implant angle is 7 degrees or 0 degrees.

Figure 22:
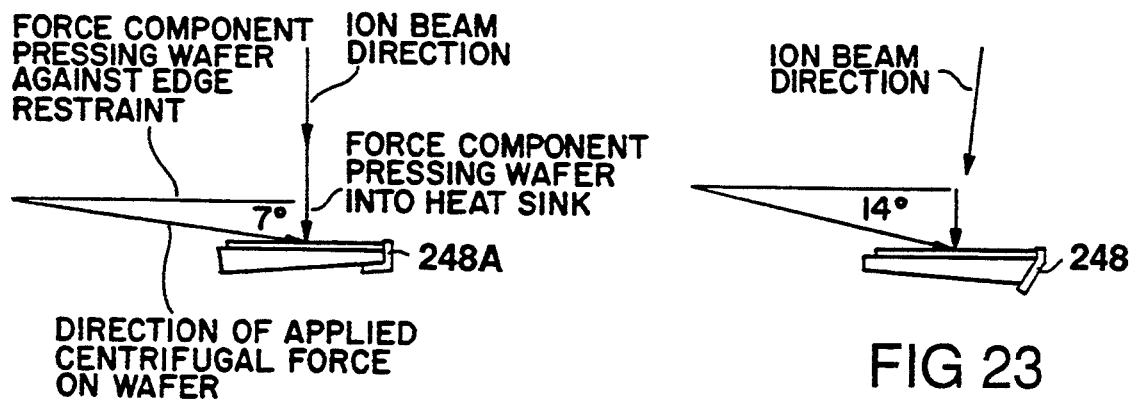
Figure 23:
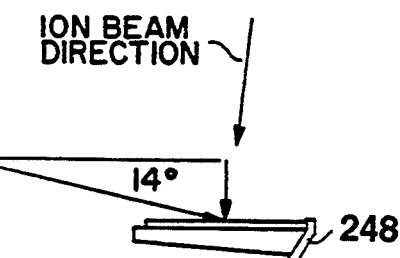

FIGS. 22 and 23 illustrate the centrifugal force acting on a wafer on the heat sink. In the case shown in FIG. 22, the centrifugal force operates at an angle of 7 degrees relative to the plane of the wafer and thus has a substantial component of force which presses the wafer into the heat sink, or more specifically, into the elastomer pad on the heat sink. A larger component of the centrifugal force pushes the wafer against the edge restraint element 248A. Correspondingly, as shown in FIG. 23, when the implant angle is 7 degrees the centrifugal force on the wafer due to the high rotational velocity of the scan wheel assembly will be applied at an angle of 14 degrees to the plane of the wafer producing an even larger normal component of centrifugal force tending to press the wafer into the elastomer pad on the heat sink.

The geometric angles utilized in the embodiment of this invention depicted in the drawing figures discussed to this point and illustrated in FIG. 21 is only one case of the general concept of this invention. The general concept is that the axis of rotation A—A be canted toward the origin of the ion beam by a small acute angle generally in the plane defined by the ion beam direction and the axis of rotation. Canting of the axis of rotation in a different plane would also produce centrifugal force on the wafer normal to the heat sink mounting surface, but would not provide for a constant implant angle, as the scan wheel assembly rotates. The particular geometry shown in FIG. 21 is preferable to permit the same heat sink insert to be utilized in opposite mounting orientations for 7-degree and 0-degree implants. It should be apparent that this same result could be achieved under a 10-degree canting of the axis of rotation of the scan wheel assembly with an appropriate adjustment of the canting of the spoke arm relative to the main back plane 234 of the scan wheel assembly. If the axis A—A were canted at 10 degrees instead of 7 degrees shown in FIG. 21 and the spoke arms were canted at 13.5 degrees instead of the 10.5 degrees shown in FIG. 21, the heat sink inserts 246 could still be utilized for 7-degree and 0-degree implants in opposite orientations. The only difference then would be that a larger amount of vertical component of centrifugal force would be present to press the wafer against the heat sink in both the 7-degree and 0-degree implant situations. In the 0-degree implant the angle of centrifugal force on the wafer would be increased to 10 degrees and in the 7-degree implant situation the angle of application of centrifugal force on the wafer would be 17 degrees.

It will be appreciated, however, that while increases in centrifugal force normal to the wafer can be achieved by greater angles of canting of the axis of rotation, if one also maintains the same overall diameter of the scan wheel assembly, the depth of the vacuum chamber 211 must be increased to accommodate the increased angle. While some variation in the angle of canting of the axis A of the scan wheel can be utilized, it is preferable to maintain that angle at a small acute angle so that, in the rotational precession of the scan wheel assembly about the axis B—B, the distance between the wafer mounting surface and the ion beam exit from the post-acceleration tube 214 does not change drastically from one overscan position to the other. This could be important if the ion beam striking the wafer does not have a constant spot size, i.e., if all ions in the beam are not travelling substantially parallel to the Y-coordinate direction.

Figure 24:
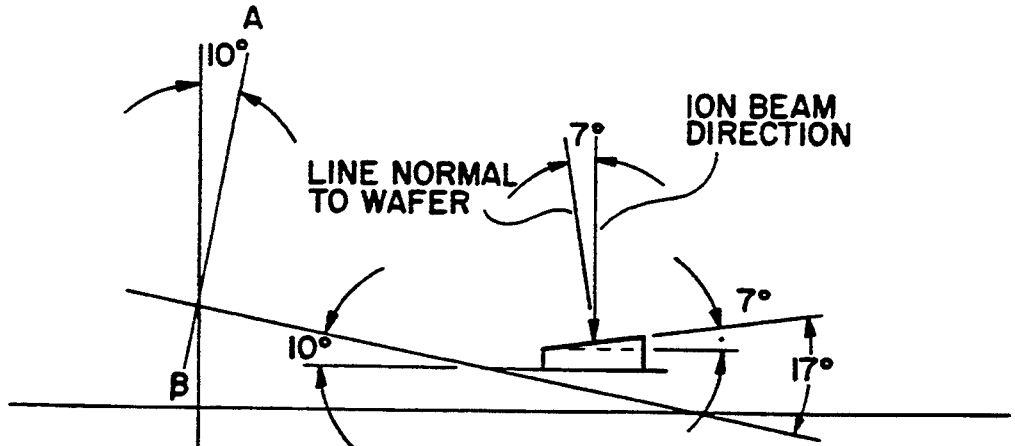

FIG. 24 illustrates that the general concepts of this invention could also be employed in a scan wheel assembly where different heat sink insert geometries are utilized to vary the implant angle between 7 degree and 0 degree. This shows the generality of this feature of the invention.

Referring back to FIGS. 9-11, it will be apparent that, as in prior art dual scan systems, the geometrical factors regarding the slow scan and fast scan of the scan wheel assembly 15 are such that one or both of the fast scan speed or the slow scan speed must be varied during the slow scan cycle from one overscan position to the other. For uniformity of implant dose across the wafer surface, a uniform dwell time of each elemental surface area of the wafers in the ion beam during the overall ion implantation process must be achieved.

It will be appreciated that there are many ways that the slow scan arrangement of this invention could be implemented to achieve a 1/r velocity drive relation for the scan wheel where r is the distance from the center of the scan wheel to the fixed ion beam position. The preferred embodiment of this invention uses a congruent triangle mounting and drive arrangement for the scan arm which greatly simplifies the mechanical and electrical control aspects of the slow scan drive. This aspect of the invention can best be described in connection with the diagram shown in FIG. 25 together with the drawing in FIG. 9.

Figure 25:
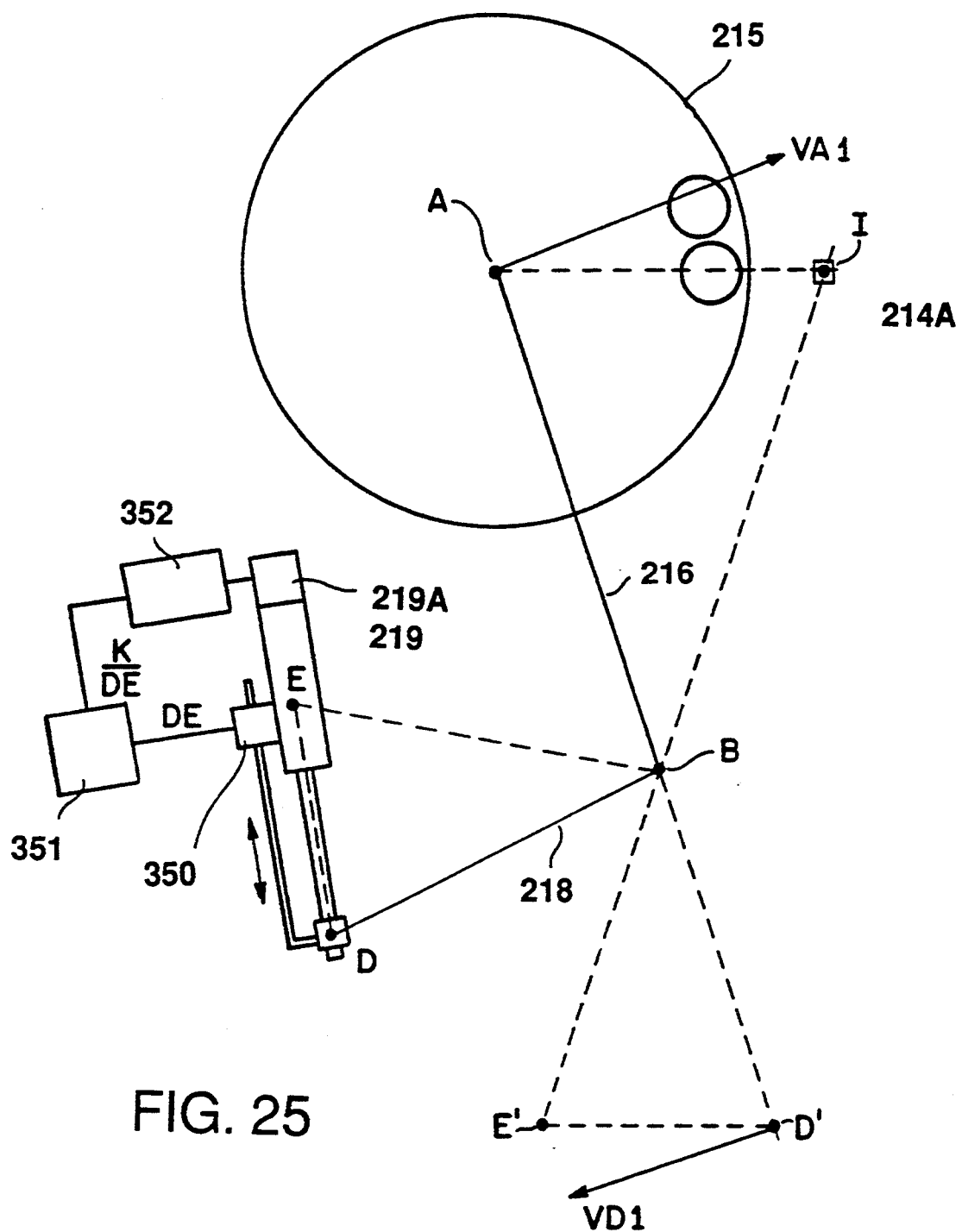
FIG. 25 is a schematic diagram of the slow scan control arrangement showing congruent triangle mounting and drive arrangements in accordance with this invention.

As shown in FIG. 25, the axis A of the scan wheel 215, the center of the ion beam I and the axis B of rotation of the scan arm 216 form a triangle BAI. In accordance with this invention, the length of the pivot arm 218 and the placement of the rotation point E for the linear drive arrangement 219 relative to the axis B are chosen such that the triangle BDE is congruent with the triangle BAI. This means that the included angles of each triangle are the same and the lengths of the sides are proportional.

This congruency of mounting relationships enables the drive of the point D toward the point E to be controlled in velocity as a function of the inverse of the distance DE such that the corresponding velocity of the point A in the direction of point I will be controlled as a function of the inverse of the distance AI. A position tracking system 450 tracks the distance DE and provides an output signal DE corresponding thereto. A divider circuit 451 converts the DE signal to a velocity control function signal K/DE where K is a variable constant determining the scan speed. This K/DE signal is fed to a motor control circuit 452 which controls the speed of motor 219A in accordance with the K/DE control function.

The congruent triangle mounting/drive relationship can more easily be understood by considering the congruent triangle BD'E' which is equivalent to moving the pivot arm 218 to be in alignment with the scan arm 216. This arrangement is fully equivalent from a geometric standpoint, but is not convenient to use in physical hardware for obvious reasons. As shown, the instantaneous velocity of the point D' is a vector VD1 and the instantaneous velocity of the point A is a vector VA1. It is the components of those vectors in the D'E' direction and AI direction which must have the 1/r (i.e. 1/AE) relationship.

Tracking the length D'E' and controlling the velocity of D' in the E' direction in accordance with that value automatically provides a velocity of scan in the D'E' direction which is inversely proportional to the value of D'E' and by congruency, is inversely proportional to the value of the distance AI. Thus, even through A and D each move in a circular arc and the direction of their instantaneous velocity vectors is constantly changing, the tracking of the distance DE and controlling velocity as a function of 1/DE automatically compensates for changes in the direction of velocity vectors and gives control based on the vector component along the line between the axis A and the ion beam center I at any scan position.

One could obviously substitute a motor and gear arrangement to drive the scan arm 216 and use a complicated computer generated algorithm to control the speed of the motor to achieve the 1/r scan function. This arrangement would utilize the advantages of the mounting arrangement for the scan arm but would be more expensive to implement.

The ion implantation system depicted in FIG. 9 utilizes a high degree of sophisticated computer control of the ion beam line components and the wafer handling and wafer scanning assemblies utilized therein. Accordingly, it should be understood that monitoring and other signal lines may be coupled into the scan arm assembly 217 and computer control of both the fast scan motor 222 and the motor in the slow scan lead screw drive arrangement 219 can be provided to achieve overall automated control processing of a batch of semiconductor wafers to produce a specified implant dosage of a preselected ion species in each of the twenty-five wafers on the scan wheel assembly. This overall computer control may be integrated with dose monitoring arrangements which are facilitated by the scan wheel assembly design in that ion beam current levels can be monitored throughout substantially the entire dual scan cycle of the system. If necessary, the number of slow scan cycles and the speed of the scan cycles can be altered during the implant process to insure that the final target dose is implanted uniformly in the wafers in an integral number of slow scan cycles. Thus the overall computer control algorithm for the slow scan drive may involve many complex factors which will be readily understood and implemented by the skilled electronic and computer engineers with this sophisticated capability being enabled by the design concepts of this invention as described above.

It will be apparent from the above description of a preferred wafer scanning system of this invention that all of the desired and required features for a wafer handling and scanning system in a very high current ion implantation system have been attained.

1) Full batch scanning of twenty five wafers of diameter up to six inches is provided by the twenty-five individual heat sink assemblies provided on the scan wheel assembly according to this invention.

2) Uniformity of dose with less than 0.75% variation is readily achieved by accurate control of the fast and slow scan motions of the dual scan drive arrangements of this invention which are simple and reliable low inertia and low friction systems. The open area feature of scan wheel assembly design facilitates accurate real time current measurement, accurate measurement of accumulated dose, and reliable control of scan cycles for accuracy and uniformity in achieving the targeted final implant dose.

3) Wafer temperatures less than 80 degrees Centigrade can be maintained at beam power of four kW due to the open geometry of the scan wheel assembly between spoke arms and wafer heat sink paddles and inserts together with water cooling channels in the heat sink paddles, providing effective heat transfer mechanisms between wafers and cooling fluid, including effective use of centrifugal force components normal to the wafer surface to avoid mechanical wafer clamping during implantation.

4) Implant angle variation is avoided by the design of the heat sink assemblies with flat wafer mounting surfaces and the scan motion of the wafer scanning system.

5) Contamination sources are substantially reduced by eliminating wafer edge clamps and avoiding translational vacuum-air sealing arrangements. All lubricated surfaces are outside the vacuum chamber. Minimum scan wheel surface area is intercepted by the ion beam during scanning to reduce sputtered contaminants.

6) Mechanical and thermal stress damage to the wafer is virtually eliminated by avoiding wafer edge clamps that are difficult to cool and domed wafer mounting surfaces which produce mechanical stress.

7) Total automation of wafer loading and unloading is facilitated since the scan wheel assembly and the individual heat sink paddles are readily positioned at a wafer transfer station near one side of the vacuum chamber. Computer controlled automation of the total implant process is also facilitated by the scan wheel assembly design features according to this invention and the drive arrangements therefor.

The combination of the design and operational features of a wafer scanning system according to this invention with the high beam current technology, the automated wafer handling and loading system disclosed in the co-pending Stonestreet patent application and advanced, computer controlled automation features produces an ion implantation system with breakthrough levels of improvement in performance to meet the advanced requirements of the semiconductor industry.

Details of Preferred Beam Line Components

Figure 26:
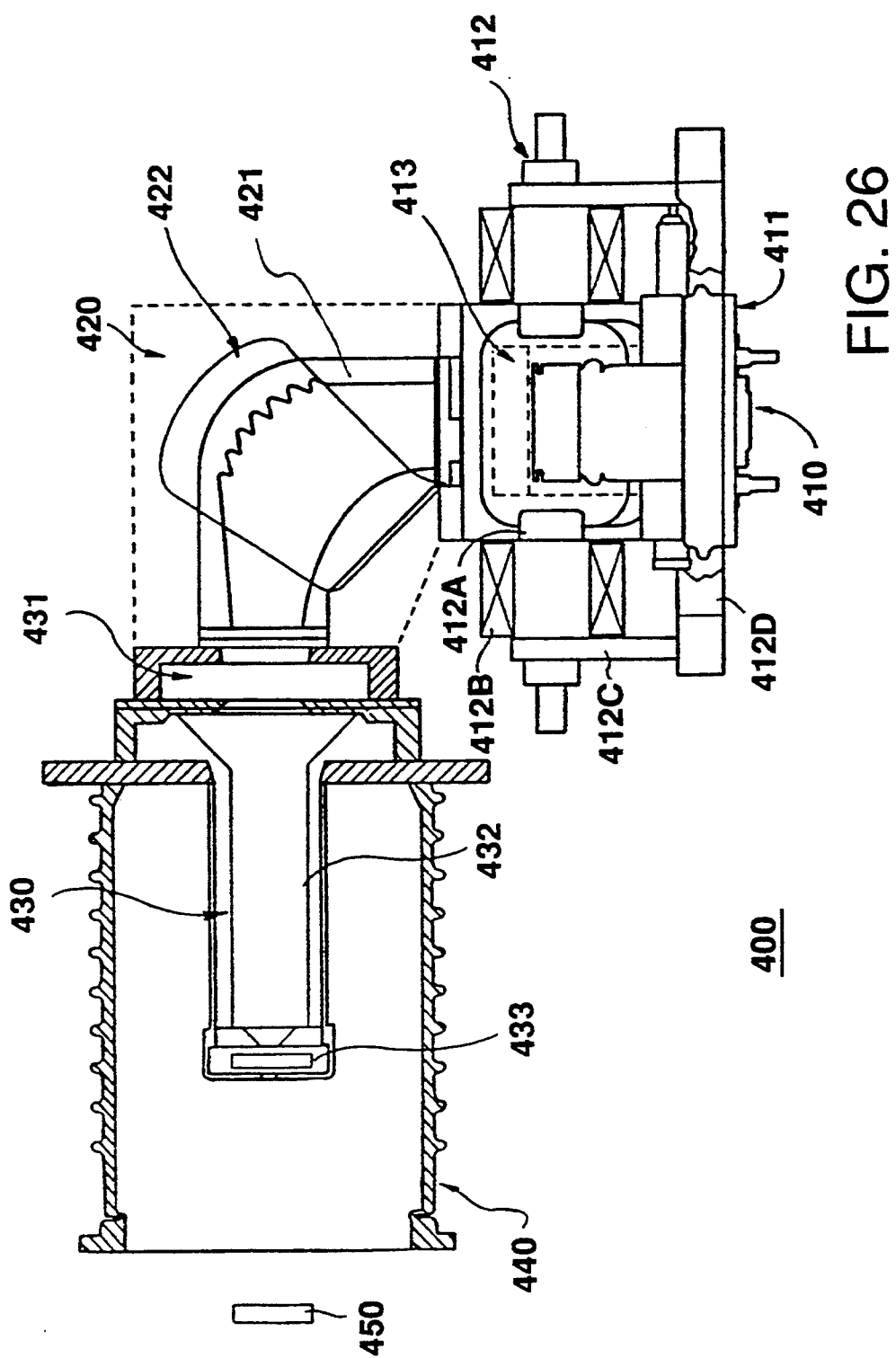
FIG. 26 is a partly sectioned elevational view of the beam line modules of an ion implantation system in accordance with this invention.

FIG. 26 shows the main components of an ion implanter beam line 400 in accordance with a presently preferred embodiment of this invention. Beam line 400 comprises an ion source arrangement 410, ion mass analyzing system 420, a mass resolving system 430, and a post-acceleration system 440 which accelerates the resolved ion beam to a target element 450. Ion source arrangement 410 includes a source assembly 411, a source magnet assembly 412, and an ion beam extraction assembly 413. Ion mass analyzing system 420 includes ion beam flight tube 421 and beam analyzing magnet assembly 422. Mass resolving system 430 includes a vacuum gate valve 431, ion drift tube 432, and mass resolving slit assembly 433. Post-acceleration system 440 may take a number of configurations including the system disclosed in co-pending and commonly assigned U.S. patent application Ser. No. 774,209, filed Aug. 9, 1985, and entitled "Ion Beam Acceleration System." Target element 450 is a semiconductor wafer being subjected to ion implantation. The individual wafers are carried on a wafer processor appartus 460 discussed above.

The various ion implanter beam line components depicted in FIG. 26 are shown in greater detail in other drawing figures to be described below except for the source magnet assembly 412. Source magnet assembly 412 is utilized when a Freeman-type source assembly is incorporated in the ion source arrangement 410. Source magnet assembly 412 includes magnet poles 412A extending into the ion source housing from opposite sides and a magnet coil 412B, each of which coils is preferably separately powered so that the magnetic field generated thereby can be separately controlled. A magnetic field return circuit is provided and comprises vertical return bar 412C and a U-shaped magnetic return yoke 412D which carries the return magnetic field around the bottom portion of ion source arrangement 410.

Using this configuration, the magnetic field return circuit for the source magnet assembly 412 does not interact with the magnetic field components of the mass analyzing system 420 in a way which could produce vertical magnetic field components in the region immediately in front of the ion source chamber and source assembly 411, i.e., a field parallel to the extracted ion beam. It has been discovered that, if the source magnet return circuit is provided simply as a U-shaped return yoke at the level of the source magnet poles 412A, a magnetic field interaction with the beam analyzing magnet assembly produces such a resultant vertical magnetic field component which reduces the efficiency of the ion source.

In other words, the efficient operation of the Freeman-type source requires that the magnetic field between the poles 412A which are aligned with the filament-cathode of the Freeman-type source be substantially parallel to the filament-cathode so that electrons emitted from the cathode will spiral around the cathode for high ionization efficiency of the gas in the source. If, instead, the spiralling path of the electrons is disturbed by a component of magnetic field in this vicinity which is parallel to the beam, the ion generation efficiency of the source will be substantially depressed and the resultant ion beam which can be extracted by the ion beam extraction assembly will be substantially lowered. The source magnet assembly 412 shown in FIG. 26 with the magnetic return circuit arrangement depicted avoids production of any vertical component of magnetic field in front of the source and thus permits full efficient Freeman source operation for high ion beam current production and extraction.

Figure 27:
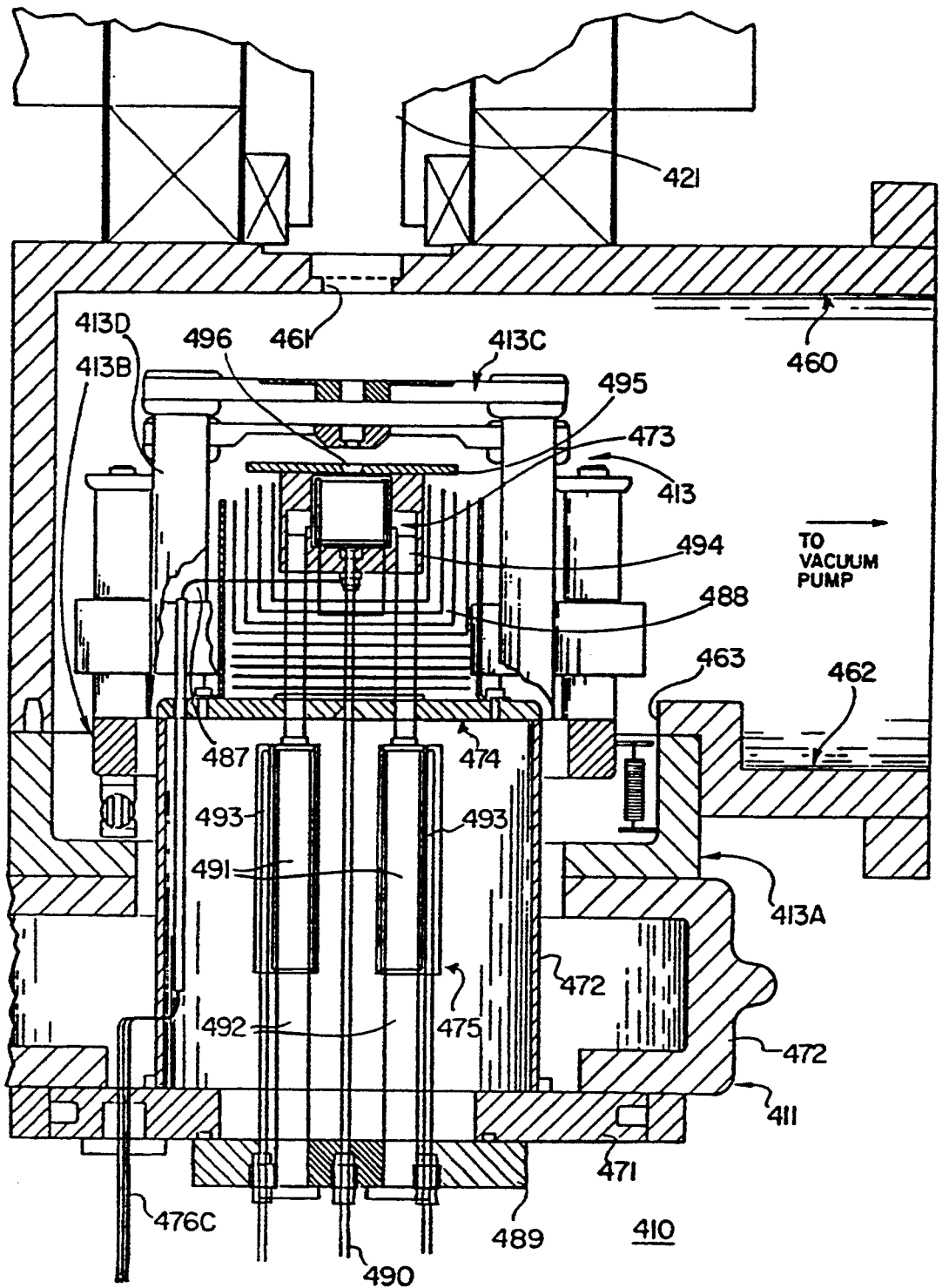
FIG. 27 is a partly sectioned, side elevational view of an ion source arrangement of source housing, ion source, and beam extraction electrode system in accordance with this invention.

FIG. 27 shows in greater detail ion source arrangement 410. Source housing 460 provides the basic vacuum enclosure for the source assembly 411 and beam extraction assembly 413. Source housing 460 has a rectangular aperture 461 in the top wall thereof for communicating the ion beam generated to the flight tube 421 mounted above this top wall. A vacuum pump port 462 in one side of the housing 460 communicates with a vacuum pump arrangement for evacuating the source housing. The bottom wall of chamber 460 has a port 463 therein for receiving the extraction assembly 413 and the source assembly 411. Both the beam extraction assembly 413 and the source assembly 411 are constructed and arranged to be separately removable modules, that is, each assembly is completely removable as a separate unit for cleaning and maintenance. Moreover, the two assemblies can be removed together for alignment checks between the source and extraction electrodes.

The details of the beam extraction assembly 413 will be discussed in detail below in conjunction with several drawing views thereof. However, at this point it should be understood that the separate module aspect of beam extraction assembly 413 involves an extraction assembly flange 413A which mounts to the bottom wall of housing 460 and carries thereon all of the other elements of the beam extraction assembly, including a support base member 413B and the extraction and deceleration electrodes 413C which are mounted on a support pillar arrangement 413D. With this modular arrangement all of these components are removed from the chamber 460 when the extraction assembly flange 413A is removed.

Similarly, ion source assembly 411 is removable from chamber 460 as an integrated single module, the details of which will now be described in conjunction with FIGS. 27–55.

Figure 28:
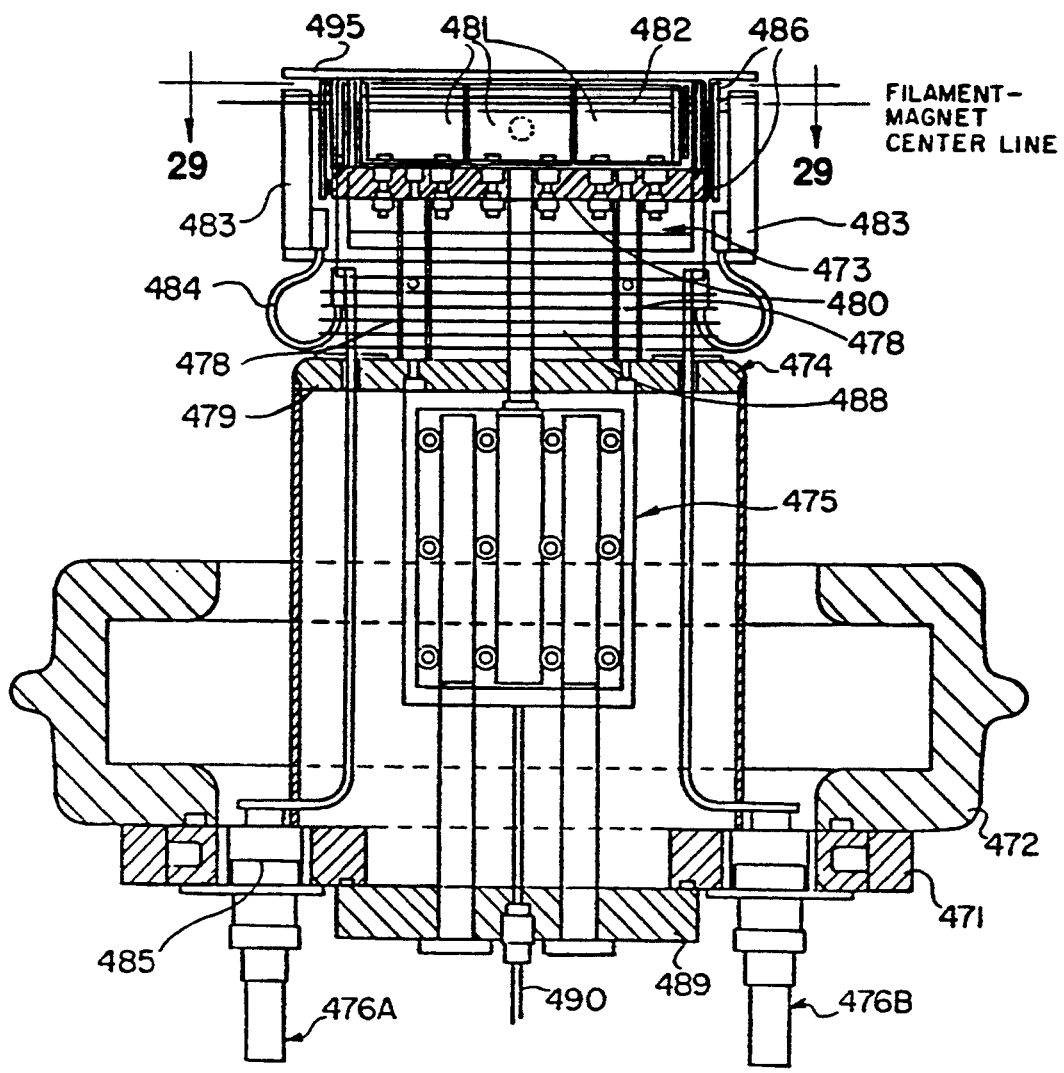
FIG. 28 is a side elevational view, partly sectioned, of a Freeman-type ion source module in accordance with this invention.
Figures 29, 30:
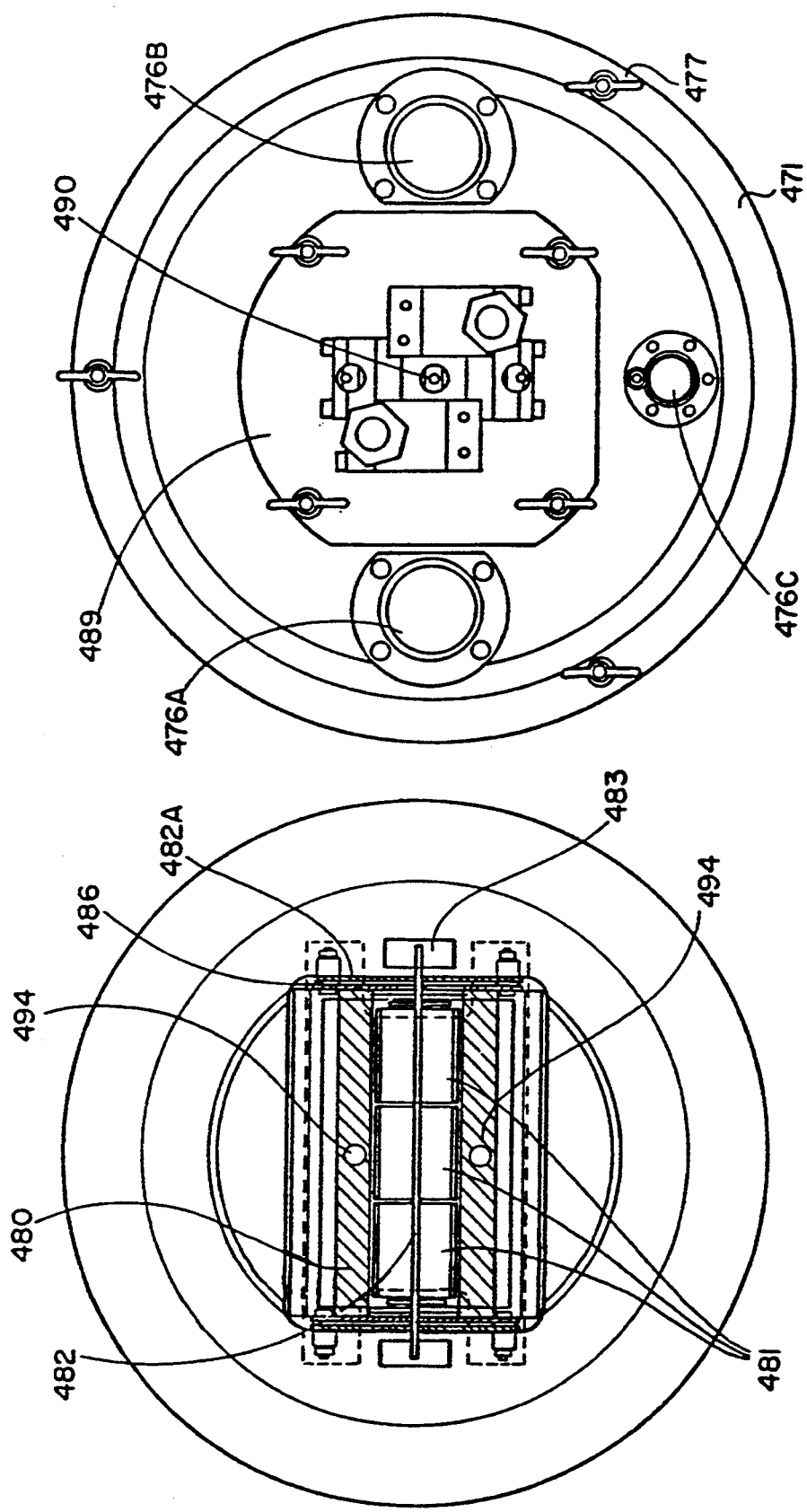
FIG. 29 is a top view of the ion source module of FIG. 28 taken along the lines 29—29 in FIG. 28.
FIG. 30 is a bottom view of the Freeman-type ion source assembly of FIG. 28.
Figure 31:
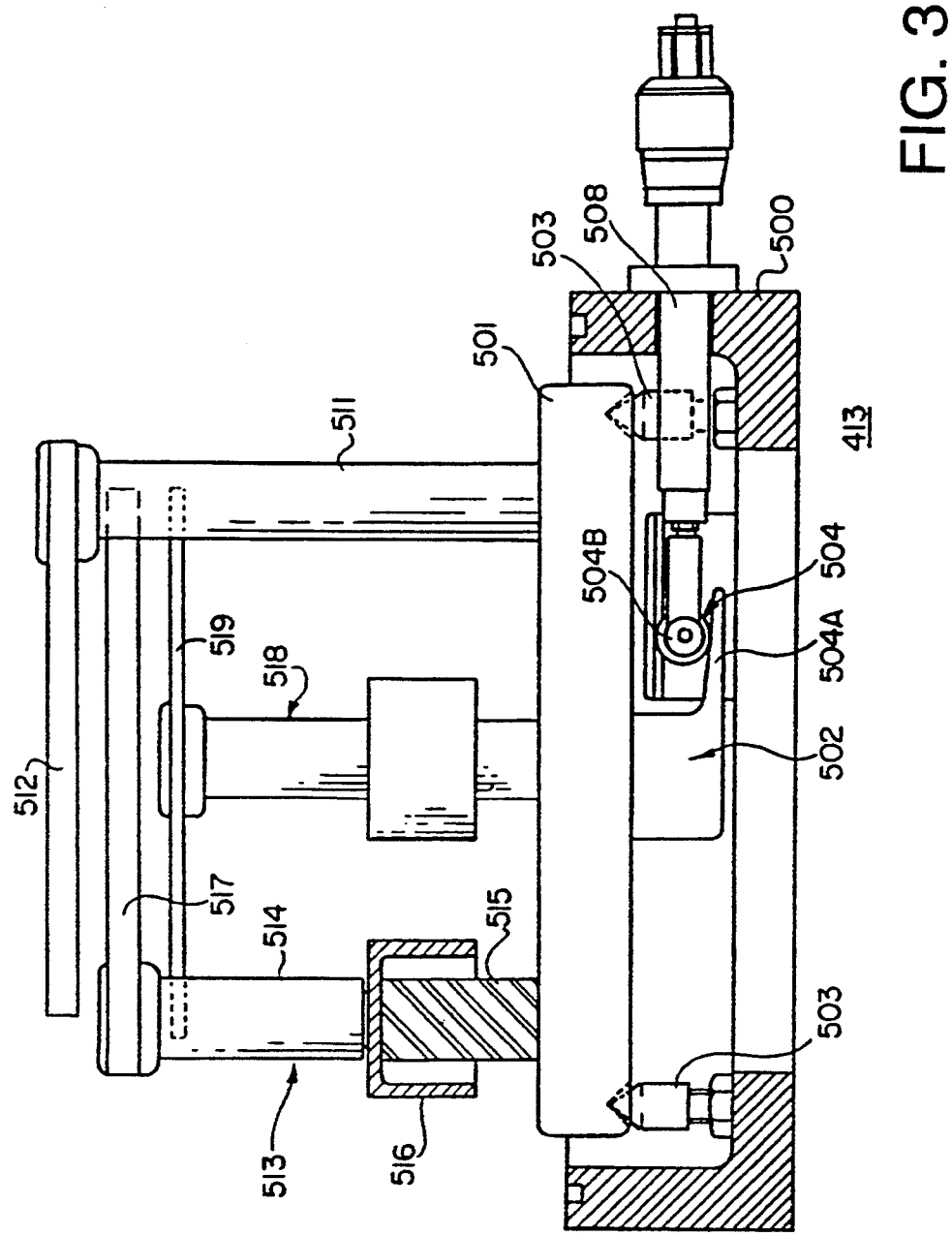
FIGS. 31—33 are front, side, and top views, respectively, of an extraction electrode module in accordance with this assembly.
Figure 32:
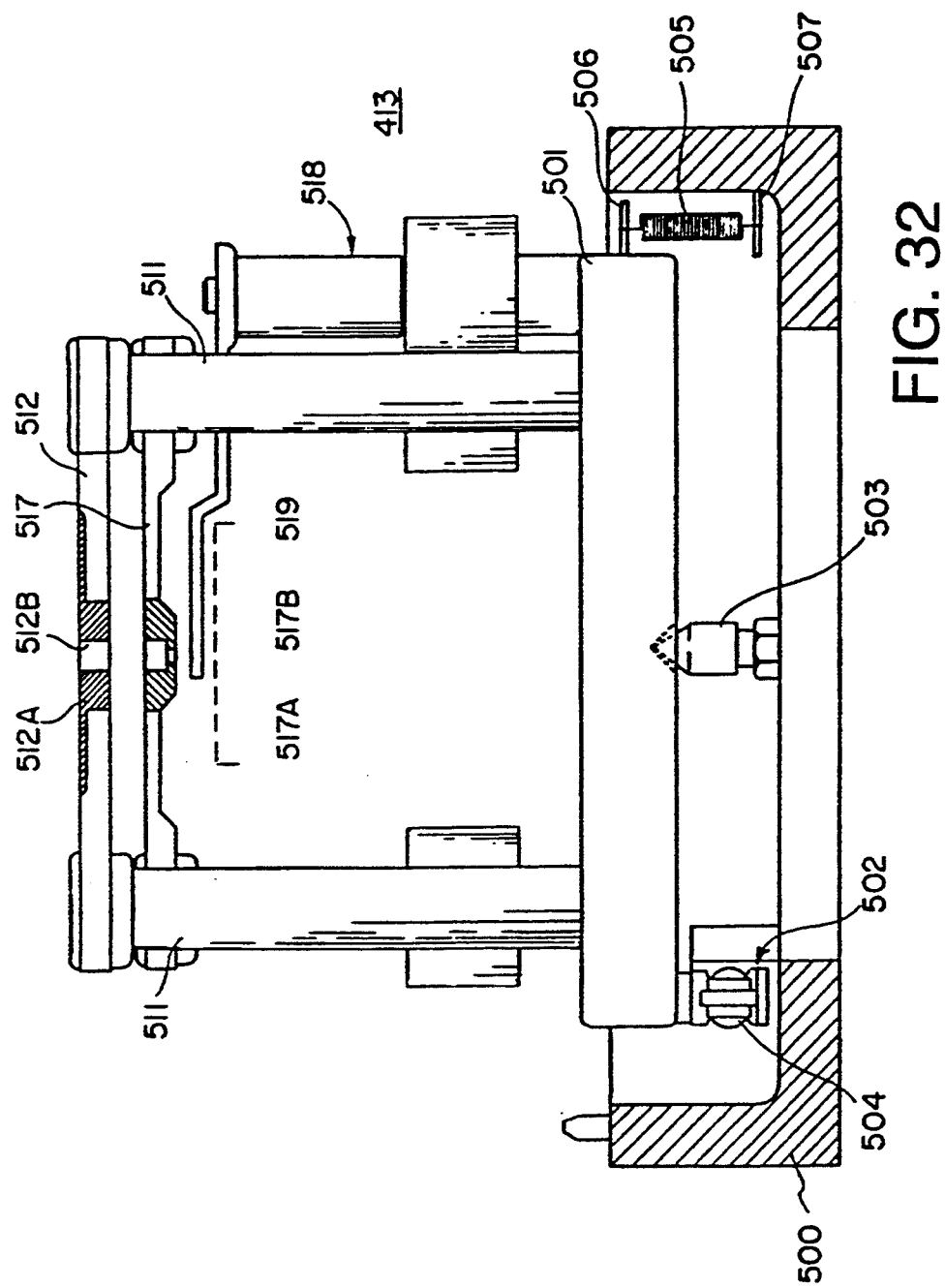
Figure 33:
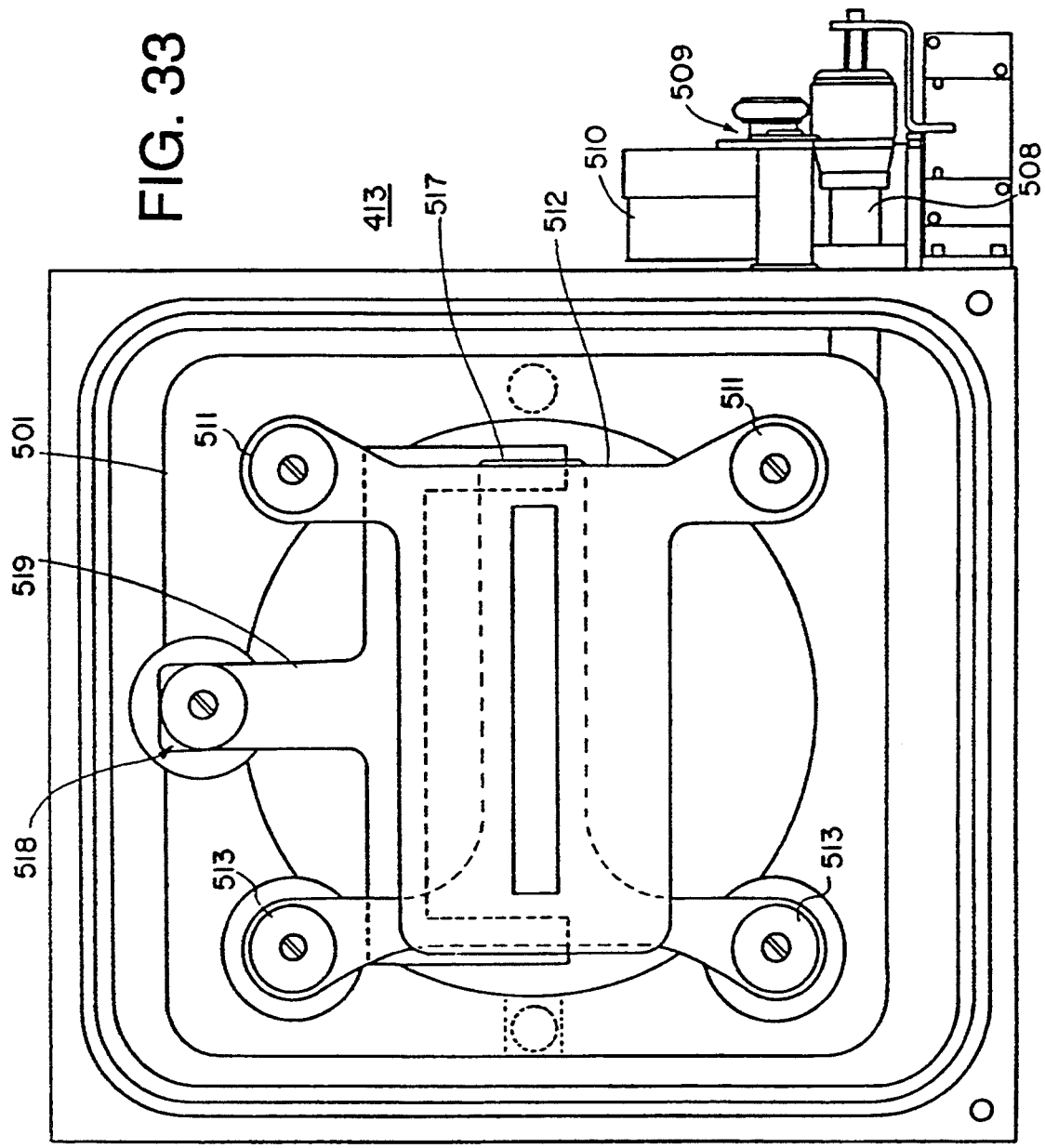

The main components of source assembly 411 are source assembly flange 471, source insulator 472, source chamber support arrangement 474, a source gas feed arrangement 475, and an electrical biasing arrangement for the ion source components including filament bias and current supply arrangements 476A and 476B, and anode supply arrangements 476C. Source flange 471 and source insulator 472 are removably mounted to the extraction assembly flange 413A utilizing a mounting bolt arrangement (not shown). Source flange 471 is mounted to insulator 472 by way of a mounting bolt and wing nut arrangement 477. The support assembly 474 for the ion source arc chamber assembly 473 comprises vertical support pillars 478 mounted on a pedestal 479 as shown in FIG. 28. The pedestal 479 is in turned carried on the ion source flange 471 and comprises a hollow pedestal structure which receives the ion source gas feed assembly 475.

Ion source arc chamber 473 includes a housing 480 with separate U-shaped anodes 481 supported on the bottom wall thereof. Filament-cathode 482 is located on its opposite ends by filament support 482A. Filament clamps 483 are clamped to each end of filament-cathode 482, and each is connected to a filament lead 484 which is fed through the top of pedestal 479 to a high current feed through 485 in source flange 471. Appropriate filament insulators 486 electrically isolate the filament-cathode from the ion source chamber 478. As shown in FIG. 27 separate electric bias lead wires 487 are coupled to the individual anodes 481 and provide separate bias voltage thereto for purposes described above in connection with FIGS. 42–44.

A heat shield fin arrangement 488 comprising a plurality of heat shield fins is interposed between source chamber 480 and pedestal 479 to reflect heat from the ion source chamber back toward the chamber and away from the pedestal and the vapor supply system 475.

Vapor supply 475 is a separate module which includes a flange 489 mounted with a mounting bolt and wing nut assembly to the source flange 471. A gas feed assembly 490, involving a tube carried on the flange 489 and extending through the top of pedestal 479 directly into the arc chamber 480, is provided for direct supply of a gas such as boron trifluoride into the source chamber. A pair of solid source charge capsules 491 with associated cartridge heaters 492 and thermocouple temperature sensors 493 are provided for evaporating solid source materials, such as arsenic, to provide vapors coupled into the arc chamber 480 through feed tubes 494. The front plate 495 of the ion source arc chamber 480 includes an ion exit aperture 496, the structure and details of which will be described below.

Figure 34:
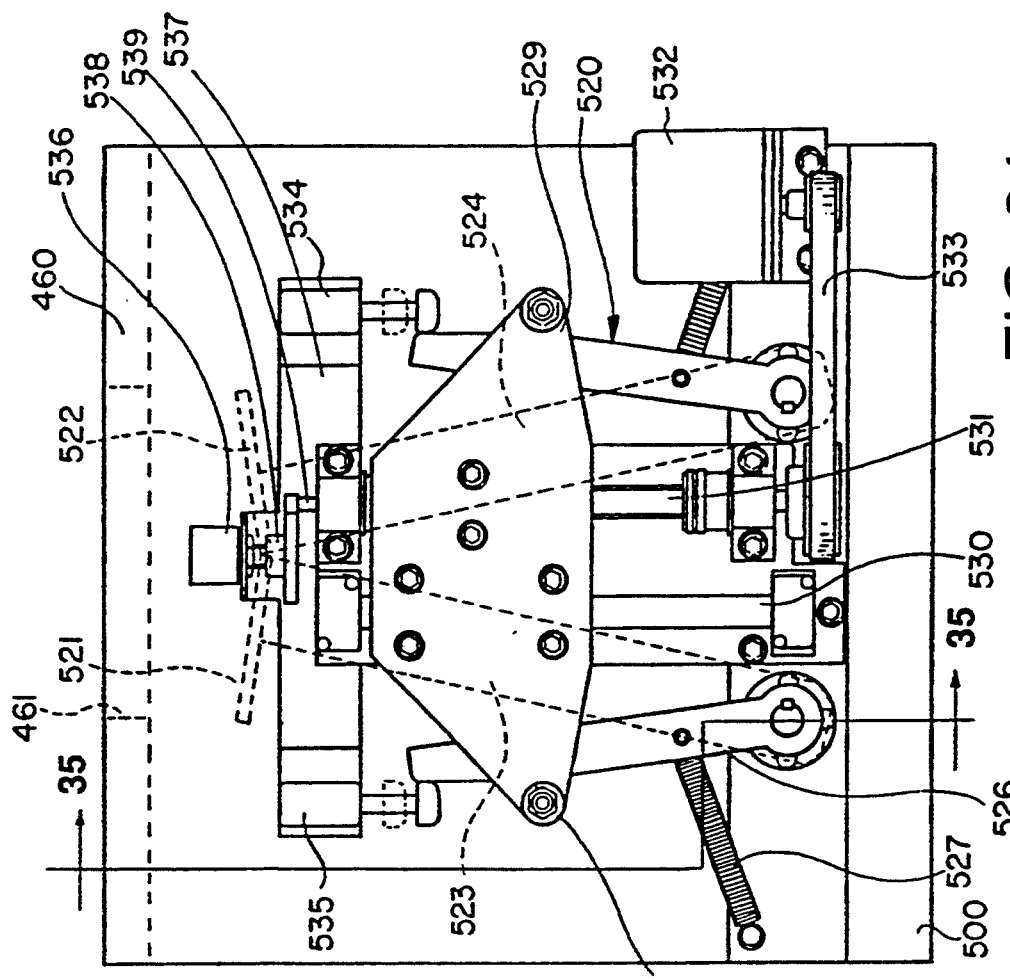
FIG. 34 is a side elevational view of a beam control vane system in accordance with this invention.
Figure 35:
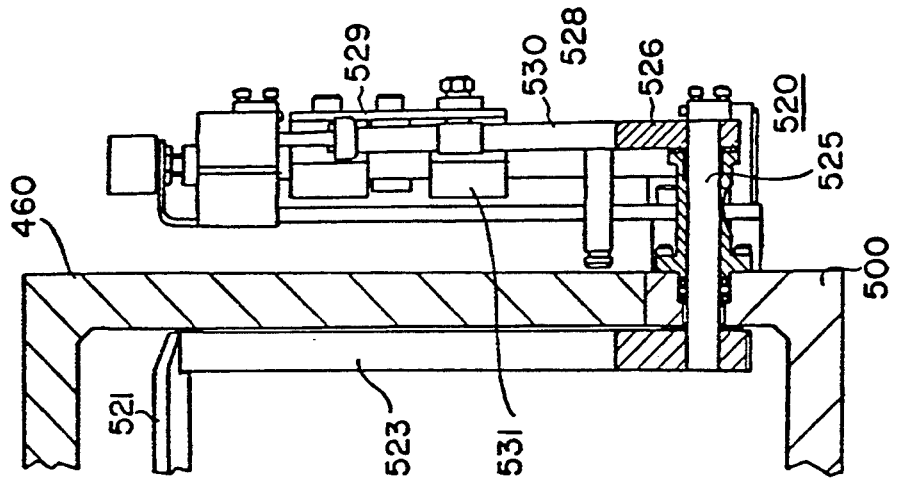
FIG. 35 is a partial section view of the beam control vane system showing FIG. 34 and taken along the lines 35-35.
Figure 36:
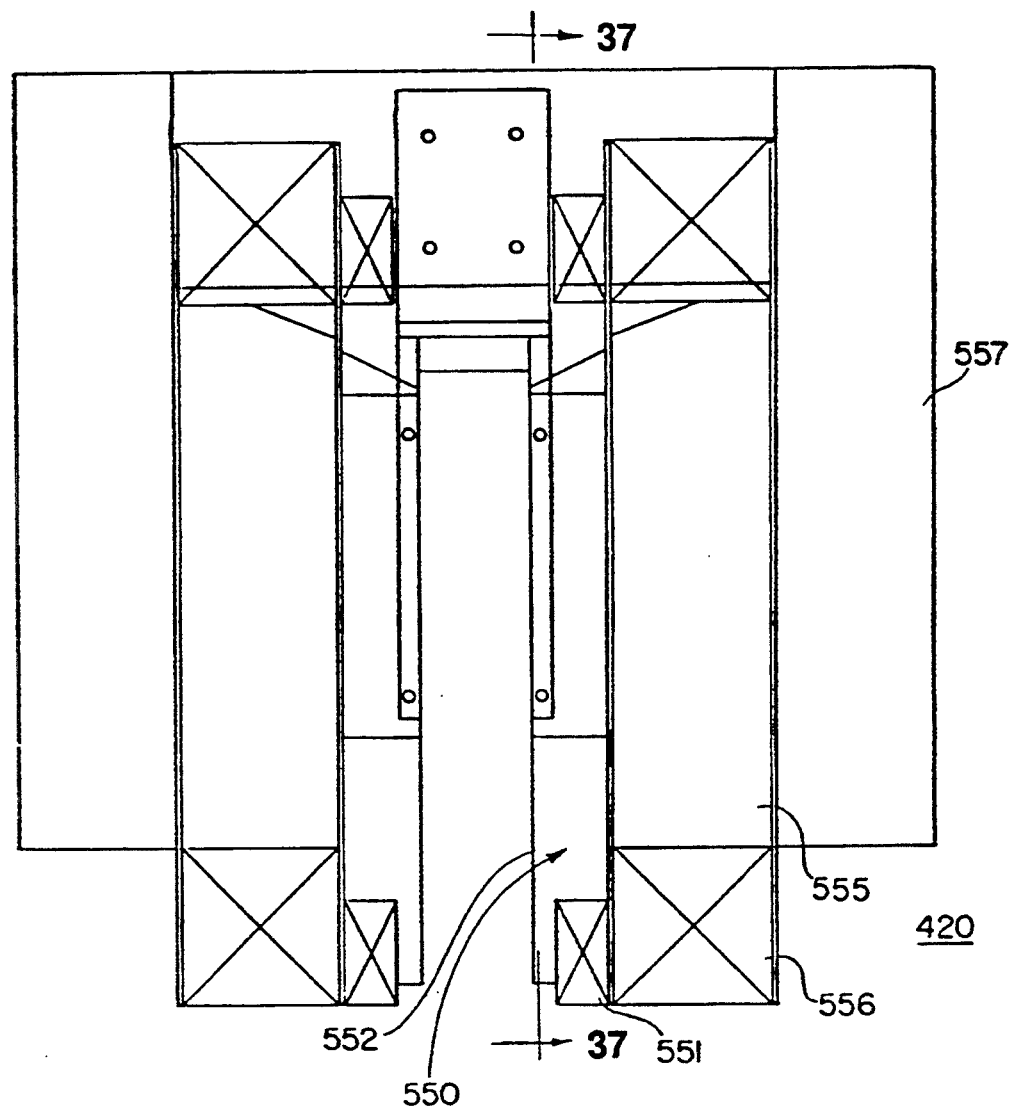
FIG. 36 is a partly sectioned front view of an analyzing magnet assembly taken along the lines 36-36 in FIG. 37.
Figure 37:
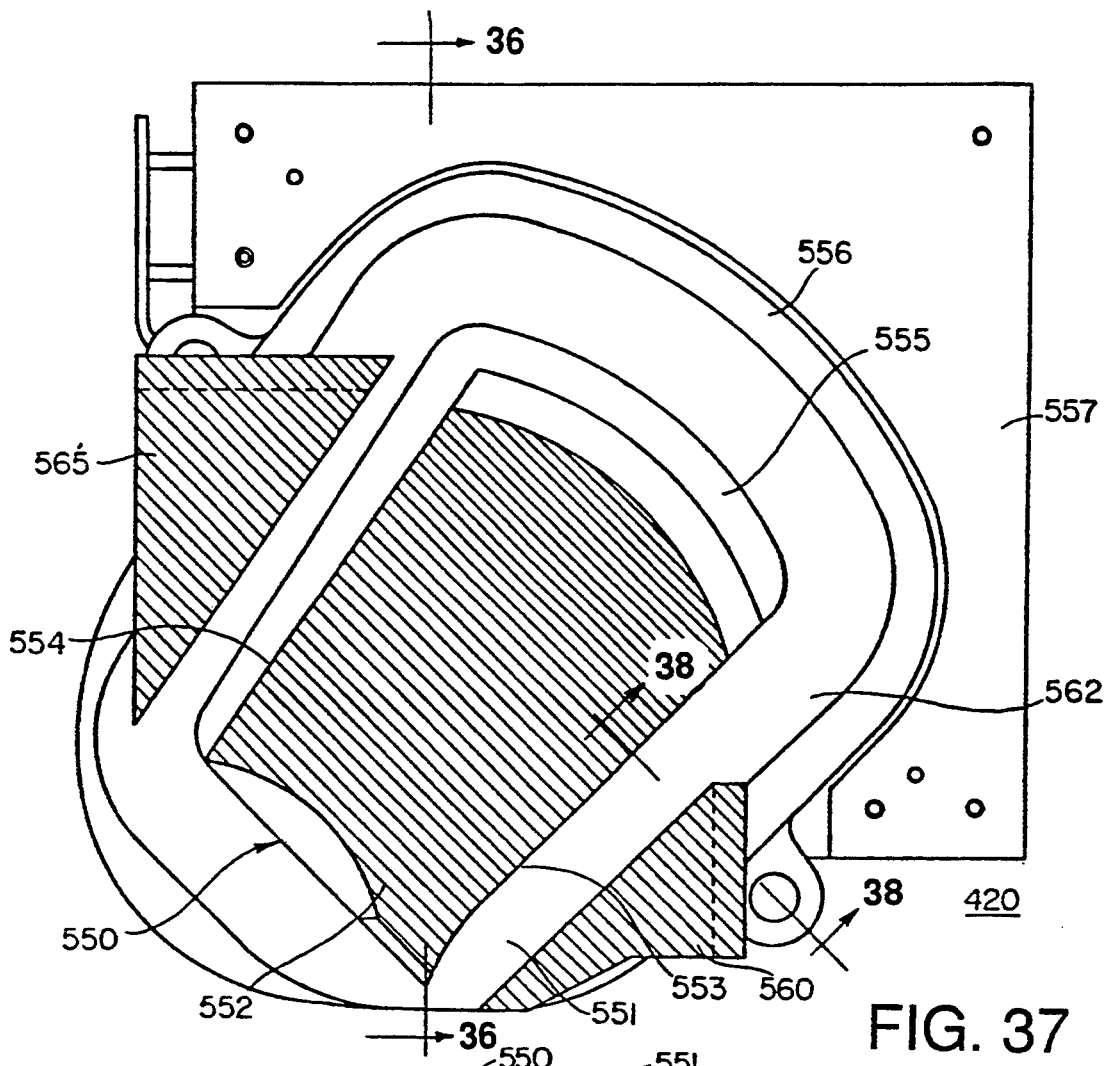
FIG. 37 is a section view of an analyzing magnet assembly taken along the lines 37-37 in FIG. 36.
Figure 38:
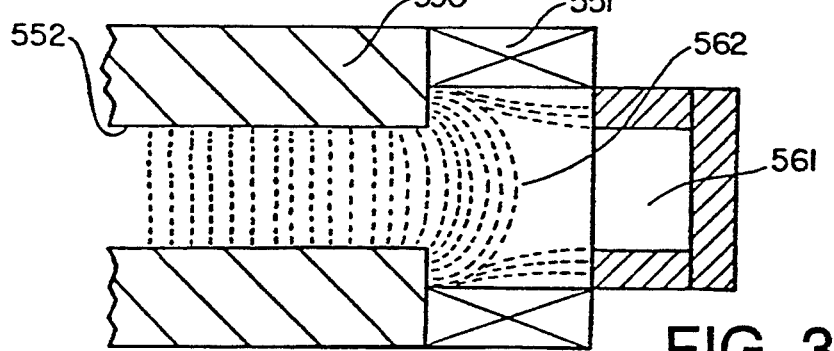
FIG. 38 is a partial section view of the analyzing magnet assembly of FIG. 37 taken along the lines 38—38 in FIG. 37.

FIGS. 56–60 depict the ion beam extraction assembly 413 which includes, as shown in FIGS. 34 and 35, a beam control vane assembly which is carried on the extraction assembly flange.

Referring first to FIGS. 56–58, it will be seen that the extraction assembly flange 500 carries thereon an electrode support base 501 which is supported on the flange 500 by means of an alignment-support arrangement 502. The alignment-support arrangement 502 includes a pair of support posts 503 which have a conical top bearing surface on which the ring-shaped base 501 is supported in a tiltable fashion. A cam follower arrangement 504 controls the tilting of the extraction electrode base 501 on the support 503. A tension spring 505 is connected at one end to a mounting post 506 fastened to the electrode support base 501 and at the other end to a support post 507 mounted to the flange 500. This arrangement biases the cam follower 504a against the cam 504B. Cam 504B is driven by a lead screw 508 which is coupled by way of a gear mechanism 509 to an electric motor 260. This motor controlled electrode base tilting mechanism enables the extraction and deceleration electrodes to be aligned with respect to the ion exit slit in the ion source.

This alignment mechanism is at terminal potential along with the electrode support base 501, the deceleration electrode support pillars 261, and the deceleration electrode 262. The extraction electrode support pillars 263 comprise a composite of a metal pillar section 264 and an insulating pillar section 265 with a ceramic shield arrangement 266 shielding the insulator section 265 from contaminating particles and deposits. The extraction electrode 267 is mounted in a cantilevered fashion on the top of the support pillars 263. In a similar fashion the deceleration electrode 262 is mounted in a cantilevered fashion on the support pillars 261.

Provision has also been made for a fringe electrode arrangement including the fringe support pillar 268 carried on support base 501 and having a U-shaped fringe electrode 269 carried thereon in a cantilevered mounting arrangement.

The extraction electrode 267 includes thicker central section 267A which includes a generally rectangular slit 267B through which the extracted ion beam passes. Similarly, deceleration electrode 262 includes central section 262A with a generally rectangular aperture 262B formed therein through which the ion beam extracted from the ion source passes.

The cantilevered mounting arrangement of the extraction electrode 267 and the deceleration electrode 262 provide an overall electrode mounting arrangement which has a large open volume for good pumping conductance of gas flowing out of the ion exit slit of the ion source. In the electrode mounting arrangement depicted in FIGS. 37 and 38 and described above, it is necessary to shield the insulators which support the extraction electrode 237 on the deceleration electrode support arrangement 235 from contamination. This shield arrangement is not shown in FIGS. 37 and 38, but is mounted inside of the insulators and effectively surrounds the aperture in the deceleration electrode; and thus substantially reduces the vacuum pumping conductance in that region.

When such an ion source and electrode assembly is operated with a gas fed source such as boron trifluoride, a relatively high gas pressure in the arc chamber forces a substantial amount of the boron trifluoride gas out of the ion exit aperture into the extraction and deceleration electrode region. With the insulator shield in place, this boron trifluoride gas tends to escape in large quantities into the ion flight tube and thus to permeate the other components of the beam line. Contrasted to this, the electrode support arrangement shown in FIGS. 31 and 32 separately mounts the extraction electrode in a cantilevered fashion on its own support pillars which are electrically isolated from the electrode support base 501 with a shielding arrangement 266 which is not in the vicinity of the extraction and deceleration electrodes themselves. The enhanced pumping conductance of that region enables the vacuum pump system communicating with the source housing as shown in FIG. 27, to more effectively remove the boron trifluoride gas escaping from the ion exit aperture in the front plate of the source. This reduces the amount of such gas which reaches the flight tube and downstream beam components.

Referring now to FIGS. 34 and 35, a beam vane control system 270 will be described. Beam vane control system 270 includes beam intercepting vane elements 271, 272 mounted on one end of individual support arms 273, 274, the other end of which is mounted on a shaft 275 as shown in FIG. 35. Shaft 275 also carries a cam arm 276 which is spring loaded by tension spring 277 against a cam follower 278 carried on a cam follower plate 279. Cam follower plate 279 travels vertically on a guide post 530 and is driven up and down by a drive screw arrangement 531 which is powered by an electric motor 532 through a belt drive arrangement 533. A pair of solenoids 534, 535 are individually operable under remote control to provide a cam stop for the cam arms designated 276. By operating one of the solenoids 534, 535 while the cam arm 276 is in its most vertical position and the attached beam control vane 271 has its extreme edge at the center line of the ion beam, the other beam control vane can be separately operated by the cam follower plate and cam arm arrangement to sweep the beam control vane across the beam to enable incremental measurements of beam current to be performed.

A position sensing potentiometer 536 is carried on follower plate 537 and is driven by a gear arrangement 538 which includes a gear element 539 carried on the drive shaft 531. In this manner an electrical signal giving the position of the beam control vanes may be provided to a manual or computer controlled operational control system for the ion implanter apparatus.

In normal operation of the beam control vane assembly, both solenoids 534, 535 would be de-actuated so that their corresponding stop elements would be retracted and both of the cam arms 276 would be free to rotate with movement of the cam follower plate 279. The beam control vanes 271 and 272 are thus utilized to control beam current entering the flight tube of the analyzing magnet assembly.

Because the beam vane control system 270 is entirely mounted to and supported on the extraction assembly flange 500, the beam control vane assembly and the extraction electrode assembly are removable as a single module from the source housing 460. The beam vane control assembly 270 in this embodiment is preferable to the beam vane control assembly disclosed in the embodiment of FIGS. 35 and 36 because only the beam control vanes 271 and 272 themselves are located in the high temperature region above the extraction electrode system. The actuator mechanism and rotational mounting shaft (including vacuum seals 275A) for the beam control vanes are located remote from the hot extraction region and are thus less subject to having their operation degraded by heat.

It should also be noted that the source housing 460 as shown in FIG. 27 does not have a vacuum gate valve present for sealing the rectangular aperture 461 in the top wall of housing 460. The vacuum gate valve has been removed to the other side of the flight tube of this embodiment, both for enhancing its reliability and to avoid venting the post-acceleration system when removing the flight tube for cleaning. The gate valve arrangement shown in FIG. 36 of the other embodiment is subject to high temperature despite the coolant flowing through the beam vane assembly in the upper wall of the chamber in that embodiment. In the embodiment shown in FIGS. 27-59, no cooling of the beam control vane is required since the vanes 271, 272 are formed of a material such as graphite which can withstand the high temperatures and the more sensitive components of the actuation system are removed from the high temperature region.

FIGS. 61-63 depict the ion mass analyzing system 420 which basically includes separate electromagnet assemblies which are disposed on each side of the ion beam flight tube 421 depicted in FIG. 26. A preferred flight tube structure is disclosed in co-pending and commonly assigned U.S. patent application Ser. No. 637,514, filed Aug. 3, 1984, and entitled "Ion Implantation Apparatus and Method". Since the beam analyzing magnet assembly involves a symmetrical arrangement of electromagnets, only one side of the overall assembly will be described for illustration purposes.

Considering the electromagnet assembly from the central flight tube region outward, the assembly includes an inner pole piece 550 and an inner coil 276, and an outer pole piece 555 together with an outer coil 556. The pole face 527 of inner pole 550 has the general shape depicted in the central cross hatched region shown in FIG. 37. The entry edge 553 of the inner pole 550 is disposed at about a forty five degree angle to the path of a ribbon ion beam entering the flight tube region between the opposing inner pole faces. The exit edge 554 of the inner pole is disposed at about a thirty five degree angle to the vertical. It should be understood that the ion beam exiting the flight tube region between the pole faces is an analyzed ion beam with the ions of selected mass, i.e., ions corresponding to the selected ion species, focused to a focal point at the mass resolving slit which is positioned at the end of a drift tube region as shown in FIG. 26. These relatively highly angled entry and exit edges of the inner magnet pole provide beam converging fringe focussing at both regions.

Outer pole 555 and its associated electromagnet coil 556 together with the magnetic return yoke 537 complete one-half of the beam analyzing magnet assembly 420. An entry shunt arrangement 560 is provided at the ion beam entry region of the analyzing magnet to produce a magnetic field free region adjacent the fringe field region 562. Without this entry shunt, the full fringe focussing power would not be realized. An exit shunt 565 is provided at the exit edge of the ion beam from the region between the inner pole faces for essentially the same purpose of controlling ion optics at the beam exit side of the analyzing magnet system.

The overall shape of the inner pole has an outline which is designed so that the selected ion species will be focused at the resolving slit. Selection of which ion mass is resolved at the resolving slit is determined by the strength of the magnetic field in the pole gap and this is, in turn, controlled by the magnitude of the current supply to the electromagnet coils 276 and 556.

The outer electromagnet assembly comprising coil 556 and pole piece 555 is housed within a cooling can (not shown) through which a cooling fluid is circulated to dissipate the heat generated by the electric current flowing through the coil.

Figure 39:
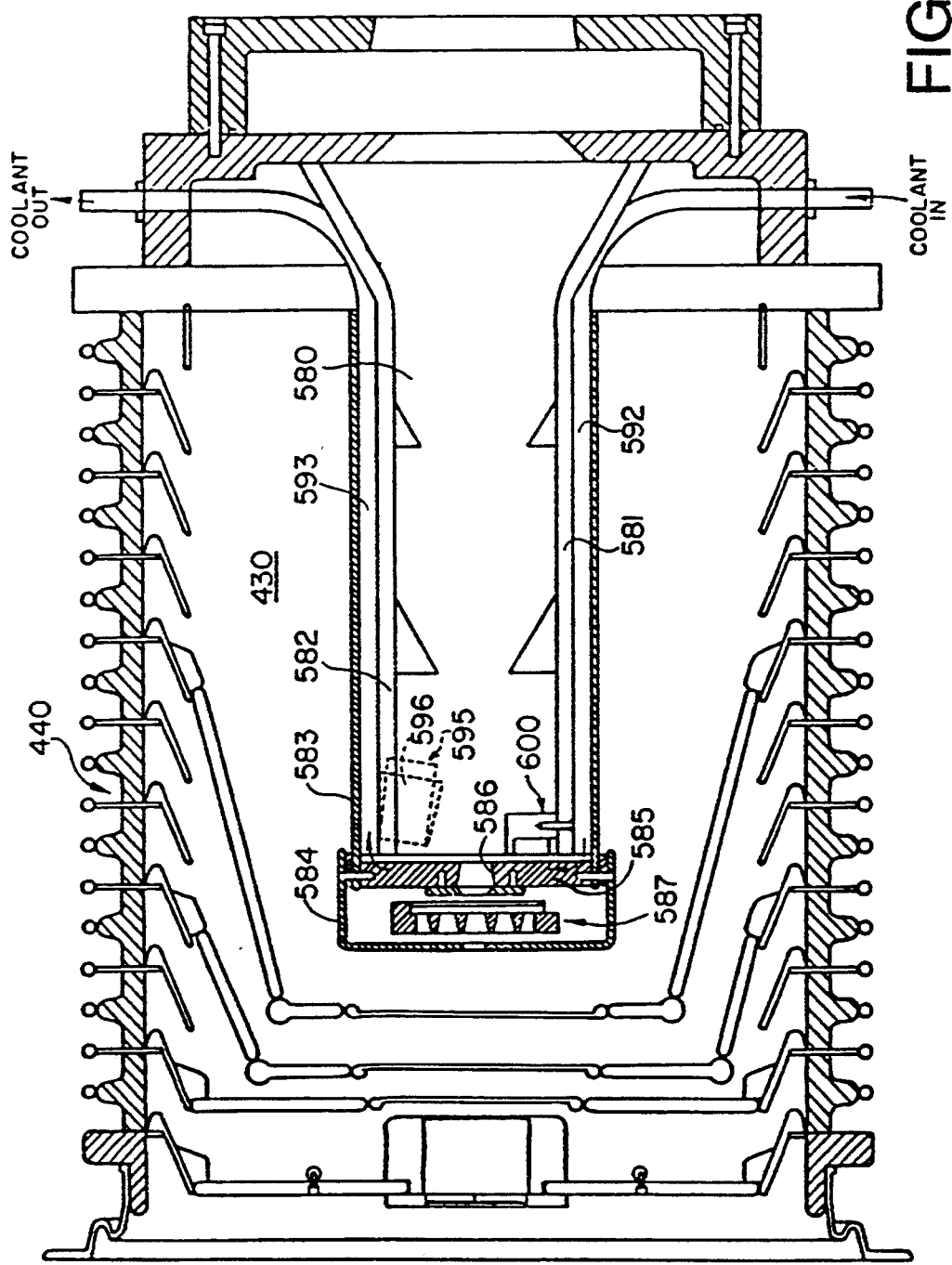
FIG. 39 is a partly sectioned side view of a mass resolving system in accordance with this invention together with a post-acceleration system.
Figure 40:
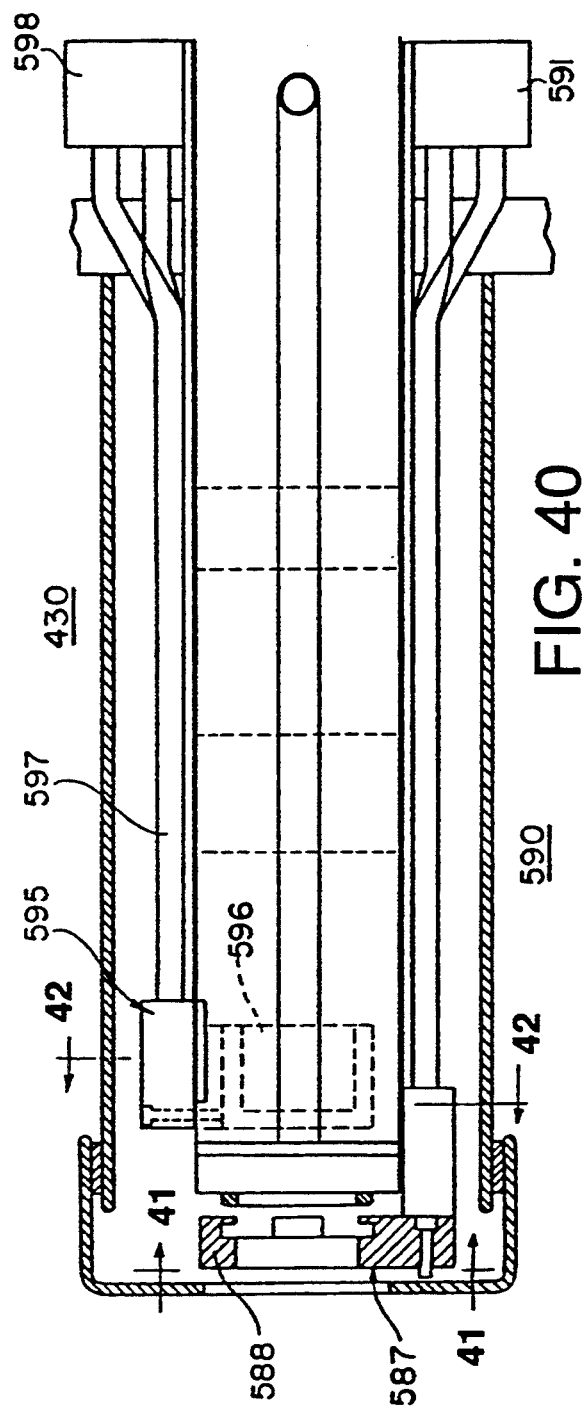
FIG. 40 is a top view of a mass resolving system of this invention.
Figure 42:
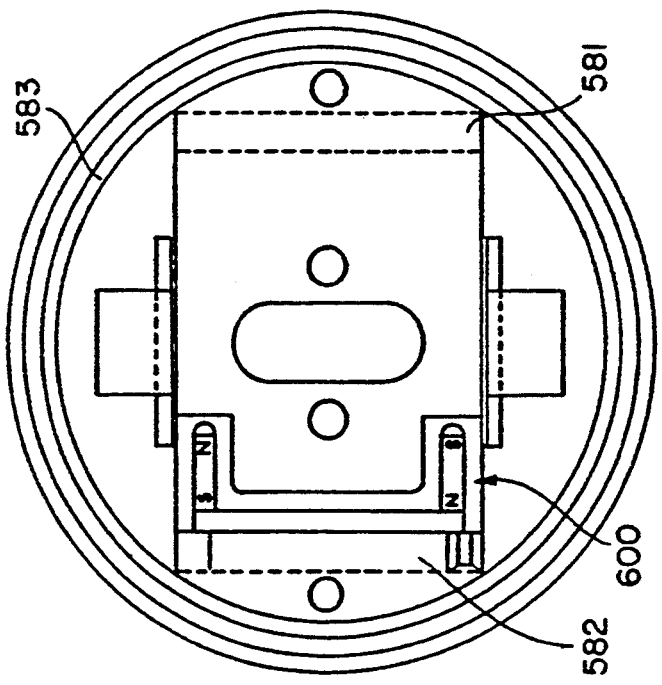
FIG. 42 is another partly sectioned end view of the mass resolving system of this invention taken along the lines 42—42 in FIG. 40.

FIGS. 64-68 depict mass resolving system 430 which includes an ion drift region 580 formed between a pair of side fences 581 and 582 which are mounted within a cylindrical terminal electrode 583 which has a cylindrical cup shaped end cap 584. End wall 585 has an aperture 586 formed therein through which the focused ion beam of the selected ion species passes to the resolving slit assembly 587. Resolving slit assembly 587 is shown in an enlarged end view in FIG. 41 and comprises a multiple resolving slit frame 588 having a plurality of resolving slit inserts 589 mounted therein for purposes which were described previously. As shown in FIG. 40, the multiple resolving slit frame 588 is mounted in a cantilevered manner on a swinging arm 590 which is attached at the other end to a coupling block 591, which is, in turn, mounted on a rotating shaft arrangement depicted in FIG. 44. A parallel arrangement of coolant tubes traverses the length of the swing arm 590 to cool the resolving slit frame 588. As shown in FIGS. 39 and 42 coolant tubes 592 and 593 supply cooling fluid to the end wall 585 which terminates the ion drift tube region 580. These coolant tubes also cool the side fences 581 and 582 which are struck by unselected ions in the ion beam.

A Faraday cup arrangement 595 is shown in FIGS. 39 and 40 and includes a Faraday cup 596 mounted in a cantilevered manner on swing arm 597 which is mounted on a coupling block 598 attached to a rotatable shaft for purposes of moving the Faraday cup in and out of the ion beam. A suppression magnet system 600 is disposed at the end of the ion drift tube region to provide a magnetic field which has a vertical component across the length of the aperture 586 and prevents electrons from escaping from the Faraday cup when it is positioned in the beam.

Figure 43:
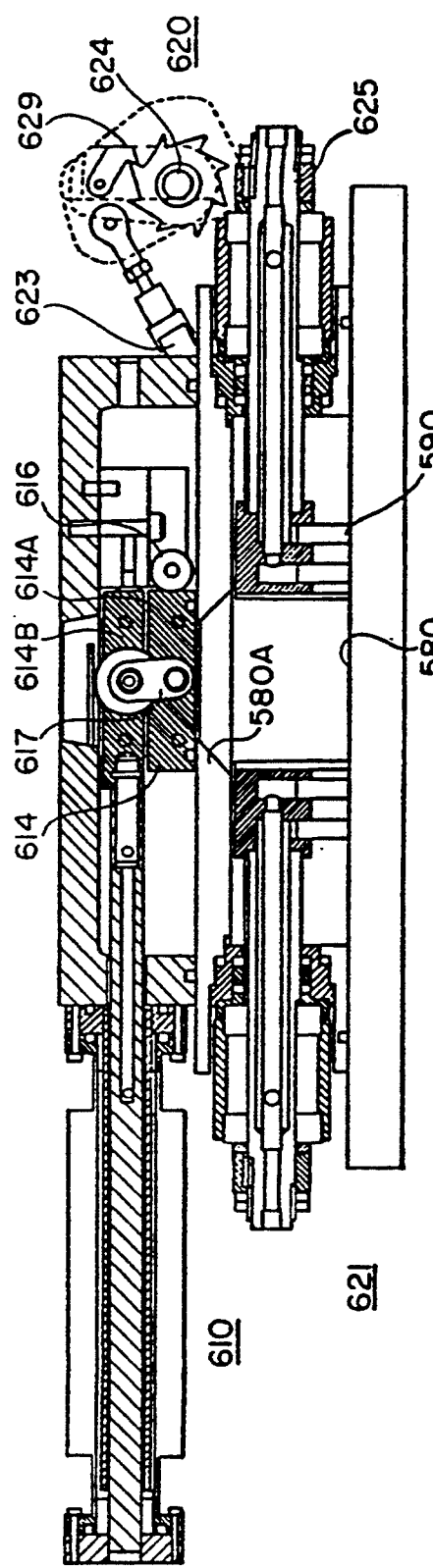
FIGS. 43 and 44 are partly sectioned views of the mass resolving system gate valve assembly and a ratchet and cam arrangement for driving the multiple resolving slit assembly and the Faraday cup assembly in the mass resolving system of this invention.
Figure 44:
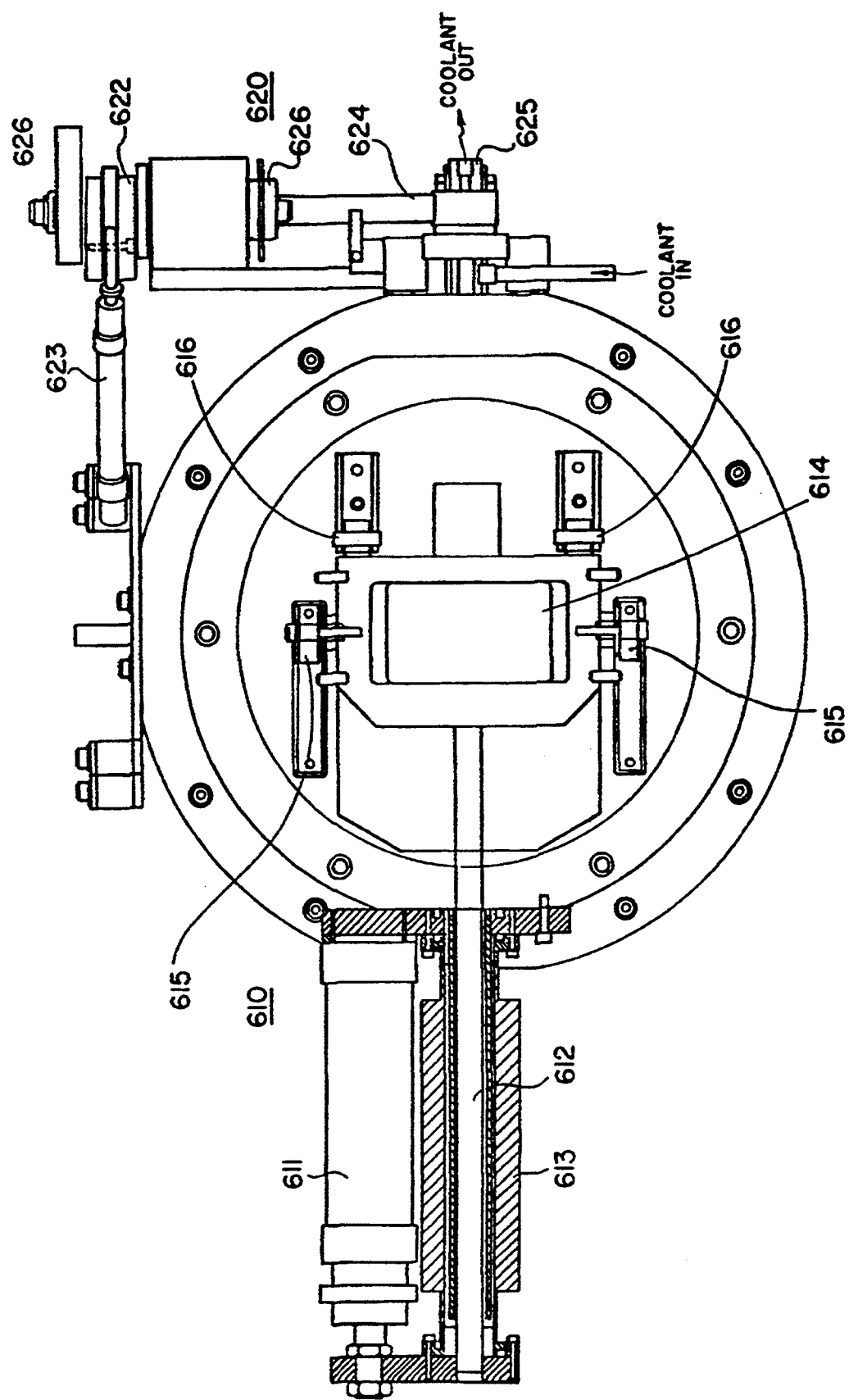

FIGS. 43 and 44 depict a sliding vacuum gate valve arrangement 610 which may be operated to selectively seal the end of the drift tube region 580 to maintain vacuum in the drift tube and the post-acceleration system when maintenance is performed on either the analyzing magnet assembly or the ion source assembly which results in the vacuum being broken in the beam line components preceding the drift tube. FIGS. 68 and 69 also depict drive arrrangements 620 and 621 for the multiple resolving slit assembly and the Faraday cup assembly. Only the arrangement 620 is shown in complete detail, since both are essentially identical.

The gate valve arrangement 610 includes a pneumatic cylinder 611 which is coupled to a shaft 612 extending through a bellows arrangement 613 to drive a gate valve 42. The gate valve block 42 rides on rollers 43 and has a lower block portion 67A and a upper block 67B which are coupled together by a spring biased camming arrangement 617. As the shaft 612 pushes the sliding gate valve block 42 toward the opening, it eventually encounters a stop 616 with the lower block 67A. At this point over travel of the top portion 67B causes the camming mechanism 617 to push the lower block 67A into a vacuum seal contact with the wall 580A.

The actuator 620 includes a ratchet and pall arrangement 622 operated by a pneumatic cylinder 623 to drive a shaft 624. Shaft 624 in turn drives rotatably mounted shaft 625 through a cam arrangement 626. Shaft 625 is a hollow shaft through which concentric fluid coupling tubes are disposed for carrying cooling fluid to the coolant channels extending through the swing arm 590. An optical rotary position sensor 626 is provided to signal to a control system the actual shaft position and thus position of either the multiple resolving slit frame or the Faraday cup.

Figure 45:
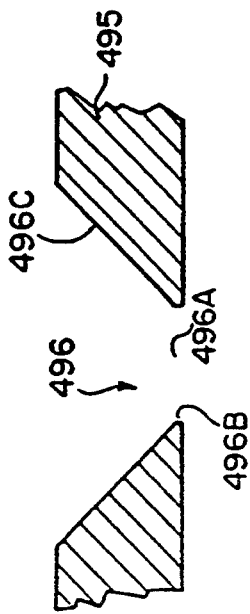
FIG. 45 is a section view showing the overall structural geometry of the source exit slit of a preferred embodiment of this invention.
Figure 41:
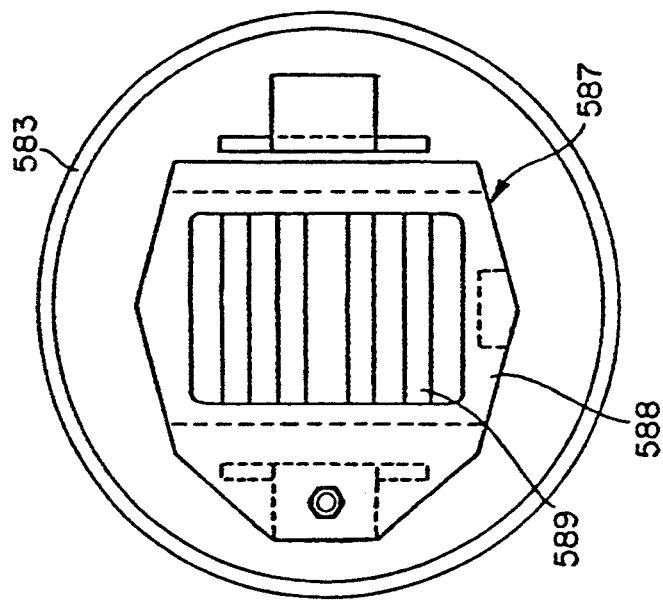
FIG. 41 is an end view of the mass resolving system of this invention taken along the lines 41—41 in FIG. 40.

FIG. 45 depicts, in an enlarged section view, the presently preferred geometry for the narrow dimension of the ion exit aperture 496 in the front plate 495 of the ion source depicted in FIGS. 27 and 28. In this specific embodiment, the front plate 495 is formed of graphite material having a thickness of about six millimeters. The base 496A of the ion exit aperture 496 is about five millimeters. Its length in the longer dimension is 110 millimeters. A vertical step about 0.25 millimeters in thickness creates an initial vertical wall portion 496B, and this initial wall portion is followed by a second wall portion 496C which is formed at about a forty five degree angle.

The five millimeter wide ion exit aperture contrasts with the one to three millimeter width dimension utilized in all known prior art ion implantation systems which have been commercially produced. As previously indicated, it has apparently been the universal belief of artisans and experts in the field of ion implantation sources that it was necessary to limit the width of the ion exit slit to a dimension in the range of one to three millimeters (typically about two millimeters) in order to maintain a stable ion beam and to have sufficient resolving power. A prototype ion implanter incorporating the principles of this invention has been successfully operated with the five millimeter wide aperture depicted in FIG. 71. The upper limit of width of the aperture appears to be a function of the maximum beam divergence which can be accepted by the analyzing system. Additional limiting factors on slit width are the increased extraction gap and extraction voltage required to maintain beam quality with greater slit widths. At some point a practicable limit would be reached, especially since higher extraction voltages tend to increase sparking problems.

From the raw beam current numbers given above (i.e., twenty eight milliAmps of boron and sixty seven milliAmps of arsenic), it will be readily appreciated that the use of a wide exit slit in a single exit slit system (which is preferable for a Freeman source having a single filament-cathode positioned in front of the exit slit) produces dramatic advances in ion implant apparatus. The only sacrifice involved in using such a wider exit slit for extraction of higher beam currents is the greater ion beam divergence that is encountered. This greater beam divergence generally requires, in the ion optics of this invention, that the magnet pole gap in the mass analyzing system be enlarged. However, this need for a wider pole gap can be offset to a substantial extent by using fringe focussing at the entry side of the analyzing magnet.

The raw beam currents discussed above were achieved with a sixty five millimeter magnet pole gap which is presently considered optimum for boron and arsenic ion beams. This same gap can be used with a twelve kilovolt preacceleration voltage for antimony ions. Alternatively, a fifty millimeter magnet gap with twenty kilovolts preacceleration may be used for antimony ions.

The beam analyzing magnet system utilized in a prototype of this invention has a total weight of about one ton which compares to the six to seven ton weight of an analyzing magnet system which would probably be required in an implanter system using prior art optics to achieve the same beam current performance. This reduction in magnet size and weight is due to a number of factors involved in the new ion optics of this invention and the new source and extraction system operating parameters. Overall, the prototype system of this invention is comparable in size and weight to prior art "high current" machines which cannot begin to generate comparable beam currents.

The improved beam current generating capability of ion implantation systems in accordance with this invention will have a dramatic effect on productivity of ion implanters in commercial utilization in the future. Generally, ion implantation systems in accordance with this invention will be able to do the work of two to four ion implanters of the prior art type. This performance capability will be achieved without a large increase in beam line costs. Accordingly, since ion implantation has become a production technique of choice for doping semiconductor integrated circuit devices, commercial ion implanter systems which utilize the principles of this invention and the various features which make up the whole of this invention will make a strong contribution to reducing the overall capital costs involved in systems for future production of high density integrated circuits.

The impact of the new technology of this invention will be felt especially strong in the production of high density complimentary MOS circuits where as many as seven or eight ion implantation steps, some low dosage and some high dosage, are typically involved. The impact will be especially significant in the high dose boron implants required in CMOS production, e.g., implants of $10^{16}$ ions per square centimeters.

What is claimed is:

1. A system for implanting ions of a preselected chemical species into a plurality of semiconductor wafers, comprising:

source means for producing an ion beam, including ions of said preselected chemical species at or above said preselected beam current level;

beam analyzing means for receiving said ion beam and selectively separating various ion species in said beam on the basis of mass to produce an analyzed beam exiting said analyzing means;

beam resolving means disposed in the path of said analyzed beam for permitting ions of said preselected chemical species to pass therethrough;

beam accelerating means for accelerating said ions in said resolved beam in a prearranged direction defining one coordinate axis of a rectangular coordinate system;

wafer scanning means for scanning a plurality of wafers through said accelerated ion beam;

said analyzing means having an ion dispersion plane associated therewith; said source means having an associated ion emitting envelope including an area of substantial extension in a plane parallel to said ion dispersion plane and producing an ion beam characterized by a beam envelope which retains an area of substantial extension in a plane parallel to said ion dispersion plane throughout the region between said source and said analyzing means and by ions entering said analyzing means travelling substantially either toward or from a common apparent line object perpendicular to said ion dispersion plane; and said wafer scanning means comprising a scan wheel assembly for carrying a plurality of semiconductor wafers and having a central axis; drive means for rotating said scan wheel assembly about said central axis to scan said wafers across said ion beam in one coordinate direction; scan means for producing relative scanning movement between said scan wheel assembly and said ion beam in another coordinate direction; said scan wheel assembly comprising a central hub, a plurality of separate spoke arms mounted to said central hub and extending radially outward therefrom; and a plurality of heat sink elements, each formed on the outer end of one of said spoke arms and including means for mounting a semiconductor wafer thereon, said spoke arms each having a width substantially less than the maximum width of said heat sink elements; said scan means overscanning said heat sink elements in and out of said ion beam so that said ion beam strikes only a portion of said spoke arms in one overscan position thereby reducing the total heat load produced on said scan wheel assembly by said ion beam.

2. The system of claim 1, wherein said drive means comprises a mounting drive means for mounting said scan wheel assembly with said central axis generally parallel to the direction of said ion beam but canted at a slight angle toward the origin of said ion beam in a plane defined by said central axis and said one coordinate axis and for rotating said scan wheel assembly at high rotational velocity about said central axis to scan said wafers across said ion beam in one coordinate direction; each of said heat sink elements defining a mounting surface region and being spaced by an associated spoke arm at a prearranged distance from said central axis; each of said wafer mounting means comprising a heat sink insert mounted to said heat sink element and defining a wafer mounting surface having a diameter at least as large as a prearranged size of semiconductor wafer to be carried thereon and being oriented at a prearranged angle relative to said one coordinate axis such that a line normal to said wafer mounting surface in said plane defined by said central axis and said one coordinate axis intersects said central axis to define a large acute angle, such that the rotation of said scan wheel assembly at said high rotational velocity produces a substantial component of centrifugal force normal to said wafer mounting surface so that a wafer thereon is held tightly against said mounting surface during rotation.

3. The system of claim 2, wherein each of said heat sink elements defines a wafer edge restraint adjacent said heat sink insert at the outermost radial point thereon to restrain said wafer on said wafer mounting surface when said scan wheel assembly is in rotation; and further comprising wafer clamping means mounted on said heat sink element for temporarily urging a wafer on said wafer mounting surface against said wafer edge restraint when said scan wheel assembly is not rotating at high rotational velocity.

4. The system of claim 3, wherein said wafer clamping means includes a pair of clamp finger means, means mounting said clamp finger means to said heat sink element on a side opposite said wafer mounting surface and including spring means urging said clamp finger means against an edge portion of a wafer on said wafer mounting surface and inertial means opposing said spring means when said scan wheel assembly is rotating at high velocity to retract said clamp finger means away from said edge portion of said wafer so that said wafer is retained on said wafer mounting surface solely by said component of centrifugal force normal to said wafer.

5. The system of claim 2, wherein said central axis of said scan wheel assembly is canted at an angle A relative to a line parallel to said one coordinate axis; each of said spoke arms having an outer arm portion canted with respect to said central hub by an angle B in the direction of the origin of said ion beam where B is equal to A plus 3.5 degrees; and each of said heat sink inserts has a first surface mounted on said heat sink element and a second surface comprising said wafer mounting surface defined at an angle of 3.5 degrees to said first surface; said heat sink inserts being selectably mountable on said heat sink element in one of a first orientation with said 3.5-degree angle additive to angle B to place said wafer mounting surface at and angle of 7 degrees to said ion beam or a second orientation with said 3.5-degree angle subtractive from angle B to place said wafer mounting surface at an angle of 0 degrees to said ion beam.

6. The system of claim 2, wherein each of said heat sink elements defines a cooling fluid channel therethrough; said scan wheel assembly includes piping means coupling cooling fluid to and from each of said cooling fluid channels in said heat sink assemblies to carry heat generated by said ion beam away therefrom; and each of said heat sink inserts comprises a conductive metal body defining a first mounting surface adjacent said heat sink assembly and a second mounting surface facing said ion beam, a first layer of conductive elastomeric material mounted on said first mounting surface, and a second layer of conductive elastomeric material mounted on said second mounting surface to serve as said wafer mounting surface, such that said heat sink insert provides good thermal conductivity to said cooled heat sink assembly across the entire surface of a wafer mounted thereon when said scan wheel assembly is rotated at high velocity to produce said component of centrifugal force urging said wafer against said second layer of conductive elastomeric material.

7. The system of claim 6, wherein each of said heat sink elements defines a wafer edge restraint adjacent said heat sink insert at the outermost radial point thereon to restrain said wafer on said wafer mounting surface when said scan wheel assembly is in rotation;

and further comprising wafer clamping means mounted on said heat sink element for temporarily urging a wafer on said wafer mounting surface against said wafer edge restraint when said scan wheel assembly is not rotating at high rotational velocity; said wafer clamping means includes a pair of clamp finger means, means mounting said clamp finger means to said heat sink element on a side opposite said wafer mounting surface and including spring means urging said clamp finger means against an edge of a wafer on said wafer mounting surface and inertial means opposing said spring means when said scan wheel assembly is rotating at high velocity to retract said clamp finger means away from said edge of said wafer so that said wafer is retained on said wafer mounting surface solely by said component of centrifugal force normal to said wafer.

8. The system of claim 1, wherein said drive means and said scan means comprise a combined mounting drive means for mounting said scan wheel assembly in a vacuum chamber with said central axis oriented substantially parallel to said one axis, for rotating said scan wheel assembly about said central axis, and for translating said scan wheel assembly relative to said ion beam substantially in the direction of a second axis of said rectangular coordinate system to produce a two dimensional scan of said semiconductor wafer through said ion beam; said mounting drive means comprising a scan arm disposed within said vacuum chamber, first mounting means for mounting said scan wheel assembly at one end of said scan arm for rotation about said central axis, first drive means associated with said first mounting means for rotationally driving said scan wheel assembly, second mounting means for mounting said scan arm at the other end thereof for rotation about an axis generally parallel to said one axis including shaft means attached at one end to said scan arm and extending through a wall of said vacuum chamber, bearing means external to said chamber for journaling said shaft means for rotation, second drive means associated with said shaft means for rotating said shaft in said bearing means and vacuum sealing means cooperatively mounted between a wall of said vacuum chamber and said shaft means to provide a rotary vacuum-to-air shaft sealing arrangement.

9. The system of claim 8, wherein said mounting drive means mounts said scan wheel assembly with said central axis generally parallel to the direction of said ion beam but canted at a slight angle toward the origin of said ion beam in a plane defined by said central axis and said one coordinate; each of said heat sink elements defining a mounting surface region and being spaced by an associated spoke arm at a prearranged distance from said central axis; each of said wafer mounting means comprising a heat sink insert mounted to said heat sink element and defining a wafer mounting surface having a diameter at least as large as a prearranged size of semiconductor wafer to be carried thereon and being oriented at a prearranged angle relative to said one coordinate axis such that a line normal to said wafer mounting surface in said plane defined by said central axis and said one coordinate axis intersects said central axis to define a large acute angle, whereby rotation of said scan wheel assembly at said high rotational velocity produces a substantial component of centrifugal force normal to said wafer mounting surface so that a wafer thereon is held tightly against said mounting surface during said rotational scanning.

10. The system of claim 9, wherein each of said heat sink elements defines a wafer edge restraint adjacent said heat sink insert at the outermost radial point thereon to restrain said wafer on said wafer mounting surface when said scan wheel assembly is in rotation; and further comprising wafer clamping means mounted on said heat sink element for temporarily urging a wafer on said wafer mounting surface against said wafer edge restraint when said scan wheel assembly is not rotating at high rotational velocity.

11. The system of claim 10, wherein said wafer clamping means includes a pair of clamp finger means, means mounting said clamp finger means to said heat sink element on a side opposite said wafer mounting surface and including spring means urging said clamp finger means against an edge of a wafer on said wafer mounting surface and inertial means opposing said spring means when said scan wheel assembly is rotating at high velocity to retract said clamp finger means away from said edge of said wafer so that said wafer is retained on said wafer mounting surface solely by said component of centrifugal force normal to said wafer.

12. The system of claim 9, wherein said central axis of said scan wheel assembly is canted at an angle A relative to a line parallel to said one coordinate axis; each of said spoke arms having an outer arm portion canted with respect to said central hub by an angle B in the direction of the origin of said ion beam where B is equal to A plus 3.5 degrees; and each of said heat sink inserts has a first surface mounted on said heat sink element and a second surface comprising said wafer mounting surface defined at an angle of 3.5 degrees to said first surface; said heat sink inserts being selectably mountable on said heat sink element in one of a first orientation with said 3.5-degree angle additive to angle B to place said wafer mounting surface at an angle of 7 degrees to said ion beam or a second orientation with said 3.5-degree angle subtractive from angle B to place said wafer mounting surface at an angle of 0 degrees to said ion beam.

13. The system of claim 9, wherein each of said heat sink elements defines a cooling fluid channel therethrough; said scan wheel assembly includes piping means coupling cooling fluid to and from each of said cooling fluid channels in said heat sink assemblies to carry heat generated by said ion beam away therefrom; and each of said heat sink inserts comprises a conductive metal body defining a first mounting surface adjacent said heat sink assembly and a second mounting surface facing said ion beam, a first layer of conductive elastomeric material mounted on said first mounting surface, and a second layer of conductive elastomeric material mounted on said second mounting surface to serve as said wafer mounting surface, such that the said heat sink insert provides good thermal conductivity to said cooled heat sink assembly across the entire surface of a wafer mounted thereon when said scan wheel assembly is rotated at high velocity to produce said component of centrifugal force urging said wafer against said second layer of conductive elastomeric material.

14. The system of claim 9, wherein each of said heat sink elements defines a wafer edge restraint adjacent said heat sink insert at the outermost radial point thereon to restrain said wafer on said wafer mounting surface when said scan wheel assembly is in rotation; and further comprising wafer clamping means mounted on said heat sink element for temporarily urging a wafer on said wafer mounting surface against said wafer edge restraint when said scan wheel assembly is not rotating at high rotational velocity; said wafer clamping means includes a pair of clamp finger means, means mounting said clamp finger means to said heat sink element on a side opposite said wafer mounting surface and including spring means urging said clamp finger means against an edge of a wafer on said wafer mounting surface and inertial means opposing said spring means when said scan wheel assembly is rotating at high velocity to retract said clamp finger means away from said edge of said wafer so that said wafer is retained on said wafer mounting surface solely by said component of centrifugal force normal to said wafer.

15. A system for implanting ions of a preselected chemical species into a plurality of semiconductor wafers, comprising:

source means for producing an ion beam, including ions of said preselected chemical species at or above said preselected beam current level;

beam analyzing means for receiving said ion beam and selectively separating various ion species in said beam on the basis of mass to produce an analyzed beam exiting said analyzing means;

beam resolving means disposed in the path of said analyzed beam for permitting ions of said preselected chemical species to pass therethrough;

beam accelerating means for accelerating said ions in said resolved beam in a prearranged direction defining one coordinate axis of a rectangular coordinate system;

wafer scanning means for scanning a plurality of wafers through said accelerated ion beam;

said analyzing means having an ion dispersion plane associated therewith; said source means having an associated ion emitting envelope including an area of substantial extension in a plane parallel to said ion dispersion plane and producing an ion beam characterized by a beam envelope which retains an area of substantial extension in a plane parallel to said ion dispersion plane throughout the region between said source and said analyzing means and by ions entering said analyzing means travelling substantially either toward or from a common apparent line object perpendicular to said ion dispersion plane; and said wafer scanning means comprising a vacuum chamber; means for generating an ion beam and directing said ion beam into said vacuum chamber in a prearranged direction defining one axis of a rectangular coordinate system; a scan wheel assembly for carrying a plurality of semiconductor wafers and having a central axis; mounting drive means for mounting said scan wheel assembly in said vacuum chamber with said central axis oriented substantially parallel to said one axis, for rotating said scan wheel assembly about said central axis, and for translating said scan wheel assembly relative to said ion beam substantially in the direction of a second axis of said coordinate system to produce a two dimensional scan of said semiconductor wafer through said ion beam; said mounting drive means comprising a scan arm disposed within said vacuum chamber, first mounting means for mounting said scan wheel assembly at one end of said scan arm for rotation about said central axis, first drive means associated with said first mounting means for rotationally driving said scan wheel assembly, second mounting means for mounting said scan arm at the other end thereof for rotation about an axis generally parallel to said one axis including shaft means attached at one end to said scan arm and extending through a wall of said vacuum chamber, bearing means external to said chamber for journaling said shaft means for rotation, second drive means associated with said shaft means for rotating said shaft in said bearing, and vacuum sealing means cooperatively mounted between said vacuum chamber wall and said shaft means to provide a rotary vacuum to air shaft sealing arrangement.

16. The system of claim 15, wherein points IAB defined by an orthogonal plane intersecting respectively said axis of said ion beam I, said central axis of said scan wheel assembly A and said axis of said second mounting means B define a triangle having two fixed sides BA and BI and a third side AI which varies in length as said scan arm scans back and forth across said beam; said second drive arrangement comprising means for driving said scan arm so that the rate of change of the distance AI varies inversely with the magnitude of the distance AI, including a pivot arm mounted at one end to said shaft and a linear drive means mounted for rotation about an axis E and attached to the other end of said pivot arm at an axis D so that said linear drive means translates said other end of said pivot arm toward said axis E; the positions of said axis E and said axis of attachment D being preselected such that points B, D and E defined by an orthogonal plane intersecting said respective axes B, D and E define a triangle BDE which is congruent to said triangle BAI; said second drive arrangement further including tracking means for signalling the distance DE as said linear drive means moves said pivot arm, and means for controlling the rate of drive of said linear drive means as a function of the inverse of said signalled distance DE so that the rate of change of the distance DE varies inversely with the magnitude of the distance DE and, because of triangular congruency, the corresponding rate of change of the distance AI varies inversely with the magnitude of the distance AI.

17. A system for implanting ions of a preselected chemical species into a plurality of semiconductor wafers comprising:

source means for producing an ion beam, including ions of said preselected chemical species at or above said preselected beam current;

beam analyzing means for receiving said ion beam and selectively separating various ion species in said beam on the basis of mass to produce an analyzed beam exiting said analyzing means;

beam resolving means disposed in the path of said analyzed beam for permitting ions of said preselected chemical species to pass therethrough;

beam accelerating means for accelerating said ions in said resolved beam in a prearranged direction defining one coordinate axis of a rectangular coordinate system; and wafer scanning means for scanning a plurality of wafers through said accelerated ion beam;

said analyzing means having an ion dispersion plane associated ion emitting envelope including an area of substantial extension in a plane parallel to said ion dispersion plane and producing an ion beam characterized by a beam envelope which retains an area of substantial extension in a plane parallel to said ion dispersion plane throughout the region between said source and said analyzing means and by ions entering said analyzing means travelling substantially either toward or from a common apparent line object perpendicular to said ion dispersion plane;

said wafer scanning means comprising a scan wheel assembly for carrying a plurality of semiconductor wafers and having a central axis; mounting drive means for mounting said scan wheel assembly with said central axis generally parallel to the direction of said ion beam but canted at a slight angle toward the origin of said ion beam in a plane defined by said central axis and said one coordinate axis and for rotating said scan wheel assembly at high rotational velocity about said central axis to scan said wafers across said beam in one coordinate direction; said scan wheel assembly including wafer mounting means comprising structural means defining a plurality of separate mounting surface regions disposed at radially arrayed locations spaced a prearranged distance from said central axis and a wafer support assembly mounted at each of said mounting surface regions and defining a flat wafer mounting surface having a prearranged angle relative to said one coordinate axis such that a line normal to said wafer mounting surface in said plane defined by said central axis and said one coordinate axis is either parallel to said one coordinate axis or is canted at a small angle to said one coordinate axis but in either event said normal acute angle, whereby rotation of said scan wheel assembly at said high rotational velocity produces a substantial component of centrifugal force normal to said wafer mounting surface so that a wafer thereon is held tightly against said mounting surface during said rotational scanning.

18. In a method for scanning semiconductor wafers through an ion beam, the steps of:
creating an ion beam analyzing field having an associated ion dispersion plane for separating various ion species in an ion beam on the basis of mass;
producing and directing into said ion beam analyzing field an ion beam including ion or a preselected species at or above a beam current level of several milliamperes and having an associated overall ion beam envelope which retains an area of substantial extension in a plane parallel to said ion dispersion plane throughout the region of travel of said beam into said analyzing field;
separating out of the analyzed ion beam exiting said analyzing field a beam of ions comprising said preselected chemical species;
accelerating said separated ions to a prearranged energy;
disposing a plurality of generally cylindrical heat sinks radially around a central hub with narrow spokes connecting said heat sinks to said hug;
mounting a plurality of individual wafers on said heat sink elements with a wafer diameter substantially equal to that of the heat sink so that only the surface of the wafer and the spokes are presented to the beam;
rotating said heat sinks and wafers around said hub at high velocity; and
scanning said heat sinks and wafers back and forth through said accelerated beam with a velocity which varies proportional to 1/r where r is the distance between said ion beam and said hub.

19. In a method for scanning semiconductor wafers through an ion beam, the steps of:
creating an ion beam analyzing field having an associated ion dispersion plane for separating various ion species in an ion beam on the basis of mass;
producing and directing into said ion beam analyzing field an ion beam including ions of a preselected species at or above a beam current level of several milliamperes and having an associated overall ion beam envelope which retains an area of substantial extension in a plane parallel to said ion dispersion plane throughout the region of travel of said beam into said analyzing field;
separating out of the analyzed ion beam exiting said analyzing field a beam of ions comprising said preselected chemical species;
accelerating said separated ions to a prearranged energy;
disposing a plurality of wafer mounting surfaces on a scan wheel with each at a common prearranged first angle to a major plane of said scan wheel;
mounting said scan wheel for rotation about an axis which is canted toward the origin of said ion beam direction by a small acute angle which is of value equal to or less than said first angle; and
rotating said scan wheel about said axis at high angular velocity to provide a component of centrifugal force normal to said wafer surface even when said second angle is equal to said first angle.

20. In a method for scanning semiconductor wafers through an ion beam, the steps of:
creating an ion beam analyzing field having an associated ion dispersion plane for separating various ion species in an ion beam on the basis of mass;
producing and directing into said ion beam analyzing field an ion beam including ion of a preselected species at or above a beam current level of several milliamperes and having an associated overall ion beam envelope which retains an area of substantial extension in a plane parallel to said ion dispersion plane throughout the region of travel of said beam into said analyzing field;
separating out of the analyzed ion beam exiting said analyzing field a beam of ions comprising said preselected chemical species;
accelerating said separated ions to a prearranged energy;
mounting said wafers on prearranged radially arrayed positions on a scan wheel;
mounting said scan wheel for rotation about a central axis thereof on one end of a scan arm;
mounting the other end of said scan arm for rotation about a scan axis generally parallel to said central axis and generally parallel to said ion beam;
mounting a pivot arm at one end to said other end of said scan arm to drive said scan arm about said scan axis; and
translating the other end of said pivot arm toward a fixed point in space which defines in an orthogonal plane intersecting said other end of said pivot arm and said scan axis a triangle which is congruent with a triangle defined by an orthogonal plane intersecting said scan axis, said central axis and said ion beam at a velocity which is inversely proportional to the distance between said other end of said pivot arm and said fixed point so that said scan wheel translates toward said ion beam with a velocity between said central axis and said ion beam which is inversely proportional to the distance therebetween because of said congruency.

* * * * *